(12) United States Patent
Joet et al.

(10) Patent No.: US 7,652,613 B2
(45) Date of Patent: Jan. 26, 2010

(54) METHOD AND DEVICE FOR PROCESSING AN INCIDENT SIGNAL, IN PARTICULAR FOR FILTERING AND ANALOG/DIGITAL CONVERSION

(75) Inventors: Loïc Joet, Grenoble (FR); Stéphane Le Tual, Veurey-Voroize (FR)

(73) Assignee: STMicroelectronics SA, Montrouge (FR)

( * ) Notice: Subject to any disclaimer, the term of this patent is extended or adjusted under 35 U.S.C. 154(b) by 37 days.

(21) Appl. No.: 12/015,039

(22) Filed: Jan. 16, 2008

(65) Prior Publication Data

US 2009/0002216 A1 Jan. 1, 2009

(30) Foreign Application Priority Data

Jan. 17, 2007 (FR) .................................. 07 52720
Jan. 9, 2008 (FR) .................................. 08 50115

(51) Int. Cl.
*H03M 1/12* (2006.01)
(52) U.S. Cl. ..................... 341/172; 341/118; 341/120; 341/163; 375/316
(58) Field of Classification Search ................. 341/163, 341/172
See application file for complete search history.

(56) References Cited

U.S. PATENT DOCUMENTS

| | | | |
|---|---|---|---|
| 5,581,252 A * | 12/1996 | Thomas | 341/172 |
| 6,538,594 B1 | 3/2003 | Somayajula | 341/172 |
| 6,587,066 B1 * | 7/2003 | Somayajula | 341/172 |
| 7,023,372 B1 * | 4/2006 | Singh et al. | 341/155 |

FOREIGN PATENT DOCUMENTS

WO WO9204777 3/1992

OTHER PUBLICATIONS

"A 10-bit 5-MS/s Successive Approxiamtion ADC Cell Used in a 70-MS/s ADC Array in 1.2 μm CMOS", Yuan et al., IEEE Journal of Solid-State Circuits, IEEE Service Center, Piscataway, NJ, vol. 29, No. 8, Aug. 1, 1994, pp. 866-872, XP000460908, ISSN: 0018-9200.

* cited by examiner

*Primary Examiner*—Khai M Nguyen
(74) *Attorney, Agent, or Firm*—Lisa K. Jorgenson; Allen, Dyer, Doppelt, Milbrath & Gilchrist, P.A.

(57) ABSTRACT

The method and device include the filtering and the analog/digital conversion of an intermediate signal. The intermediate signal is processed by a filtering and analog/digital conversion circuit that is configurable using switched passive capacitor technology. The various configurations successively adopted by the circuit provide filtering and analog/digital conversion to be successively carried out.

31 Claims, 31 Drawing Sheets

FIG.28
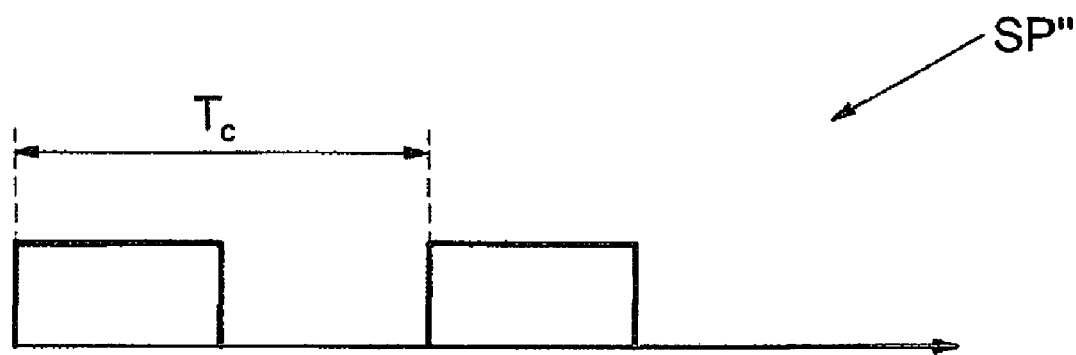
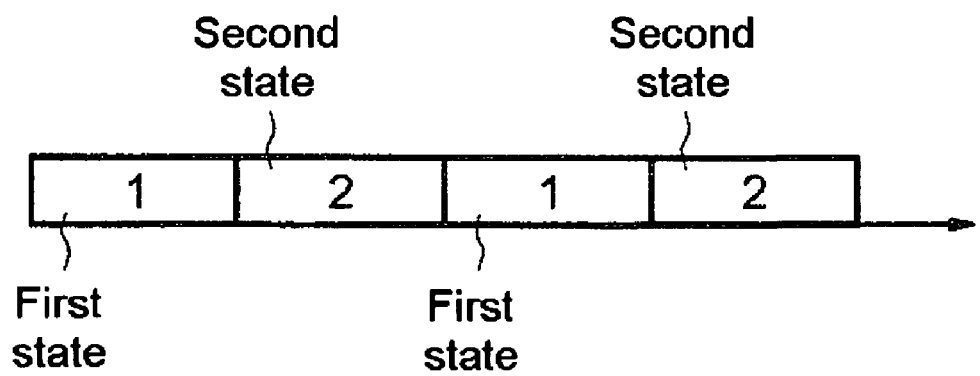

METHOD AND DEVICE FOR PROCESSING AN INCIDENT SIGNAL, IN PARTICULAR FOR FILTERING AND ANALOG/DIGITAL CONVERSION

FIELD OF THE INVENTION

The present invention relates to the processing of an analog signal and, more particularly, the filtering and the analog/digital conversion of such a signal.

BACKGROUND OF THE INVENTION

The invention may be advantageously applied to, but is not limited to, the processing of signals, in particular radio frequency signals, undergoing filtering and conversion into a digital signal. This is for example the case for digital terrestrial television signals or, more generally, for signals carried in frequency-multiplexed transmission systems.

An incident analog signal, for example comprising information situated within a desired frequency range (desired channel for example) and frequency components situated outside of the desired frequency range (channels adjacent to the desired channel), generally undergoes one or more frequency transpositions to convert it into baseband. The incident signal down-converted into baseband is then intended, after filtering, to be converted into digital form to subsequently undergo specific processing operations, such as for example channel decoding processing notably comprising a demodulation and source decoding processing.

The filtering and the analog/digital conversion are generally performed by external elements, in other words by non-integrated elements. It is not therefore possible to fabricate the analog part and the digital part of a radio frequency signal processing device on a single integrated circuit. Moreover, the external elements of the analog part of the signal processing are not able to follow the same evolution, notably in terms of size, as the digital part fabricated using CMOS technology.

A device and a method are thus, for example, proposed that allow the filtering and the analog/digital conversion of a signal while at the same time reducing the presence of non-integrated elements.

SUMMARY OF THE INVENTION

According to one aspect, the invention provides a method for the processing of an incident signal in which an intermediate signal extracted from the incident signal is generated. Then, the intermediate signal is delivered to a filtering and analog/digital conversion circuit (CFCANI) comprising at least one current input for receiving the intermediate signal, several outputs (SI1, SI2, SI3), input capacitance means (MCEI) connected to the input, several configurable elementary circuits (CI1, CI2, CI3) for conversion by successive approximations each connected between the input and one of the outputs (SI1, SI2, SI3) and each comprising a group of switched elementary capacitors.

Then, each elementary circuit (CI1, CI2, CI3) is successively and cyclically configured:

in a filtering state in which at least some of the switched elementary capacitors are connected to the input capacitance means, then in several different states of analog/digital conversion, then in a reference state in which the group of switched elementary capacitors has a reference capacitive charge, said outputs each delivering successively a sample of several bits of a digital output signal corresponding to the filtered intermediate signal.

The method implements capacitive filtering means, together with a converter using successive approximations using the technique of switched capacitances. Thus, it becomes possible on the one hand to integrate the filtering and conversion means with the rest of the signal processing device and, on the other, the filtering means and the converter are constructed from capacitors and switches whose size and fabrication within an integrated circuit evolves at the same time as the technology employed. The analog part can then be improved at the same time as the digital part.

This solution offers the advantage of mixing within the same circuit the filtering and analog/digital conversion stages, which allows the design cost and the processing chain noise to be reduced. A further advantage is the use of the technique of passive switched capacitances, for both the filtering and for the analog/digital conversion which, in particular, allows a high sampling frequency to be adopted.

The filtering and analog/digital conversion circuit (CFCANI) advantageously comprises at least N+2 outputs (SI1, SI2, SI3) each delivering, at a delivery frequency $f_d$, a sample of N bits of the digital output signal, and N+2 elementary circuits (CI1, CI2, CI3) each connected between the input and one of the N+2 outputs (SI1, SI2, SI3) and each comprising at least one group of at least N+1 switched elementary capacitors configured in parallel (CE11, CE12, CE13, CE14, CE21, CE22, CE23, CE24, CE31, CE32, CE33, CE34), together with a comparator (COMP1, COMP2, COMP3) connected to the corresponding output (SI1, SI2, SI3). According to this embodiment, each elementary circuit (CI1, CI2, CI3) is then successively and cyclically configured, at a control frequency $F_S$ equal to at least the product of the number of elementary circuits and the delivery frequency $f_d$, and with a time delay of $1/F_S$ between two consecutive elementary circuits, and the N+1 capacitors are selectively connected between the comparator (COMP1, COMP2, COMP3) and a first or a second reference voltage ($V_{high}$, $V_{low}$) in order to obtain, successively at the frequency $F_S$, the N bits of a sample of the digital output signal at the corresponding output (SI1, SI2, SI3) in N separate states of analog-digital conversion.

According to a first aspect, each elementary circuit comprises at least one group of N+1 elementary capacitors, the group of elementary capacitors having a total capacitance of value C, and:

in the filtering state, the N+1 elementary capacitors are connected to the input capacitive means and in the reference state, the group of N+1 elementary capacitors has a reference capacitive charge.

According to a second aspect, each elementary circuit comprises at least one group of N+2 elementary capacitors, the group of elementary capacitors having a total capacitance of value 3C/2 and comprising two elementary capacitors of value C/2, and:

in the filtering state, the two elementary capacitors of value C/2 are connected to the input capacitive means and in the reference state, the group of N+2 elementary capacitors has a reference capacitive charge.

The ratio of the value of the capacitance of the input capacitance means over the value C is advantageously greater than a threshold chosen as a function of the bandwidth of the analog signal. The value of this threshold allows the filtering parameters, and notably the cutoff frequency $f_{cpr}$, to be adjusted as a function of the characteristics of the signal.

Those skilled in the art will know how to adjust the value of this threshold according to the application and desired performance.

As an example, with a relatively high threshold and for a relatively steep filtering function with a single filtering capacitor $C_{IIR}$, the cutoff frequency $f_{cpr}$ of the low-pass filtering is given by the formula:

$$\frac{C}{C_{IIR}} \approx \frac{1}{2} \cdot \left[ \sqrt{1 + \frac{1}{\pi \cdot \frac{f_{cpr}}{F_S}}} - 1 \right]$$

where C is equal to the sum of the capacitances of the N+1 elementary capacitors and $F_S$ is the sampling frequency.

Thus, with a sampling frequency $F_S$ equal to 600 MHz and to obtain a cutoff frequency $f_{cpr}$ of around 2.4 MHz, a threshold equal to 40 will be chosen.

Similarly, for a signal with a bandwidth of 10 MHz and for a sampling frequency $F_S$ of 600 MHz, a threshold equal to 19 will be chosen so as to obtain a cutoff frequency $f_{cpr}$ equal to 5 MHz. The useful band extends between −5 MHz and +5 MHz and the band edge is attenuated by 3 dB.

The input capacitance means can comprise a single filtering capacitor and, in the filtering state of each elementary circuit, at least some of the elementary capacitors of the elementary circuit are connected to the filtering capacitor. The filtering capacitor allows filtering of the signal to be carried out thanks to a large capacitance, known as "memory capacitance", with respect to the elementary capacitors of the elementary circuits. Moreover, the filtering capacitor is not reset to zero but stays continuously connected to the intermediate signal. When the intermediate signal, which is a current signal, varies, the filtering capacitor allows its value to be averaged over time and the filtering thus to be effected. More particularly, the filtering capacitor averages the samples which are converted by the elementary circuits. Low-pass filtering of the signal is thus obtained.

The number of elementary circuits depends on the number of processing steps required for the filtering and for the conversion of the intermediate signal by the device. Thus, for conversion of an analog signal into a digital signal with N bits, according to one embodiment, the method comprises:

a filtering step during which the signal is also loaded into the elementary capacitors, N conversion steps in order to obtain the N bits and a step for resetting the elementary capacitors to zero ('reset' step) during which the latter are brought back into a reference state.

If the number of steps is increased, the number of elementary circuits must also be increased so as to constantly be able to process the intermediate signal.

According to one embodiment, the input capacitance means can also comprise at least one additional filtering capacitor, the filtering and analog/digital conversion circuit then comprising a number of additional outputs and additional elementary circuits equal to the number of additional filtering capacitors; the filtering state of each elementary circuit then comprises various filtering sub-states in which at least some of the elementary capacitors are respectively connected to the various filtering capacitors. The elementary circuit is then placed successively into each of the filtering sub-states.

A second filtering capacitor allows an additional averaging to be performed on the values already averaged by the first filtering capacitor. A second low-pass filtering is thus performed. A filter of higher or lower order depending on the number of filtering capacitors can thus be obtained.

Furthermore, the additional filtering capacitors add more steps in the processing of the signal. Thus, for each additional filtering capacitor, one more elementary circuit is added to the device.

After the reference state, the elementary circuit can be configured in a calibration state in which the comparator of the elementary circuit is connected to two equal voltages in such a manner as to determine and correct its offset.

The object of the calibration state is to limit the offset that may appear in the comparator and introduce noise into the converted signal. This state adds one more step in the processing of the signal and one more elementary circuit is added.

According to one particular embodiment, the successive elementary circuits may be configured in two different reference states so as to create, as input of the filtering and analog/digital conversion circuit, a periodic analog signal of predefined frequency and amplitude and so as to determine, from the corresponding digital output signal, the filtering created by the input capacitive means.

This is a method of calibrating the filtering capacitor, making it possible to determine the characteristics of the low-pass filtering of the filtering and analog/digital conversion circuit. The current input for receiving the intermediate signal can be a differential input and each elementary circuit then comprises a second group of at least N+1 switched elementary capacitors configured in parallel.

Although the method according to this aspect is compatible with any type of frequency-transposition method preceding the filtering and digital/analog conversion, this aspect may advantageously be combined with the frequency-transposition method described in the patent application entitled "Method and device for processing an incident signal, in particular, for frequency transposition" filed in the name of the Assignee on the same day as the present patent application.

In other words, in one particular application, the incident signal is delivered to a transconductor stage and a current output of the transconductor stage is connected to the filtering capacitor so as to deliver to the filtering capacitor a current signal lasting for at least part of the first half-period of each period of a periodic signal and to thus obtain, at the filtering capacitor, a frequency-transposed signal as intermediate signal. Upon the occurrence of each the part of the first half-period, the voltage of the current output, seen from the filtering capacitor, is reset to a value equal to that of the voltage of the filtering capacitor.

The device firstly resets the voltage of the current output, in other words the voltage of the current output and the voltage of the capacitor are equalized. There is then no movement of charges (stray current) due to a difference in voltage when the reset current output and the filtering capacitor are connected, in other words upon the occurrence of each part of the first half-period of the periodic signal. The gain is not therefore degraded.

The current output of the transconductor stage may be connected to the output capacitor so as to deliver to the output capacitor a current signal and its opposite respectively during the two half-periods, of each period of the periodic signal and, upon the occurrence of each half-period of the periodic signal, the voltage of said current output, seen from the output capacitor, may be reset to a value equal to that of the voltage of the output capacitor.

The signal considered here is a current signal. During the frequency transposition, the frequency transposition device delivers to the output capacitor the current signal and its opposite during each half-period of the transposition signal.

The transconductor stage can comprise two current outputs respectively delivering two current signals of opposing sign. In such an embodiment, upon each first half-period of the periodic signal, the first current output is connected to the filtering capacitor and, upon each second half-period of the periodic signal, the second current output is connected to the filtering capacitor. In addition, the resetting of the voltage of the first current output comprises the fixing, at least at the end of, and preferably during the whole of each second half-period of the periodic signal, of the voltage of said first current output at the value of the voltage of the filtering capacitor, and the resetting of the voltage of the second current output comprises the fixing, at least at the end of, and preferably during the whole of each first half-period of the periodic signal, of the voltage of the second current output at the value of the voltage of the filtering capacitor.

During the first half-period, the voltage of the filtering capacitor varies at the same time as that of the first current output, as a function of the signal, whereas the voltage of the second current output varies independently as a function of the charges flowing out of it. Thus, a difference between the voltage of the filtering capacitor and the voltage of the second current output appears during the first half-period, in other words during the half-period in which the second current output is not connected to the filtering capacitor.

In order to avoid, when the second half-period occurs, the stray currents due to this difference in voltage, the voltage of the second current output is reset before connecting this second current output to the filtering capacitor. This resetting here includes imposing the voltage of the filtering capacitor on the second current output. In this way, the voltage difference is zero, the charges flowing from the second current output are absorbed and the stray currents are avoided.

In other words, preferably, during each half-period of the periodic signal, one current output of the transconductor stage is connected to the filtering capacitor, whereas the voltage of the filtering capacitor is imposed on the other current output of the transconductor stage.

Preferably, the voltage of one of the current outputs is fixed at the value of the voltage of the filtering capacitor via an amplifier stage configured in follower between the filtering capacitor and the current outputs. The amplifier stage configured in follower allows the input voltage to be imposed on the output, without modifying the input voltage. In the present case, the input voltage of the amplifier stage is the voltage of the filtering capacitor and the output voltage of the amplifier stage is the voltage on the current output of the transconductor stage which is not connected to the filtering capacitor by the transposition device. Thus, the amplifier stage allows the voltage of the filtering capacitor to be imposed on the current output that will be connected to the capacitor during the next half-period, without modifying the voltage of the filtering capacitor, in other words limiting the degradation of the signal. In this way, when the current output is connected to the filtering capacitor when the next half-period of the periodic signal occurs, the voltage of the current output and the voltage of the filtering capacitor are equal.

According to another embodiment, the transconductor stage comprises a single current output delivering a current signal, in which:

each first half-period of the periodic signal comprises a first part during which the current output is connected to the filtering capacitor, and each second half-period of the periodic signal comprises a first part during which the current output is connected to the filtering capacitor in the reverse manner to that carried out during the first part of the first half-period of the periodic signal, and in which the resetting of the voltage of the current output comprises:

the fixing of the voltage of the current output at the inverse value to the voltage of the filtering capacitor at least at the end of the second part of each first half-period of the periodic signal, and the fixing of the voltage of the current output at the value of the voltage of the filtering capacitor at least at the end of the second part of each second half-period of the periodic signal.

In this embodiment, the connection between the transposition stage and the filtering capacitor is reversed upon each half-period of the periodic signal. However, the output of the transconductor stage can exhibit a stray capacitance which is also reversed upon each half-period. Thus, when each half-period occurs, the filtering capacitor is connected to the stray capacitance whose voltage is reversed with respect to that of the filtering capacitor.

To then avoid a stray current and hence a degradation of the signal, the voltage opposing that of the filtering capacitor is imposed on the current output, before the inversion by the frequency-transposition stage. In this way, upon the occurrence of the next half-period, the voltage of the current output seen from the filtering capacitor is equal to the voltage of the capacitor.

The fixing of the voltage of the current output at the corresponding value is effected for example during the whole of the second part of the corresponding half-period of the periodic signal. Here again, the voltage of the current output is preferably fixed at the value of the voltage of the filtering capacitor or the inverse of this value by means of an amplifier stage configured in follower between the filtering capacitor and the current output.

According to another embodiment, only the current signal is delivered to the output capacitor, each first half-period of the periodic signal and the resetting of the voltage of the current output comprises fixing the voltage of the current output to the voltage of the output capacitor ($C_{IIR}$) at least at the end of the second half-period of the periodic signal. Preferably, the fixing of the voltage of the current output to the corresponding value is effected during the whole of the second half-period of the periodic signal.

Preferably, the voltage of the current output is fixed to the voltage of the output capacitor by means of an amplifier stage mounted as follower between the output capacitor and the current output. Whichever embodiment is used, the current output or outputs of the transconductor stage are advantageously, but not necessarily, differential.

In another particular application, the incident signal is a radio frequency signal and the transconductor stage belongs to a low-noise amplifier stage.

Although the preceding aspects are compatible with any ulterior digital processing of the converted signal, they may advantageously be combined with the filtering method described in the patent application entitled "Method and device for filtering and analog/digital conversion of an analog signal" filed in the name of the Assignee on the same day as the present patent application.

In other words, in one particular application, the filtering and analog/digital conversion circuit is designed to filter out the frequency components of the intermediate signal situated outside of a desired frequency range; the method then also advantageously comprises:

a reformatting of the digital output signal intheto a form substantially identical, at least within said desired frequency range, to the form of the intermediate signal and a final digital filtering of the reformatted digital output signal so as to filter out the frequency components situated outside of the desired frequency range.

The desired frequency range is for example the bandwidth of the useful signal or the width of the desired frequency channel. The filtering and analog/digital conversion circuit performs an analog filtering with the aim of filtering, for example, the residues of adjacent channels. In this way, the analog filtering allows on the one hand the dynamic range of the analog/digital converter to be limited and, on the other, the sampling frequency of the analog/digital converter to be adapted to the bandwidth of the filtered intermediate useful signal. The analog/digital conversion is thus improved with respect to the useful signal to be converted.

However, given that the analog filtering is carried out notably with capacitors referred to as 'memory capacitors', such as the filtering capacitor, the order of the analog filtering is low, for example less than or equal to 2, and does not allow a satisfactory cutoff of the adjacent channels to be obtained for certain applications. The analog filtering also leads to a distortion, within the desired frequency range, of the intermediate signal. The consequence of this distortion is a loss of information or a degradation of the useful signal. The signal reformatting step notably allows the distortion of the signal caused by the analog filtering to be corrected. Thus, despite an analog filtering of low order, for example of order 1, on the one hand the dynamic range of the analog/digital converter can be limited, and on the other, the degradation of the useful signal can be limited.

The signal reformatting step allows a signal identical, or virtually so, to the intermediate signal to be recovered, at least over the desired frequency range.

The final digital filtering then allows the frequencies situated outside of the desired frequency range to be filtered out. This final filtering is performed digitally and can therefore exhibit an elaborate transfer function that is adapted to the spectrum of the signal to be filtered, without however being too bulky nor too costly. It also allows the adjacent channels to be efficiently filtered out without distorting the useful band of the reformatted digital signal.

The step for filtering the intermediate useful signal is thus transferred to the digital processing part. Indeed, it is easier and less costly to apply an elaborate transfer function with a digital filter than with an analog filter. In addition, thanks notably to the filtering capacitor, the dynamic range of the analog/digital converter is limited during the conversion of the signal, while at the same time avoiding the loss of information or the degradation of the useful signal.

According to one embodiment, the signal reformatting is effected within a reformatting digital filter having a working frequency equal to the control frequency $F_S$ and having a transfer function that is the inverse of the transfer function of the analog filtering effected by the filtering and analog/digital conversion circuit at least within said desired frequency range.

At the output of the reformatting filter, within the frequency range, a signal is therefore obtained that is identical to the signal that would have been obtained in the absence of the analog filter.

The transfer function of the reformatting digital filter may be calculated starting from the transfer function of the analog filtering. The conversion of an analog transfer function into a digital transfer function is conventional for those skilled in the art. This calculation is moreover simplified by the fact that the working frequency of the digital filter is equal to the control frequency $F_S$ of the elementary circuit (i.e. of the analog/digital converter), in other words is equal to the sampling frequency.

According to another embodiment, the reformatting is carried out within a reformatting digital filter having a different working frequency, preferably lower than the control frequency $F_S$, and having a transfer function resulting from an approximation of the inverse of the transfer function of the analog filtering effected by the filtering and digital/analog conversion circuit, at least within the desired frequency range.

This embodiment relates more particularly to the case where the analog/digital converter over-samples the filtered intermediate signal. The over-sampling allows a digital signal to be obtained that is more faithful to the filtered intermediate signal. However, it is not necessary to use the same over-sampling frequency for the digital processing. Thus, it is common to use a working frequency lower than the sampling frequency. In this case, the calculation of the digital equivalent of the transfer function inverse of the analog filtering is made in a different manner and may, in particular, be calculated more easily by approximation within the desired frequency range.

More particularly, the digital conditioning filter has for example a transfer function, the coefficients of which result from an approximation of the inverse of the transfer function of the analog filtering, at least in the desired frequency range, and the determination of the coefficients advantageously comprises a selection of reference frequencies chosen within said desired frequency range and, for each of these reference frequencies, a minimization of the difference between the corresponding value of the inverse transfer function of the analog filtering and the corresponding value of the transfer function of the reformatting filter.

In other words, the transfer function of the reformatting filter is calculated in this example by considering a finite number of frequencies chosen within the desired frequency range and for which the difference between the real value of the reformatting filter transfer function and the desired value equal to the inverse of the transfer function of the analog filtering. Preferably, the reference frequencies are chosen in a uniform manner within the desired frequency range.

The uniform choice of the reference frequencies allows a correct approximation of the transfer function inverse of the analog filtering to be obtained by the transfer function of the reformatting filter over the whole width of the desired frequency range. The order of the analog filtering may be chosen equal to 1 and the approximation of the inverse of the transfer function of the analog filtering then depends on the order of the digital conditioning filter.

In this case, the coefficients of the transfer function of the digital filter are easier to calculate. The transfer function of the reformatting filter is for example of the finite-impulse-response type. The transfer function may then be written in a polynomial form of which only the coefficients are to be determined. In particular, difference minimization methods allow the coefficients to be determined for this type of filter.

Preferably, the reformatting and the final digital filtering are carried out within the same filter whose transfer function is, at least within the desired frequency range, equal to the product of the transfer function of the reformatting filter and the transfer function of the final digital filter.

This embodiment can be applied whether the working frequency of the filter is equal to or different from the control frequency $F_S$. This embodiment allows the reformatting step and the final digital filtering step to be carried out at the same time. This avoids the need for a digital signal with a large number of bits between the reformatting filter and the final digital filtering, owing to the reformatting of the signal even outside of the desired frequency range. For this purpose, it suffices to multiply the two transfer functions together so as to obtain only one from them. The signal obtained at the output of the filter remains the same but this results in the fabrication of the device being simplified.

According to another aspect, the invention provides a device for processing an incident signal, comprising a circuit for the filtering and analog/digital conversion (CFCANI) of an intermediate signal extracted from the incident signal, comprising:

at least one current input for receiving the intermediate signal;

several outputs (SI1, SI2, SI3);

input capacitance means (MCEI) connected to the input;

several configurable elementary circuits (CI1, CI2, CI3) for conversion by successive approximations each connected between the input and one of the outputs (SI1, SI2, SI3) and each comprising a group of switched elementary capacitors, each elementary circuit (CI1, CI2, CI3) having a filtering state in which at least some of the elementary capacitors are connected to the input capacitance means, several different states of analog/digital conversion, and a reference state in which the group of switched elementary capacitors has a reference capacitive charge, the outputs being each capable of delivering successively a sample of several bits of a digital output signal corresponding to the filtered intermediate signal.

The device also preferably comprises control means designed to place each elementary circuit successively and cyclically into the filtering state, then into the successive analog/digital conversion states, then into the reference state.

Preferably, the outputs (SI1, SI2, SI3) are each capable of delivering, at a delivery frequency $f_d$, a sample of several bits of the digital output signal, and the control means are designed to successively place, at a control frequency $F_S$ equal to at least the product of the number of elementary circuits and the delivery frequency $f_d$, and with a time delay of $1/F_S$ between two consecutive elementary circuits, each elementary circuit (CI1, CI2, CI3) into the filtering state, then into the analog/digital conversion states in order to obtain, successively at the frequency $F_S$, the bits of a sample of the digital output signal at the corresponding output (SI1, SI2, SI3), then into the reference state.

Preferably, the filtering and analog/digital conversion circuit (CFCANI) comprises:

at least N+2 outputs (SI1, SI2, SI3) each capable of delivering, at the delivery frequency $f_d$, a sample of N bits of the digital output signal, at least N+2 elementary circuits each connected between the input and one of the N+2 outputs (SI1, SI2, SI3) and each comprising at least one group of at least N+1 switched elementary capacitors (CE11, CE12 CE13, CE14, CE21, CE22, CE23, CE24, CE31, CE32, CE33, CE34) configured in parallel and of at least N+1 configurable switches (I11, I12, I13, I14, I21, I22, I23, I24, I31, I32, I33, I34), together with a comparator (COMP1, COMP2, COMP3) connected to the corresponding output (SI1, SI2, SI3), the group of N+1 elementary capacitors of each elementary circuit being selectively connected between the comparator and a first or a second reference voltage ($V_{high}$, $V_{low}$) in the N separate analog/digital conversion states of the elementary circuit.

According to one aspect, each elementary circuit comprises at least one group of N+1 elementary capacitors, the group of elementary capacitors having a total capacitance of value C, and:

in the filtering state, the N+1 elementary capacitors are connected to the input capacitive means and in the reference state, the group of N+1 elementary capacitors has a reference capacitive charge. The values of the N+1 elementary capacitors of each elementary circuit are for example $C/2, C/4, \ldots, C/2^N, C/2^N$.

The input capacitance means comprise a filtering capacitor and, for each elementary circuit, the switches of the N elementary capacitors of values $C/2, C/4, \ldots, C/2^{N-1}, C/2^N$ have three switching states and the switch of the $(N+1)^{th}$ capacitor of value $C/2^N$ has two switching states. The control means are designed to configure the switches of an elementary circuit in the same switching state during the filtering state of the elementary circuit, and in the other switching states during the N separate analog/digital conversion states and in the reference state.

In the reference state of an elementary circuit, the switch of the elementary capacitor of value C/2 of the elementary circuit is configured so as to connect the elementary capacitor of value C/2 to one of the two reference voltages and the switches of the other N elementary capacitors are configured so as to connect the N elementary capacitors to the other of the two reference voltages.

According to another embodiment, each elementary circuit comprises at least one group of N+2 elementary capacitors, the group having a total capacitance of value 3C/2 and comprising two elementary capacitors of value C/2, and in which:

in the filtering state, the two elementary capacitors of value C/2 are connected to the input capacitive means and in the reference state, the group of N+2 elementary capacitors has a reference capacitive charge.

Preferably, the values of the N+2 elementary capacitors of each elementary circuit are $C/2, C/2, C/4, \ldots, C/2^N, C/2^N$.

Preferably, the input capacitive means comprise a filtering capacitor and, for each elementary circuit, the switches of the two capacitors of value C/2 possess three switching states, the switches of the N−1 elementary capacitors of values $C/4, \ldots C/2^{N-1}, C/2^N$ possess two switching states, and the switch of the (N+2)th capacitor of value $C/2^N$ possesses one switching state. The control means are capable of configuring the switches of an elementary circuit in the filtering state, in the other switching states during the N separate analog/digital conversion states and in the reference state. The ratio of the value of the capacitance of the input capacitive means to the value C is preferably greater than a threshold chosen according to the bandwidth of the analog signal.

Preferably, the input capacitive means furthermore comprise at least one additional filtering capacitor. The device comprises a number of additional outputs and additional elementary circuits equal to the number of additional filtering capacitors and for each elementary circuit, the switches of the elementary capacitors connected to the input capacitive means during the filtering state furthermore possess an additional number of switching states equal to the number of additional filtering capacitors. The filtering state of each elementary circuit comprises various filtering sub-states in which at least some of the elementary capacitors are respectively connected to the various filtering capacitors, and the control means are capable of configuring the switches of the elementary circuit so as to place it in succession in each of the filtering sub-states.

Preferably, the filtering and analog/digital conversion circuit comprises an additional output and an additional elementary circuit and each elementary circuit also has a calibration state in which the comparator is connected to two equal voltages in such a manner as to determine and correct its offset. The control means are also capable of configuring the switches of each elementary circuit so as to place it into its calibration state after its reference state.

The device can also have a differential architecture in which each elementary circuit comprises a second group of at least N+1 switched elementary capacitors configured in parallel and of at least N+1 configurable switches. In one particular application, the invention provides a device for processing an incident signal comprising:

a transconductor stage comprising an input for receiving the incident signal, frequency-transposition means connected between the transconductor stage and the filtering capacitor, comprising:

generation means designed to deliver a periodic signal, a set of switches configurable in response to a control signal, control means designed to deliver the control signal starting from the periodic signal for configuring the set of switches in such a manner as to connect a current output of the transconductor stage to the filtering capacitor and to deliver to the filtering capacitor a current signal lasting for at least part of the first half-period of each period of the periodic signal and to thus obtain, at the filtering capacitor, a frequency-transposed signal as intermediate signal.

The device also comprises reset means designed to reset, upon the occurrence of each part of the first half-period, the voltage of the current output, seen from the filtering capacitor, to a value equal to that of the voltage of the filtering capacitor. Preferably, the control means are capable of delivering the control signal on the basis of the periodic signal for configuring the set of switches so as to deliver to the output capacitor a current signal and its opposite respectively during the two half-periods of each period of the periodic signal and the resetting means are capable of resetting, upon the occurrence of each half-period of the periodic signal, the voltage of the current output, seen from the output capacitor, to a value equal to that of the voltage of the output capacitor.

According to one embodiment of the device, the transconductor stage comprises two current outputs capable of respectively delivering two current signals of opposing sign. The set of switches has a first state in which it connects the first current output to the filtering capacitor and a second state in which it connects the second current output to the filtering capacitor. The control means are designed to deliver the control signal in such a manner as to configure the set of switches in the first state during each first half-period of the periodic signal and in the second state during each second half-period of the periodic signal. In addition, the reset means are designed to:

fix the voltage of the first current output at the value of the voltage of the filtering capacitor at least at the end of each second half-period of the periodic signal, fix the voltage of the second current output at the value of the voltage of the filtering capacitor at least at the end of each first half-period of the periodic signal.

Preferably, the reset means comprise an additional set of switches configurable in response to an additional control signal, together with additional control means designed to deliver the additional control signal starting from the periodic signal. The additional set of switches has a first state in which it connects the filtering capacitor to the second current output and a second state in which it connects the filtering capacitor to the first current output.

The additional control means are designed to deliver the additional control signal so as to configure the additional set of switches in the first state at least at the end of each first half-period of the periodic signal and in the second state at least at the end of each second half-period of the periodic signal.

The additional control means are for example designed to deliver the additional control signal so as to configure said additional set of switches in the first state and the second state, respectively, during the whole of the first half-period and the whole of the second half-period of the periodic signal, respectively.

According to another embodiment, the transconductor stage comprises a single current output capable of delivering the current signal. The set of configurable switches has a first state in which it connects the current output to the filtering capacitor, a second state in which it connects, in a reverse manner to that effected in the first state, the current output to the filtering capacitor and a third state in which it electrically disconnects the current output from the filtering capacitor. The control means are designed to deliver the control signal in such a manner as to configure said set of switches in the first state during the first part of each first half-period of the periodic signal, in the second state during the first part of each second half-period of the periodic signal and in the third state during the second part of each first half-period and second half-period of the periodic signal. The reset means are designed to:

fix the voltage of the current output at the inverse of the value of the voltage of the filtering capacitor at least at the end of the second part of each first half-period of the periodic signal, fix the voltage of the current output at the value of the voltage of the filtering capacitor at least at the end of the second part of each second half-period of the periodic signal.

Preferably, the reset means comprise an additional set of switches configurable in response to an additional control signal, together with additional control means designed to deliver the additional control signal starting from the periodic signal. The additional set of switches has a first state in which it connects the filtering capacitor to the current output, a second state in which it connects, in a reverse manner to that effected in the first state, the filtering capacitor to the current output and a third state in which it electrically disconnects the filtering capacitor from the current output. The additional control means are designed to deliver the additional control signal so as to configure the additional set of switches in the first state at least at the end of the second part of each first half-period of the periodic signal, in the second state at least at the end of the second part of each second half-period of the periodic signal and in the third state during the first part of each first and second half-period of the periodic signal.

The additional control means are for example designed to deliver the additional control signal in such a manner as to configure the additional set of switches in the first state and the second state, respectively, during the whole of the second part of the first half-period and the second half-period, respectively, of the periodic signal.

According to another embodiment, the transconductor stage comprises a single current output capable of delivering the current signal. The set of configurable switches possesses a first state in which it connects the current output to the output capacitor and a second state in which it electrically disconnects the current output from the output capacitor. The control means are capable of delivering the control signal so as to configure the set of switches in the first state during each first half-period of the periodic signal and in the second state during each second half-period of the periodic signal, and the resetting means are capable of fixing the voltage of the output current to the voltage of the output capacitor at least at the end of the second half-period of the periodic signal.

Preferably, the resetting means comprise an additional set of switches configurable in response to an additional control signal, and also additional control means capable of delivering the additional control signal on the basis of the periodic signal. The additional set of switches possesses a first state, in which it connects the output capacitor to the current output, and a second state, in which it electrically disconnects the output capacitor from the current output. The additional control means are capable of delivering the additional control signal so as to configure said additional set of switches in the first state at least at the end of each second half-period of the periodic signal and in the second state during each first half-period of the periodic signal.

Preferably, the reset means also comprise an amplifier stage configured in follower between the filtering capacitor and the current output or outputs via the additional set of switches. Preferably, the device has a differential architecture.

In another particular application, the invention provides a device in which the filtering and analog/digital conversion circuit is capable of filtering the intermediate signal in such a manner as to filter out the frequency components situated outside of a desired frequency range. The device also comprises reformatting means designed to reformat the digital output signal into a form substantially identical to the initial form of the intermediate signal, at least within the desired frequency range, and additional filtering means designed to carry out a final digital filtering of the reformatted digital signal in such a manner as to filter out the frequency components situated outside of the desired frequency range.

According to one embodiment, the reformatting means comprise a reformatting digital filter having a working frequency equal to the control frequency $F_S$ and having a transfer function inverse of the transfer function of the analog filtering effected by the filtering and analog/digital conversion circuit at least within the desired frequency range.

According to another embodiment, the reformatting means comprise a reformatting digital filter having a working frequency different from and preferably lower than the control frequency $F_S$ and having a transfer function resulting from an approximation of the inverse of the transfer function of the analog filtering effected by the filtering and analog/digital conversion circuit at least within the desired frequency range.

The digital conditioning filter has for example a transfer function, the coefficients of which result from an approximation of the inverse of the transfer function of the analog filtering, at least in the desired frequency range, and coefficients are for example determined such that, for each frequency taken in a group of reference frequencies chosen within the frequency range, the difference between the corresponding value of the transfer function inverse of the analog filtering and the corresponding value of the transfer function of the reformatting filter is minimal.

The order of the analog filtering may be chosen equal to 1 and the approximation of the inverse of the transfer function of the analog filtering then depends on the order of the digital reformatting filter. The reformatting filter is for example of the finite-impulse-response type. Preferably, the reformatting means and the additional digital filtering means comprise the same filter whose transfer function is equal to the product of the transfer function of the reformatting filter and the transfer function of the final digital filter.

The device may be fabricated in the form of an integrated circuit. According to another aspect, the invention provides a radio frequency signal receiver comprising a device for processing a radio frequency signal such as that previously defined.

BRIEF DESCRIPTION OF THE DRAWINGS

Other advantages and features will become apparent upon examining the detailed description of non-limiting embodiments and their implementations, and of the appended drawings in which:

FIG. 28 is a timing diagram illustrating an example of periodic signal delivered by the generator of the transposition stage of FIG. 25;

DETAILED DESCRIPTION OF THE PREFERRED EMBODIMENTS

Figure 1:
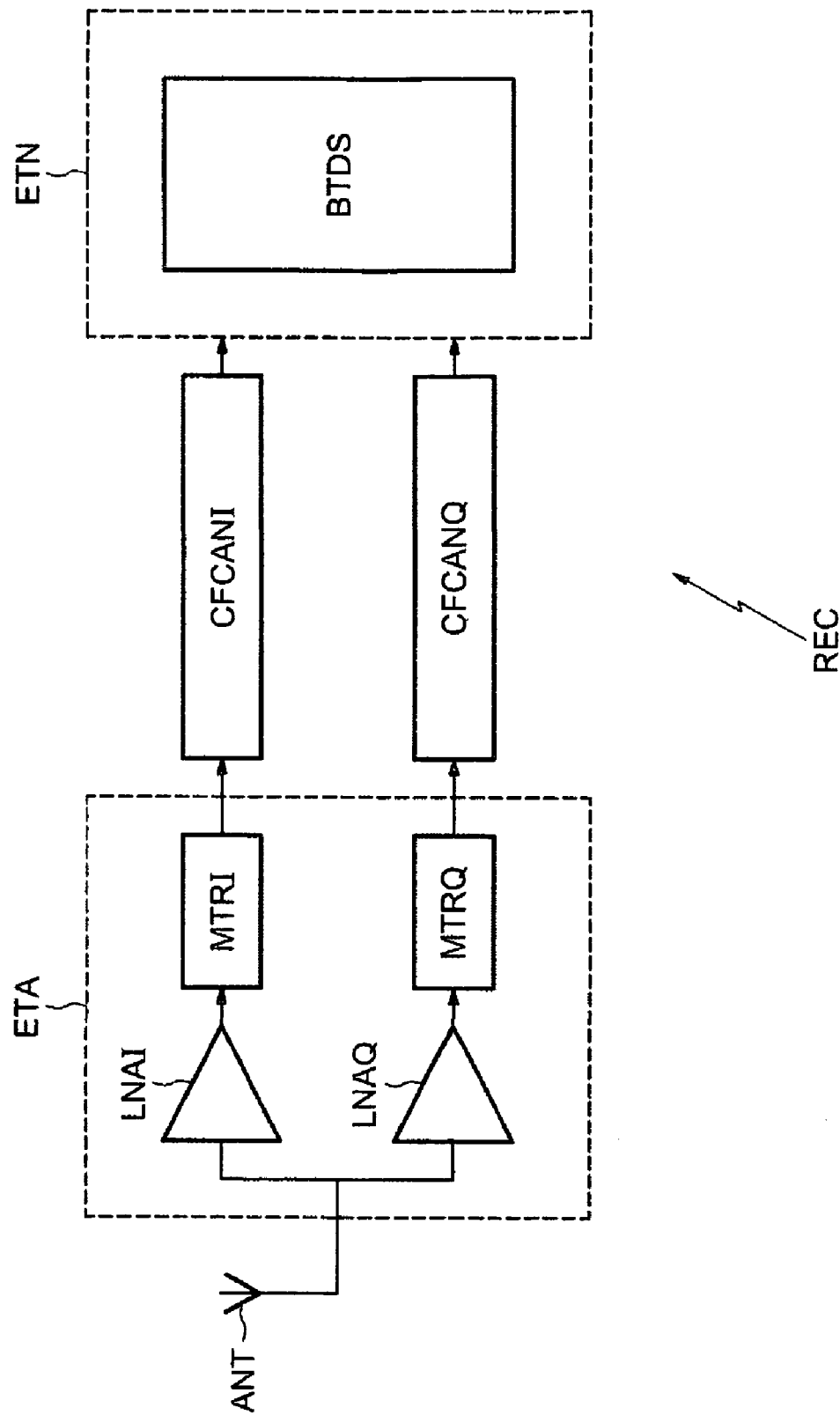
FIG. 1 is a schematic diagram illustrating the internal structure of one embodiment of a device according to the present invention.

In FIG. 1, the reference REC denotes a receiver of a radio frequency signal, for example a cellular mobile telephone. The receiver REC comprises an antenna ANT picking up the incident signal, a stage ETA for analog processing of the signal and a stage ETN for digital processing of the signal. The analog processing stage ETA and the digital processing stage ETN are separated by a filtering and analog/digital conversion circuit CFCANI and CFCANQ.

It is considered that the incident signal picked up by the antenna ANT comprises, for example, several frequency channels each having a central frequency specific to each channel and an identical width which will be referred to as 'frequency range'.

The analog processing stage ETA comprises at its front end a low-noise amplifier stage LNAI, LNAQ connected to the antenna ANT. This amplifier stage LNAI, LNAQ is followed by a frequency-transposition stage MTRI, MTRQ. Each frequency-transposition stage MTRI, MTRQ receives the signal coming from the amplifier stage LNAI, LNAQ and here delivers a signal transposed to baseband, which will be referred to as intermediate signal, starting from a transposition signal. The transposition signals are mutually phase-shifted by 90° between the two transposition stages MTRI, MTRQ.

The transposition signal has a frequency equal to the central frequency of the desired channel. As a consequence, the intermediate signal ends up with a central frequency equal, or about equal, to the zero frequency. In other words, at the outputs of the two transposition stages MTRI and MTRQ, on the two processing channels I and Q, two analog signals in quadrature, in baseband, in other words having the useful signal centred around the zero frequency, are obtained.

In the following part of the text, only one of the two processing channels will now be described, for example the channel I, it being clearly understood that the channel Q has an analogous structure. The filtering and analog/digital conversion circuit CFCANI is disposed at the output of the mixer MTRI. The circuit CFCANI allows on the one hand the adjacent channels to be filtered out from the useful signal, in other words the channels situated beyond the frequency range of the desired channel and centred on the zero frequency, and, on the other, the filtered intermediate signal to be converted into a digital output signal.

The digital output signal is then processed in a digital stage ETN of conventional structure and known per se and notably comprising a unit BTDS for processing and demodulating the signal. The unit BTDS also receives a signal from the channel Q and can then carry out the conventional processing of channel decoding, notably demodulation, and source decoding. The unit BTDS can be formed by software means within a microprocessor.

Figure 2:
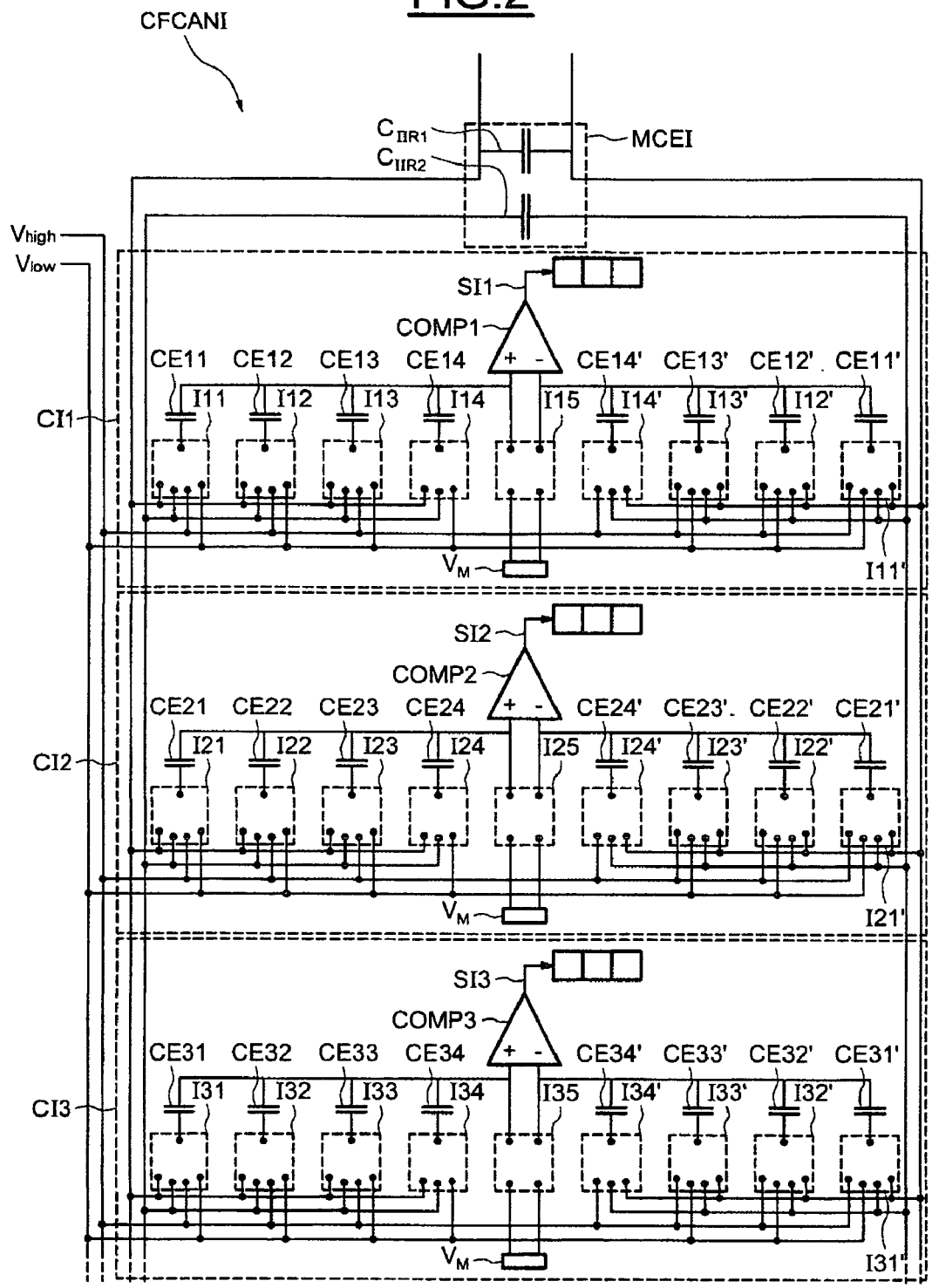
FIG. 2 is a schematic diagram illustrating a first embodiment of a filtering and analog/digital conversion circuit of the device of FIG. 1.

FIG. 2 shows a first embodiment of the filtering and analog/digital conversion circuit CFCANI, using differential architecture. It goes without saying that this embodiment is not limited to a differential architecture, and those skilled in the art will readily be able to adapt the description that follows to a non-differential architecture.

In this embodiment, the circuit CFCANI comprises input capacitance means MCEI comprising two filtering capacitors $C_{IIR1}$ and $C_{IIR2}$. The filtering capacitors $C_{IIR1}$ and $C_{IIR2}$ are capacitors referred to as 'memory capacitors' whose capacitance is high and is not reset to zero. It also comprises elementary circuits allowing, on the one hand, the intermediate signal to be filtered with the input capacitance means MCEI and, on the other, the filtered intermediate signal to be converted by successive approximations in such a manner as to deliver samples with N bits of a digital output signal. In view of the number (2) of filtering capacitors and of the fact that the circuit CFCANI also has a calibration state, albeit optional (as will be seen in more detail hereinafter), the circuit CFCANI comprises N+4 elementary circuits.

In the example described here, N is taken equal to 3. The circuit CFCANI thus comprises 7 elementary circuits four of which have not been shown for the sake of simplification. The elementary circuits CI1, CI2, CI3 each comprise a comparator COMP1, COMP2, COMP3 each having a positive terminal and a negative terminal. The elementary circuits CI1, CI2, CI3 also comprise an output SI1, SI2, SI3 each delivering, at the frequency $f_d$, samples with 3 bits of the digital output signal. Two reference voltages $V_{high}$ and $V_{low}$ are also provided. The voltages $V_{high}$ and $V_{low}$ are preferably chosen in such a manner that their average $(V_{high}+V_{low})/2$ is the working voltage around which the input capacitance means MCEI are desired to operate and in such a manner that their difference $(V_{high}-V_{low})$ corresponds approximately to the variation amplitude of the intermediate signal.

The elementary circuit CI1 comprises two groups of 4 switches I11, I12, I13, I14, I11', I12', I13', I14' and of 4 elementary capacitors CE11, CE12, CE13, CE14, CE11', CE12', CE13', CE14' of respective values C/2, C/4, C/8, C/8, C/2, C/4, C/8, C/8. A first group of elementary capacitors comprises the elementary capacitors CE11, CE12, CE13, CE14 and the switches I11, I12, I13, I14. Each elementary capacitor CE11, CE12, CE13, CE14 comprises a first terminal which is connected to the positive terminal of the comparator COMP1, and a second terminal which is respectively connected to a switch I11, I12, I13, I14. A second group of elementary capacitors comprises the elementary capacitors CE11', CE12', CE13', CE14' and the switches I11', I12', I13', I14'. Each elementary capacitor CE11', CE12', CE13', CE14' comprises a first terminal which is connected to the negative terminal of the comparator COMP1, and a second terminal which is respectively connected to a switch I11', I12', I13', I14'. The switches I11, I12, I13, I11', I12', I13' comprise four switching states and the switches I14 and I14' comprise three switching states. The circuit CI1 also comprises an additional switch I15 connecting the inputs of the comparator COMP1 to a ground voltage $V_M$.

The elementary circuit CI2 comprises two groups of 4 switches I21, I22, I23, I24, I21', I22', I23', I24' and of 4 elementary capacitors CE21, CE22, CE23, CE24, CE21', CE22', CE23', CE24' of respective values C/2, C/4, C/8, C/8, C/2, C/4, C/8, C/8. A first group of elementary capacitors comprises the elementary capacitors CE21, CE22, CE23, CE24 and the switches I21, I22, I23, I24. Each elementary capacitor CE21, CE22, CE23, CE24 comprises a first terminal which is connected to the positive terminal of the comparator COMP2, and a second terminal which is respectively connected to a switch I21, I22, I23, I24. A second group of elementary capacitors comprises the elementary capacitors CE21', CE22', CE23', CE24' and the switches I21', I22', I23', I24'. Each elementary capacitor CE21', CE22', CE23', CE24' comprises a first terminal which is connected to the negative terminal of the comparator COMP2, and a second terminal which is respectively connected to a switch I21', I22', I23', I24'. The switches I21, I22, I23, I21', I22', I23' comprise four switching states and the switches I24 and I24' comprise three switching states. The circuit CI2 also comprises an additional switch 125 connecting the inputs of the comparator COMP2 to a ground voltage $V_M$.

The elementary circuit CI3 comprises two groups of 4 switches I31, I32, I33, I34, I31', I32', I33', I34' and of 4 elementary capacitors CE31, CE32, CE33, CE34, CE31', CE32', CE33', CE34' of respective values C/2, C/4, C/8, C/8, C/2, C/4, C/8, C/8. A first group of elementary capacitors comprises the elementary capacitors CE31, CE32, CE33, CE34 and the switches I31, I32, I33, I34. Each elementary capacitor CE31, CE32, CE33, CE34 comprises a first terminal which is connected to the positive terminal of the comparator COMP3, and a second terminal which is respectively connected to a switch I31, I32, I33, I34. A second group of elementary capacitors comprises the elementary capacitors CE31', CE32', CE33', CE34' and the switches I31', I32', I33', I34'. Each elementary capacitor CE31', CE32', CE33', CE34' comprises a first terminal which is connected to the negative terminal of the comparator COMP3, and a second terminal which is respectively connected to a switch I31', I32', I33', I34'. The switches I31, I32, I33, I31', I32', I33' comprise four switching states and the switches I34 and I34' comprise three switching states. The circuit CI3 also comprises an additional switch I35 connecting the inputs of the comparator COMP3 to a ground voltage $V_M$.

It is considered that, before the first configuration state of each elementary circuit, the latter is in its common mode, in other words that the potential of the terminals of the comparator is equal to $V_M$, and that the potential of the second terminal of each elementary capacitor is equal to $(V_{high}+V_{low})/2$.

Figure 3:
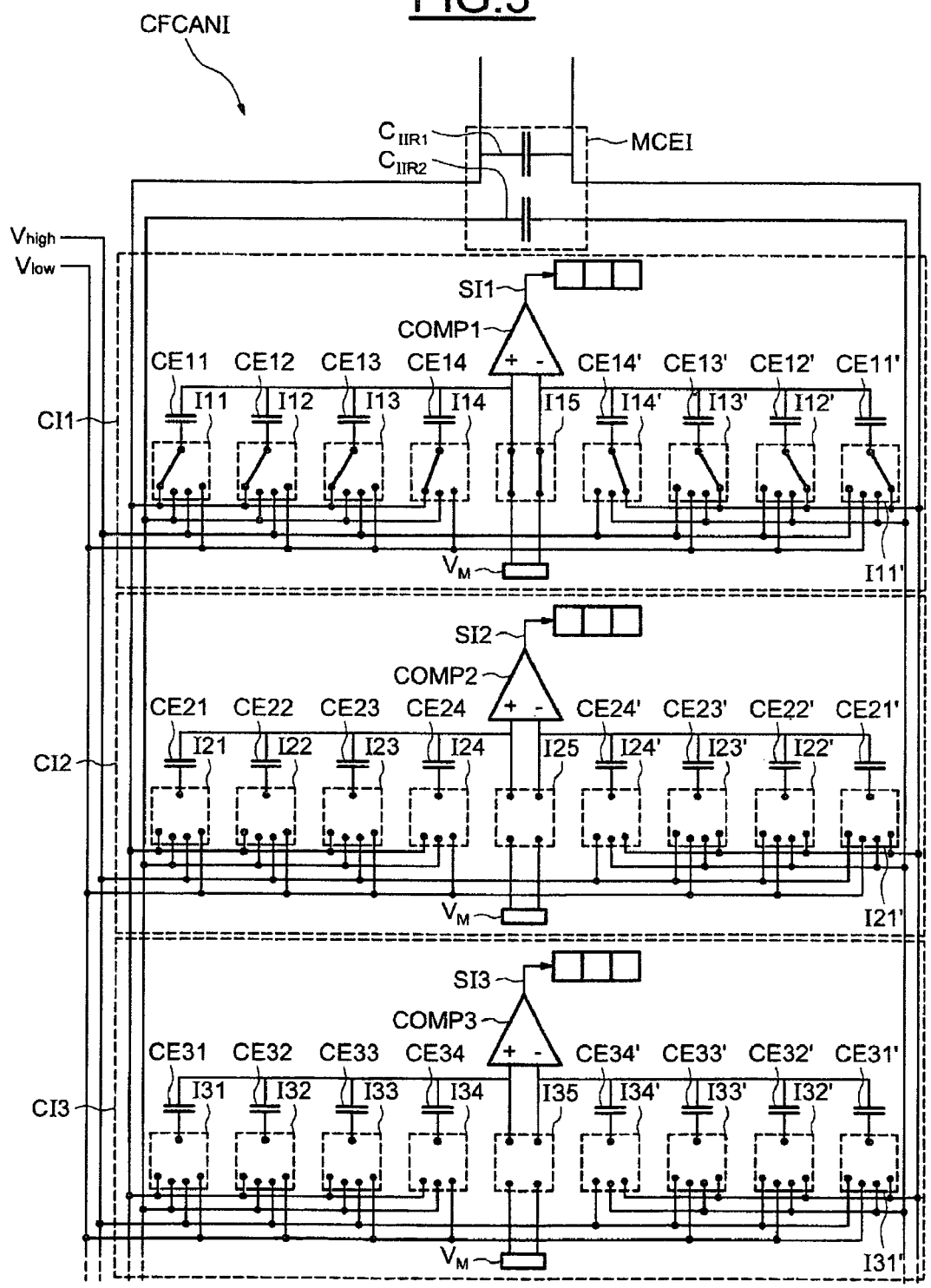
FIGS. 3 to 9 are schematic diagrams illustrating various configuration states of the filtering and analog/digital conversion circuit in FIG. 2.

FIG. 3 shows the first configuration state of the elementary circuit CI1 which marks the start of a filtering and conversion cycle for one sample of the intermediate signal. In this first configuration state, the switches I11, I12, I13, I14 of the first group of elementary capacitors are configured in a first same switching state in which they connect the second terminal of each elementary capacitor CE11, CE12, CE13, CE14 to the current input of the circuit CFCANI and also to the filtering capacitor $C_{IIR1}$ connected to the current input. The configuration of the second group of elementary capacitors is similar to that of the first group. In addition, the switch I15 connects the two terminals of the comparator COMP1, and hence the first terminal of each elementary capacitor of the first and of the second group of elementary capacitors, to the ground voltage $V_M$. The elementary circuit CI1 is then placed in its first filtering sub-state during which the intermediate signal is integrated and sampled in the first and the second group of elementary capacitors over a period $1/F_S$. The control frequency $F_S$ of the circuit CFCANI therefore defines the sampling frequency.

This first filtering sub-state performs on the one hand an anti-aliasing filtering thanks to the integration of the signal in the elementary capacitors over a period $1/F_S$ and, on the other, this first filtering sub-state also performs an infinite-impulse-response filtering thanks to the filtering capacitor $C_{IIR1}$ which averages the intermediate signal. The filtering capacitor $C_{IIR1}$ allows the intermediate signal to be averaged over a longer period than $1/F_S$ because the capacitor is not reset to zero. A low-pass filtering is then obtained with transfer function:

$$G_1 = \frac{C}{(C + C_{IIR1} - C_{IIR1} \cdot z^{-1})}$$

Figure 4:
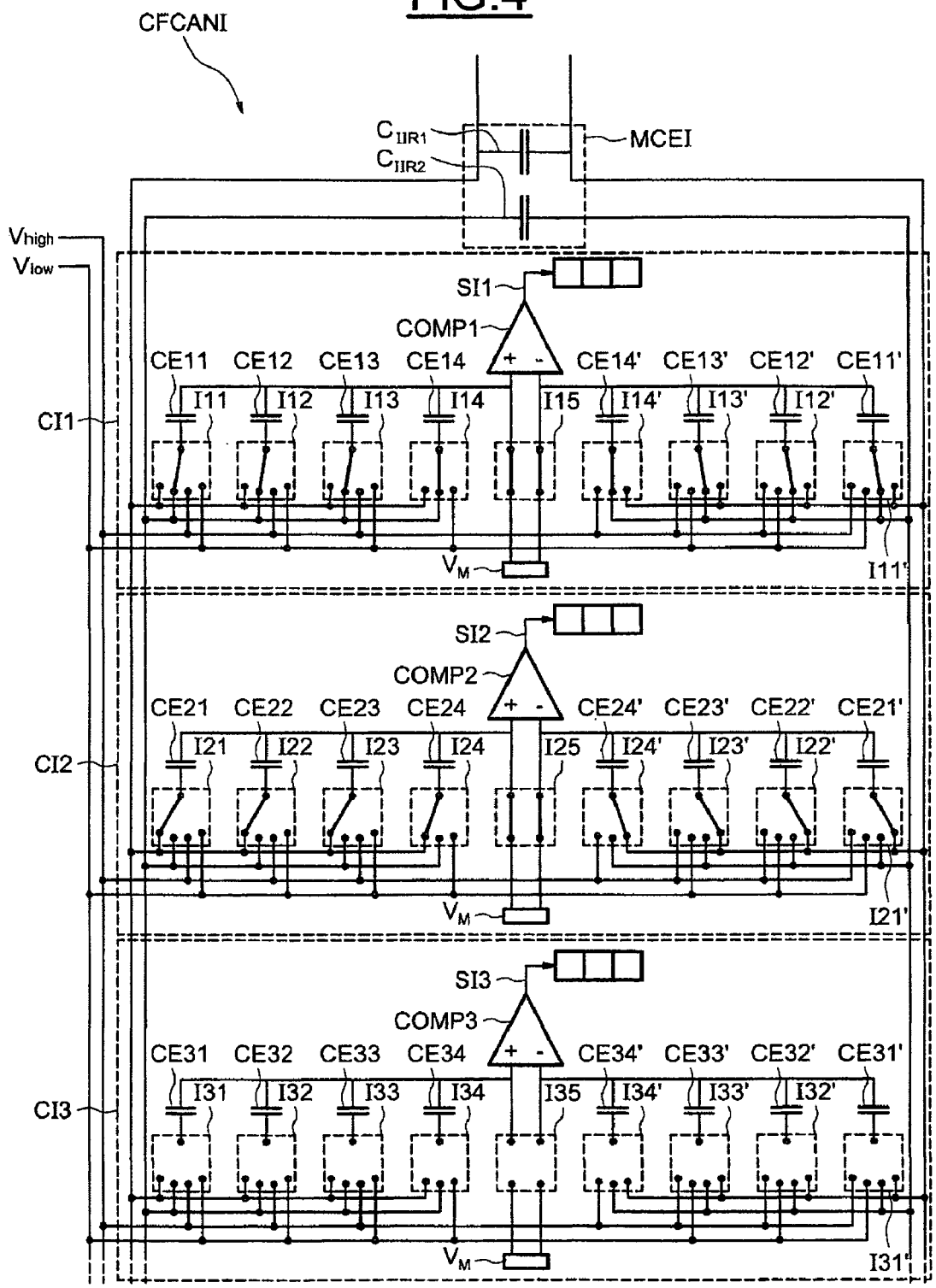

FIG. 4 shows the second filtering sub-state of the elementary circuit CI1. In this second filtering sub-state, the switches I11, I12, I13, I14 of the first group of elementary capacitors are configured in a second same switching state in which they connect the second terminal of each elementary capacitor CE11, CE12, CE13, CE14 to the additional filtering capacitor $C_{IIR2}$. The configuration of the second group of elementary capacitors is similar to that of the first group. In addition, the switch I15 still connects the two terminals of the comparator COMP1, and hence the first terminal of each elementary capacitor of the first and of the second group of elementary capacitors, to the ground voltage $V_M$.

This second filtering sub-state performs a second order of infinite-impulse-response filtering IIR thanks to the additional filtering capacitor $C_{IIR2}$ which averages the signal previously averaged by the filtering capacitor $C_{IIR}$. A total low-pass filtering is then obtained with transfer function:

$$G = \frac{C^2}{(C + C_{IIR1} - C_{IIR1} \cdot z^{-1}) \cdot (C + C_{IIR2} - C_{IIR2} \cdot z^{-1})}$$

During the two filtering sub-states of the elementary circuit CI1, the potential of the first terminals of the elementary capacitors remains equal to $V_M$, whereas the potential of the second terminals of the elementary capacitors varies around $(V_{high}+V_{low})/2$ as a function of the filtered intermediate signal.

Thus, if the filtered intermediate signal is positive, then the potential of the second terminals of the first group of elementary capacitors becomes higher than $(V_{high}+V_{low})/2$, for example $((V_{high}+V_{low})/2)+dV$, whereas the potential of the second terminals of the second group of elementary capacitors becomes lower than $(V_{high}+V_{low})/2$, for example $((V_{high}+V_{low})/2)-dV$.

Over the same time period, the second elementary circuit CI2 is placed in its first filtering sub-state in order to process the intermediate signal sample arriving during the second filtering sub-state of the elementary circuit CI1.

Figure 5:
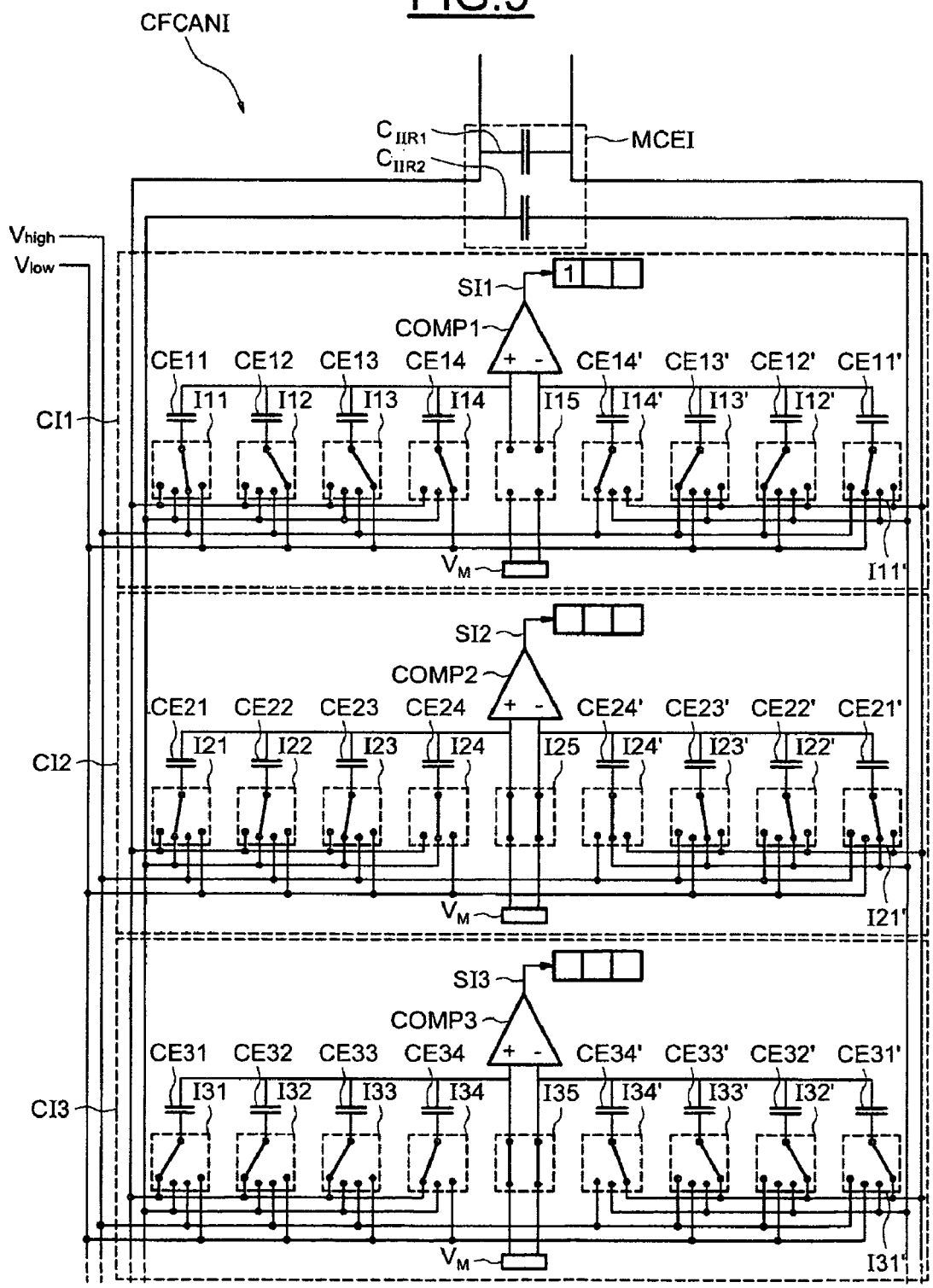

FIG. 5 shows the first analog/digital conversion state of the elementary circuit CI1. In this first conversion state, the switch I15 is open; for the first group of elementary capacitors, the switch I1 connects the second terminal of the elementary capacitor CE11 (of capacitance C/2) to the reference voltage $V_{high}$ and the switches I2, I3 and I4 connect the second terminal of the elementary capacitors CE12, CE13 and CE14 (of capacitance: C/4+C/8+C/8=C/2) to the reference voltage $V_{low}$; for the second group of elementary capacitors, the switch I1' connects the second terminal of the elementary capacitor CE11' (of capacitance C/2) to the reference voltage $V_{low}$ and the switches I2', I3' and I4' connect the second terminal of the elementary capacitors CE12', CE13' and CE14' (of capacitance: C/4+C/8+C/8=C/2) to the reference voltage $V_{high}$. In this way, each group of elementary capacitors behaves as if the second terminals of the elementary capacitors had all been connected to a voltage equal to $(V_{high}+V_{low})/2$.

The variations in potential around $(V_{high}+V_{low})/2$ which have appeared on the second terminals of the elementary capacitors during the filtering sub-states thus become variations in potential, of opposite sign, around $V_M$ on the first terminals of the elementary capacitors, in other words on the terminals of the comparator COMP1.

Thus, if the filtered intermediate signal is positive, then the potential of the positive terminal (or negative terminal, respectively) of the comparator COMP1 becomes equal to $V_M$–dV (or $V_M$+dV, respectively), and the output SI1 of the comparator COMP1 is negative.

The most-significant bit is then obtained that is the inverse of the digitized signal, at the output SI1 of the comparator COMP1. If, for example, the output SI1 of the comparator COMP1 is positive, then the most-significant bit is 1. If the output SI1 is negative, the most-significant bit is 0. In the following part of the description, the most-significant bit at the output SI1 is considered to be: 1.

Over the same time period, the second elementary circuit CI2 is placed in its second filtering sub-state and the third elementary circuit CI3 is placed in its first filtering sub-state in order to process the intermediate signal sample arriving during the second filtering sub-state of the elementary circuit CI2 and the first conversion state of the elementary circuit CI1.

Figure 6:
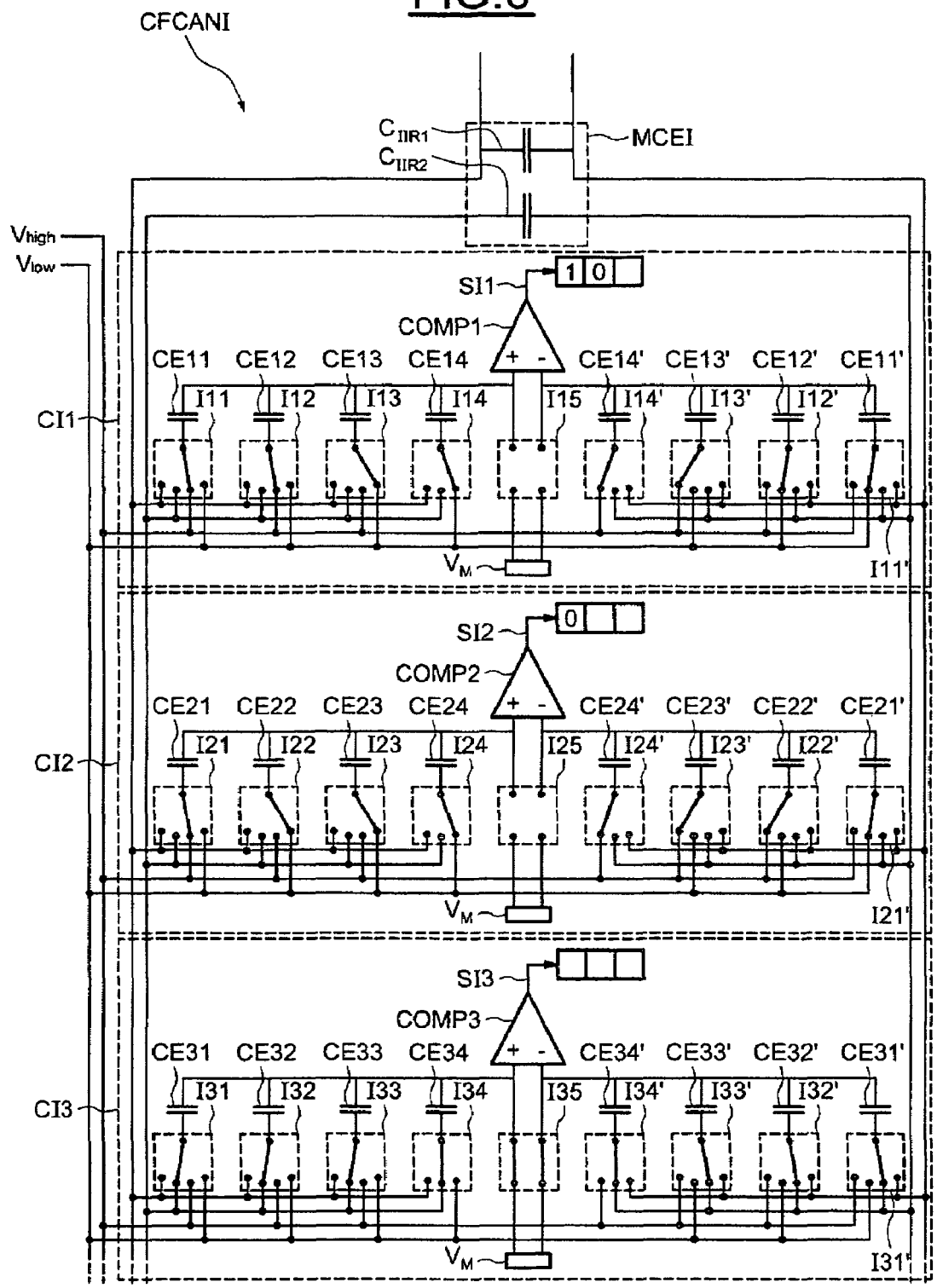

FIG. 6 shows the second analog/digital conversion state of the elementary circuit CI1. In this second conversion state, the switches of the elementary circuit CI1 remain in the same switching state as during the first conversion state, except for the switches I12 and I12' and possibly I11 and I11' depending on the value of the most-significant bit.

Indeed, when the second terminal of an elementary capacitor of value $C/2^N$ of the first group (or of the second group, respectively) of elementary capacitors is connected to the reference voltage $V_{high}$ (or $V_{low}$, respectively), the voltage $(V_{high}-V_{low})/2^N$ is subtracted (or added, respectively) to the level of the voltage of the positive (or negative, respectively) terminal of the comparator COMP1. The value of the bit then obtained indicates whether the dynamic range of the converter is re-centred around zero in order to determine the following bit (case where the bit obtained is 0), or else whether an additional voltage is subtracted in order to determine the following bit (case where the bit obtained is 1).

Therefore, if the most-significant bit is equal to 0, $(V_{high}-V_{low})/4$ must be added to (or subtracted from, respectively) the positive terminal (or negative terminal, respectively) of the comparator COMP1 in order to re-centre the dynamic range of the converter.

This is carried out by connecting the second terminal of the capacitor CE11 to the reference voltage $V_{low}$, and the second terminal of the capacitor of lower capacitance, in this case the elementary capacitor CE12 of value C/4, to the reference voltage $V_{high}$. The circuit then ends up in a configuration allowing the following bit to be determined.

In the present case, the most-significant bit is equal to 1, hence the switches I11 and I11' do not change switching state and the switch I12 (or I12', respectively) connects the second terminal of the elementary capacitor CE12 (or CE12', respectively) to the reference voltage $V_{high}$ (or $V_{low}$, respectively) so as to subtract (or add, respectively) the voltage $(V_{high}-V_{low})/4$ at the positive terminal (or negative terminal, respectively) of the comparator COMP1.

The second bit of the signal to be digitized is then obtained at the output SI1 of the comparator COMP1. If the output SI1 of the comparator COMP1 is positive, then the second bit is 1. If the output is negative, then the second bit is 0. In the following part of the description, the second bit at the output SI1 is considered to be: 0.

Over the same time period, the second elementary circuit CI2 is placed in its first conversion state, the third elementary circuit CI3 is placed in its second filtering sub-state and the fourth elementary circuit is placed in its first filtering sub-state.

Figure 7:
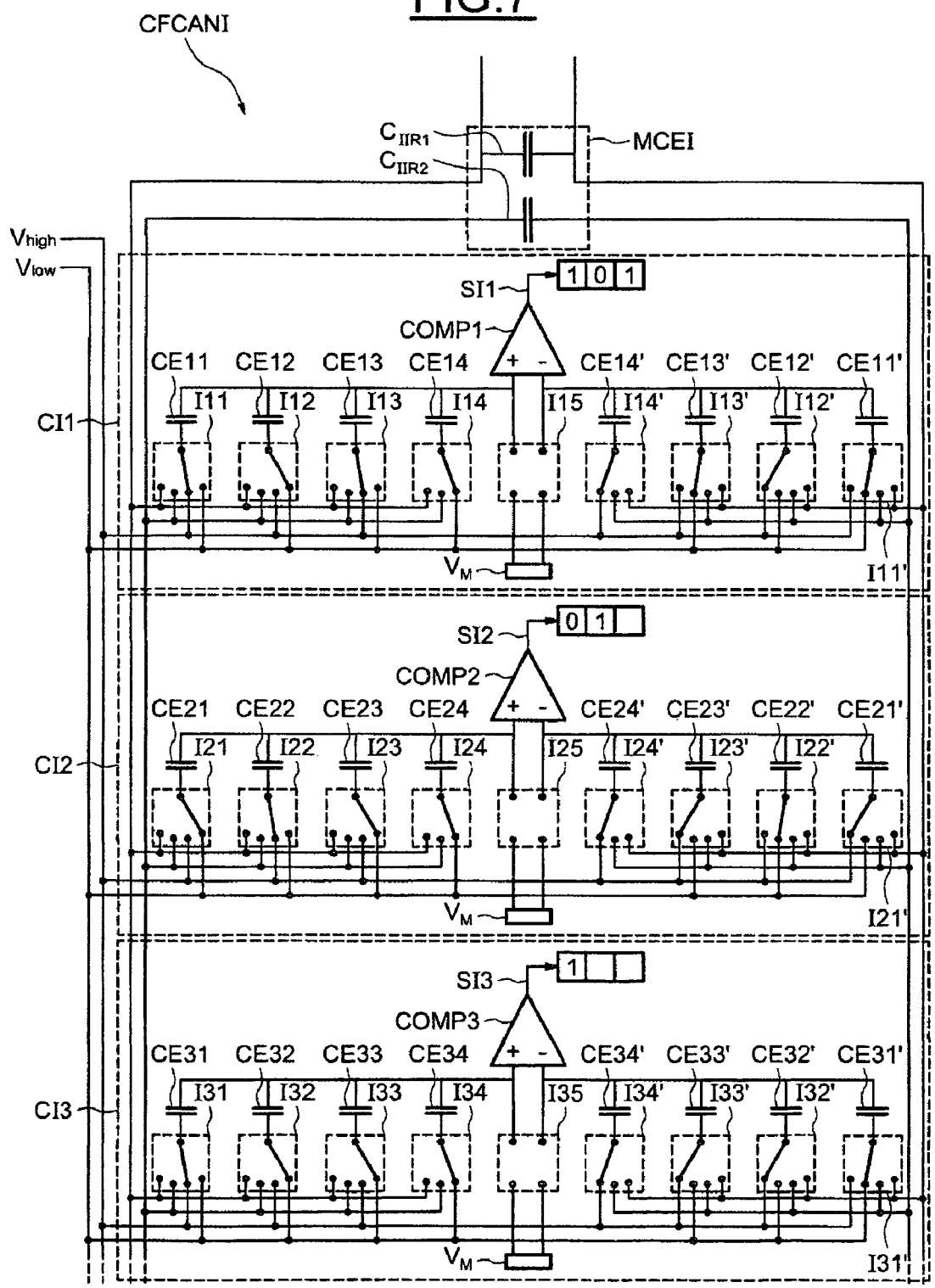

FIG. 7 shows the third analog/digital conversion state of the elementary circuit CI1. In this third conversion state, the switches of the elementary circuit CI1 remain in the same switching state as during the second conversion state, except for the switches I13 and I13' and possibly I12 and I12' depending on the second bit.

When the second bit is equal to 1, the switches I12 and I12' do not change switching state. In the present case, the second bit is 0, hence the dynamic range of the converter is re-centred around zero by adding (or by subtracting, respectively) a voltage $(V_{high}-V_{low})/8$ at the positive terminal (or negative terminal, respectively) of the comparator COMP1. This is achieved by changing the switching state of the switches I12 and I12' so as to connect the second terminal of the capacitor CE12 (or CE12', respectively) to the reference voltage $V_{low}$ (or $V_{high}$, respectively), and by changing the switching state of the switches I13 and I13' so as to connect the second terminal of the capacitor CE13 (or CE13', respectively) to the reference voltage $V_{high}$ (or $V_{low}$, respectively).

The third bit of the signal to be digitized is then obtained at the output SI1 of the comparator COMP1. If the output SI1 of the comparator COMP1 is positive, then the third bit is 1. If the output is negative, then the third bit is 0. In the following part of the description, the third bit at the output SI1 is considered to be: 1. Over the same time period, the second elementary circuit CI2 is placed in its second conversion state, the third elementary circuit CI3 is placed in its first conversion state, the fourth elementary circuit is placed in its second filtering sub-state and the fifth elementary circuit is placed in its first filtering sub-state.

Figure 8:
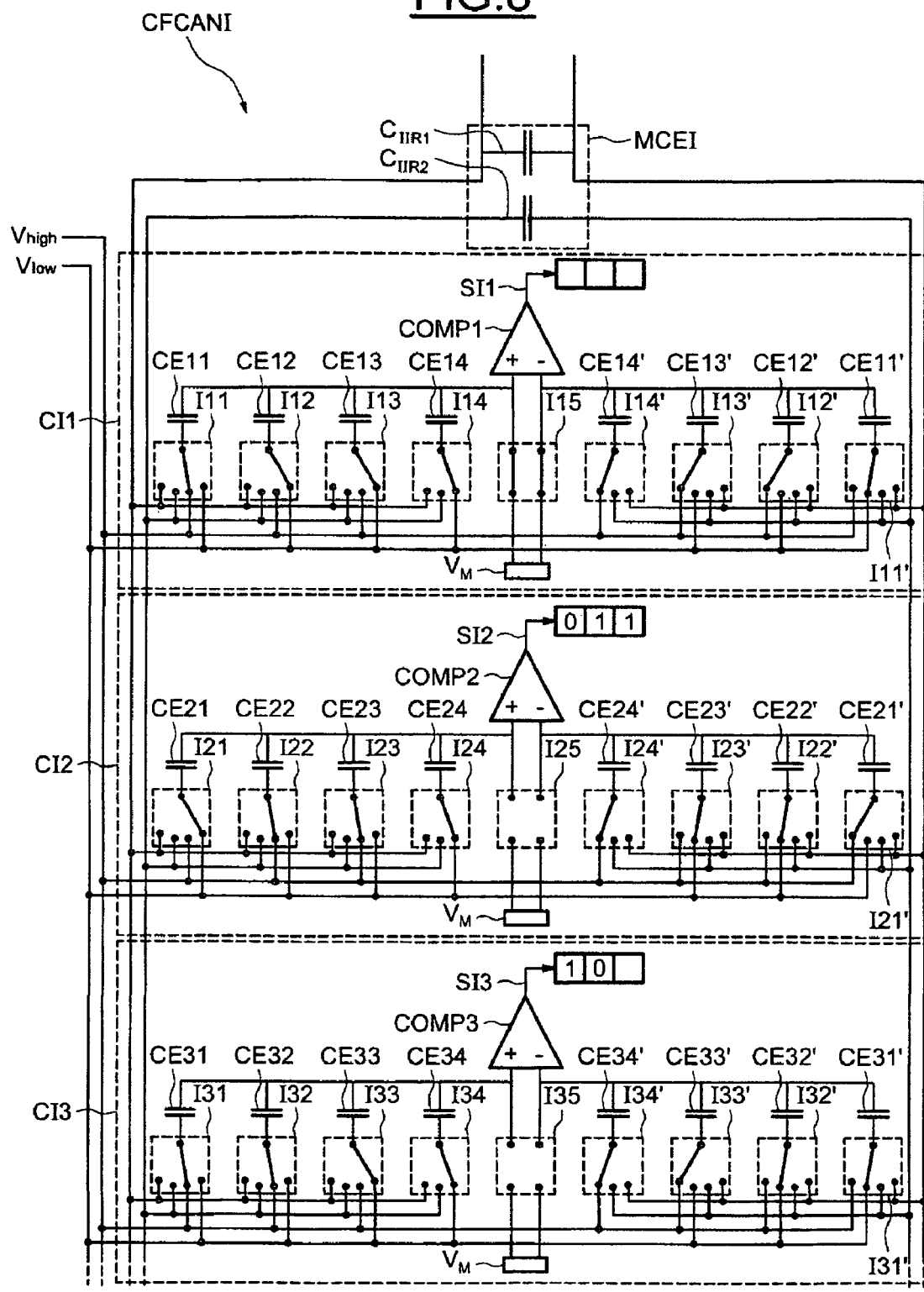

FIG. 8 shows the reference state of the elementary circuit CI1. Indeed, the three bits of the digital output signal sample have been determined by the elementary circuit CI1. The circuit CI1 is then reset (back to a reference state) so as to be able to process the following signal sample. In this reference state, the switch I15 connects each terminal of the comparator COMP1 to the ground voltage $V_M$. In addition, the switches I1, I4', I3' and I2' connect the second terminal of the elementary capacitors CE11, CE14', CE13' and CE12' to the reference voltage $V_{high}$ and the switches I2, I3, I4 and I1' connect the second terminal of the elementary capacitors CE12, CE13, CE14 and CE11' to the reference voltage $V_{low}$ in such a manner that each group of elementary capacitors behaves as if the second terminals of the elementary capacitors had all been connected to a voltage equal to $(V_{high}+V_{low})/2$. The reference state enables the elementary circuit CI1 to be placed in a common mode.

Over the same time period, the second elementary circuit CI2 is placed in its third conversion state, the third elementary circuit CI3 is placed in its second conversion state, the fourth elementary circuit is placed in its first conversion state, the fifth elementary circuit is placed in its second filtering sub-state and the sixth elementary circuit is placed in its first filtering sub-state.

Figure 9:
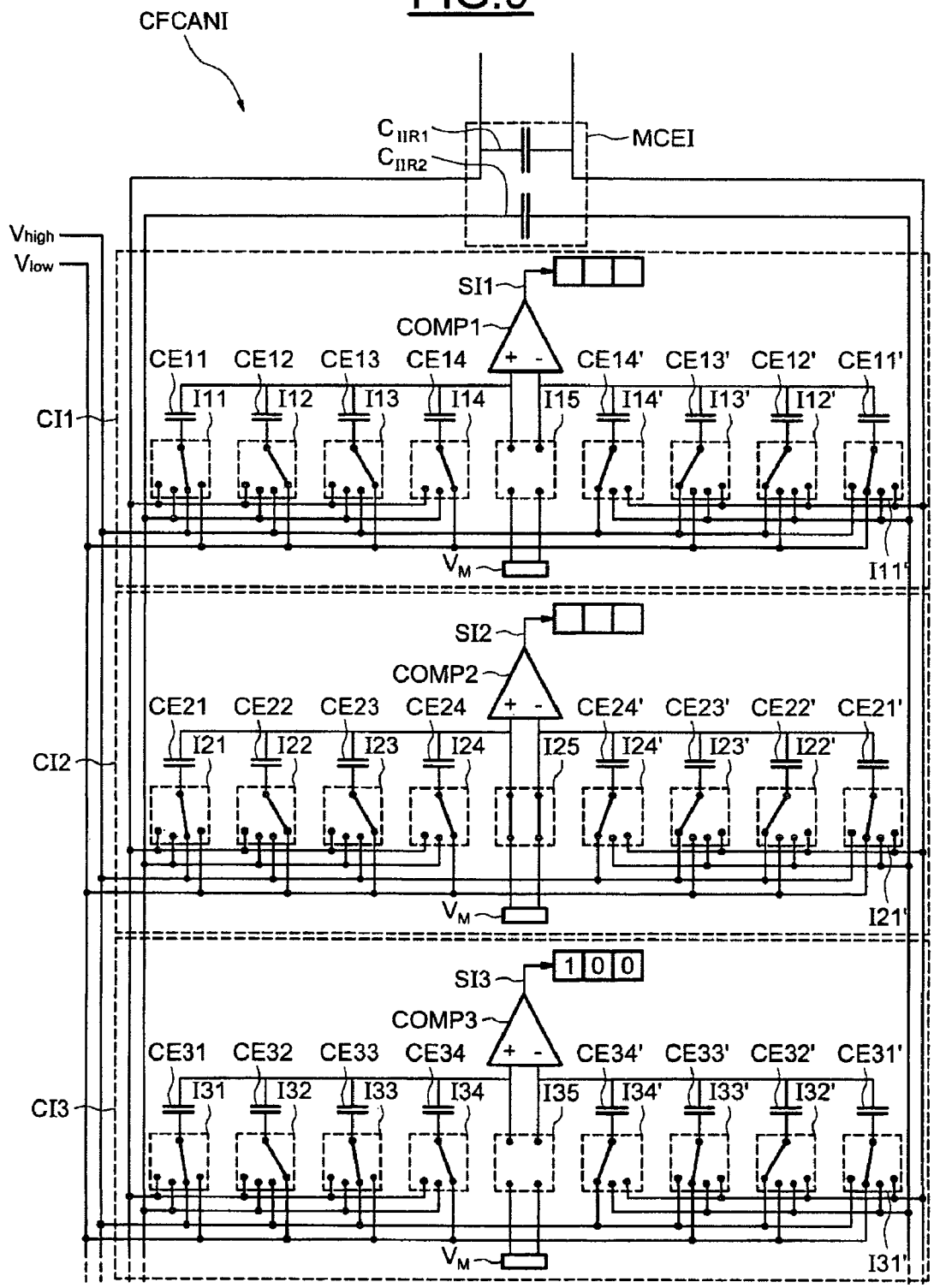

FIG. 9 shows a calibration state of the elementary circuit CI1. In this calibration state, the switches are in the same switching state as in the reference state except for the switch I15 which no longer connects each terminal of the comparator COMP1 to the ground voltage $V_M$. The reference state allows the offset of the comparator COMP1 to be determined by making it compare the mid-voltage of the first and of the second group of elementary capacitors which are identical and equal to $V_M$, because the elementary circuit CI1 was placed in the reference state just before. Thus, the sign of the output SI1 of the comparator COMP1 allows the sign of its offset to be known and thus to be corrected.

Over the same time period, the second elementary circuit CI1 is placed in its reference state, the third elementary circuit CI3 is placed in its third conversion state, the fourth elementary circuit is placed in its second conversion state, the fifth elementary circuit is placed in its first conversion state, the sixth elementary circuit is placed in its second filtering sub-state and the seventh elementary circuit is placed in its first filtering sub-state.

During the following step, the first elementary circuit CI is placed once more into the first filtering sub-state and so on. Thus, the circuit CFCANI has been able to process all the intermediate signal samples.

Figure 10:
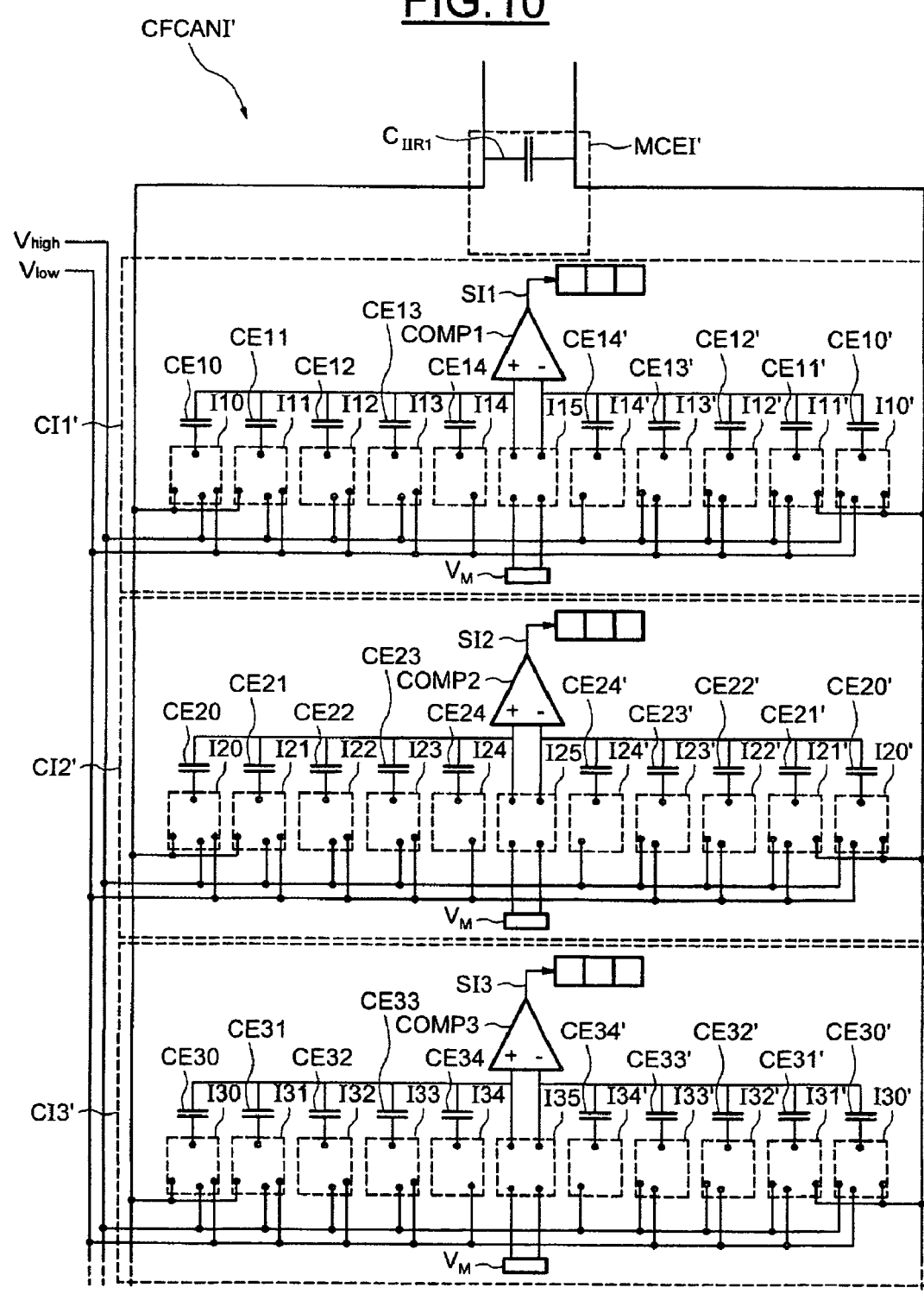
FIG. 10 is a schematic diagram illustrating a second embodiment of a filtering and analog/digital conversion circuit of the device of FIG. 1.

FIG. 10 shows a second preferred embodiment of the filtering and analog/digital conversion circuit CAFCANI' in which the elements common to the first embodiment bear the same references. In this embodiment, the input capacitive means MCEI' have only a single filtering capacitor $C_{IIR1}$. However, in a manner similar to the first embodiment, it is also possible to have capacitive means having two or more filtering capacitors.

In the present case, keeping N equal to 3, the circuit CAFCANI' comprises six elementary circuits, three of which have not been shown for the sake of simplification. The elementary circuits CI1', CI2' and CI3' additionally comprise, compared with the circuits CI1, CI2, CI3 of the first embodiment, an additional elementary capacitor and an additional switch in each group of elementary capacitors. Thus, the first group of elementary capacitors comprises an additional elementary capacitor CE10 of value C/2 and a first terminal of which is connected to the positive terminal of the comparator COMP1 and a second terminal of which is connected to the additional switch I10. The second group of elementary capacitors comprises an additional elementary capacitor CE10' of value C/2 and a first terminal of which is connected to the negative terminal of the comparator COMP1 and a second terminal of which is connected to the additional switch I10'. The switches I10 and I10' comprise three switching states, all like the switches I11 and I11' (one switching state has been removed compared with the first embodiment because of the elimination of one filtering capacitor).

Moreover, and unlike the first embodiment, in this second embodiment the switches I12, I13, I12', I13' may comprise only two switching states, and the switches I14 and I14' may connect, directly and respectively, the second terminals of the elementary capacitors CE14 and CE14' to the voltage $V_{high}$ and $V_{low}$ respectively. It is then possible to simplify the construction of the filtering and analog/digital conversion circuit, in particular when the number N (equal to 3 in the present description) becomes too high. This is because, thanks to the use of the additional elementary capacitors CE10, CE10', it is possible to reduce the number of switching states of the switches I12, I12', I13, I13', etc., and therefore to simplify the construction of the circuit.

Figure 11:
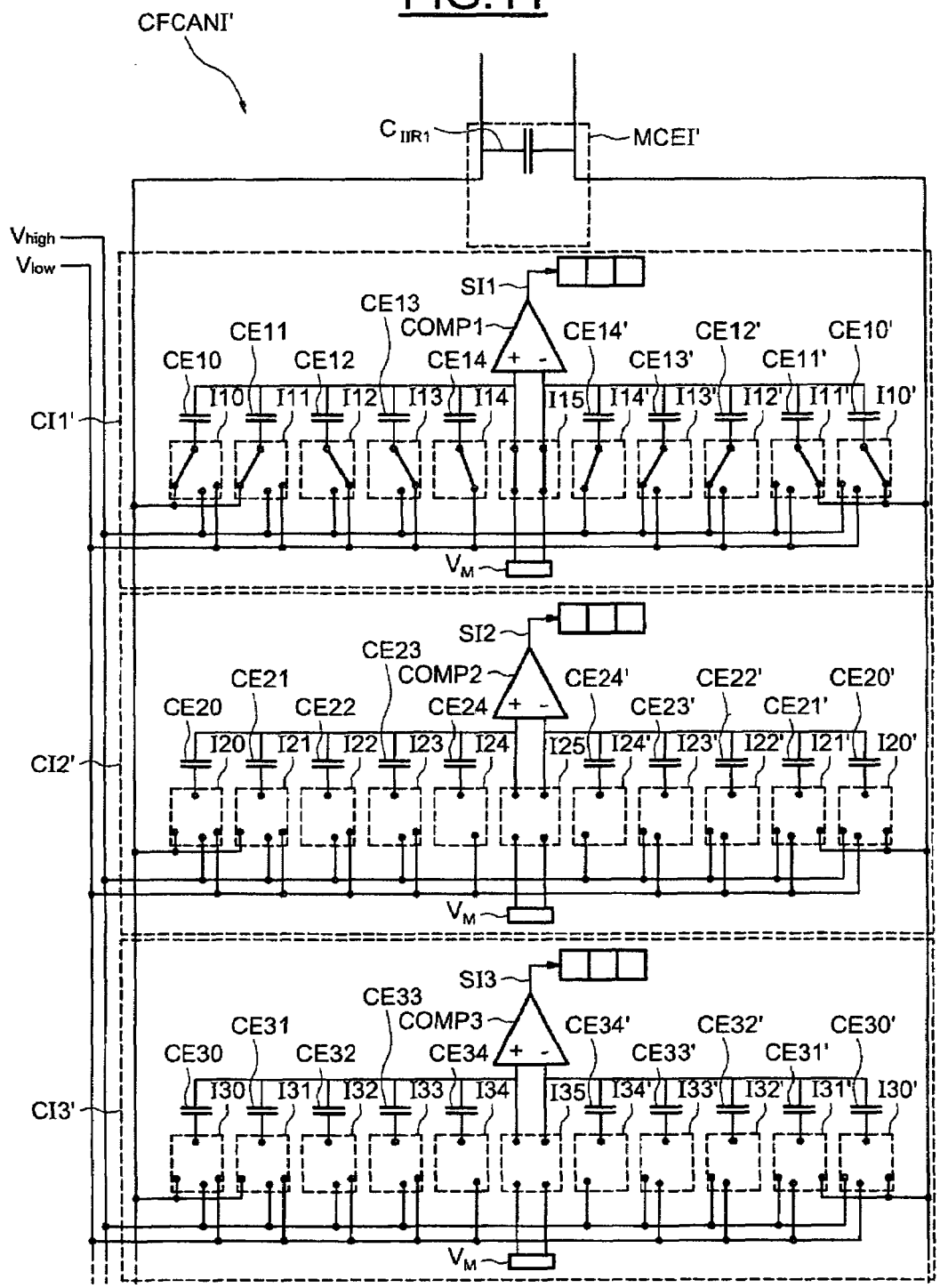
FIG. 11 is a schematic diagram illustrating a configuration state of the filtering and analog/digital conversion circuit of FIG. 10.

FIG. 11 shows the first configuration state of the first elementary circuit CI1', which marks the start of a cycle for filtering and converting a sample of the intermediate signal. In this first configuration state, the switches I10, I11, I10', I11' are configured in a first switching state in which they connect the second terminal of each elementary capacitor CE10, CE11, CE10', CE11' to the differential current input of the circuit CFCANI' and to the filtering capacitor $C_{IIR1}$ connected to the current input. The switches I12, I13, I14 and the switches I12', I13', I14' respectively connect the second terminal of their associated elementary capacitor to $V_{low}$ and $V_{high}$ respectively. In addition, the switch I15 connects the two terminals of the comparator COMP1 to the ground voltage $V_M$. The elementary circuit CI1 is then placed in its first filtering sub-state.

For the following configuration states of the circuit CAFCANI' (analog/digital conversion, reference state, calibration), the switches I10 and I10' connect the second terminal of the additional elementary capacitors CE10 and CE10' to the voltage $V_{low}$ and $V_{high}$ respectively, whereas the switching states of the other switches are identical to those of the first embodiment CAFCANI. The second embodiment therefore makes it possible to carry out the same filtering and analog/digital conversion steps as the first embodiment, but with a simplified circuit.

The second preferred embodiment of the filtering and analog/digital conversion circuit CAFCANI' also makes it possible to determine, and possibly to modify, the cutoff frequency of the filtering carried out by the filtering capacitor $C_{IIR1}$.

This is because by introducing a signal of known frequency and amplitude into the circuit CAFCANI', it is possible to deduce therefrom the transfer function $G_1$ of the low-pass filtering at the frequency of the signal. In particular, in the case of the second embodiment, it is possible to introduce such a signal only by modifying the switching states of the switches during the reference state, without introducing an intermediate signal at the current input. An example of a method of determining the transfer function $G_1$ of the low-pass filtering at a given frequency is described below.

Figure 12:
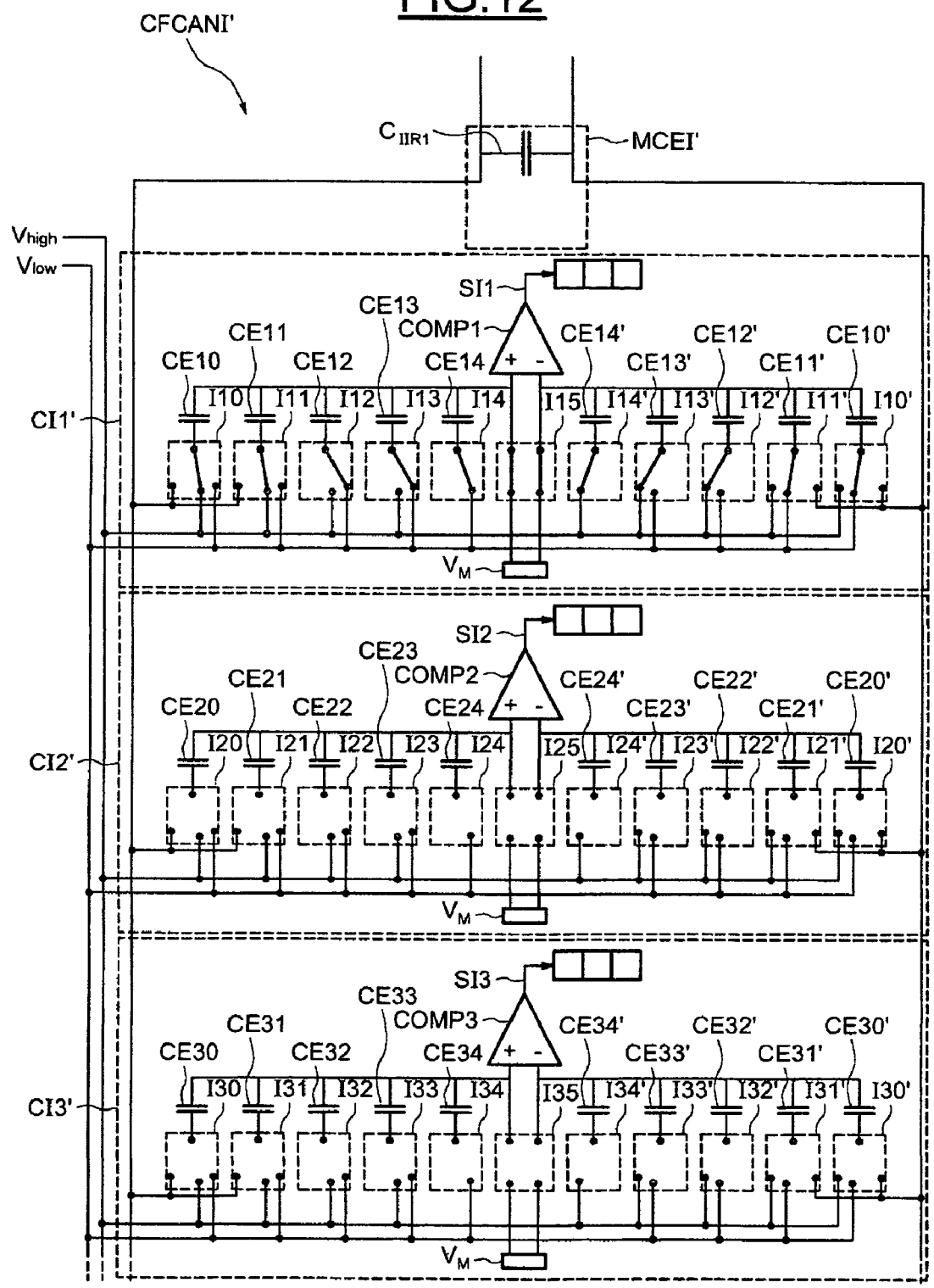
FIGS. 12 to 14 are schematic diagrams illustrating various configuration states of the filtering and analog/digital conversion circuit of FIG. 10, e.g. to determine the transfer function of the filtering at a given frequency.

FIG. 12 shows the first configuration state of the circuit CAFCANI' during the method of determining the transfer function $G_1$ of the low-pass filtering at a given frequency. In this first state, the first elementary circuit CI1' is placed in a reference state different from that of the conventional operation described previously. This is because all the switches of the first elementary circuit CI1' are in the switching state corresponding to the reference state, with the exception of the switches I10 and I10' which are connected respectively to $V_{high}$ and $V_{low}$, instead of $V_{low}$ and $V_{high}$. This difference makes it possible to introduce a precharging voltage for the first elementary circuit CI1', which is then equal to $V_{high}$ instead of $(V_{high}+V_{low})/2$ in conventional operation.

Figure 13:
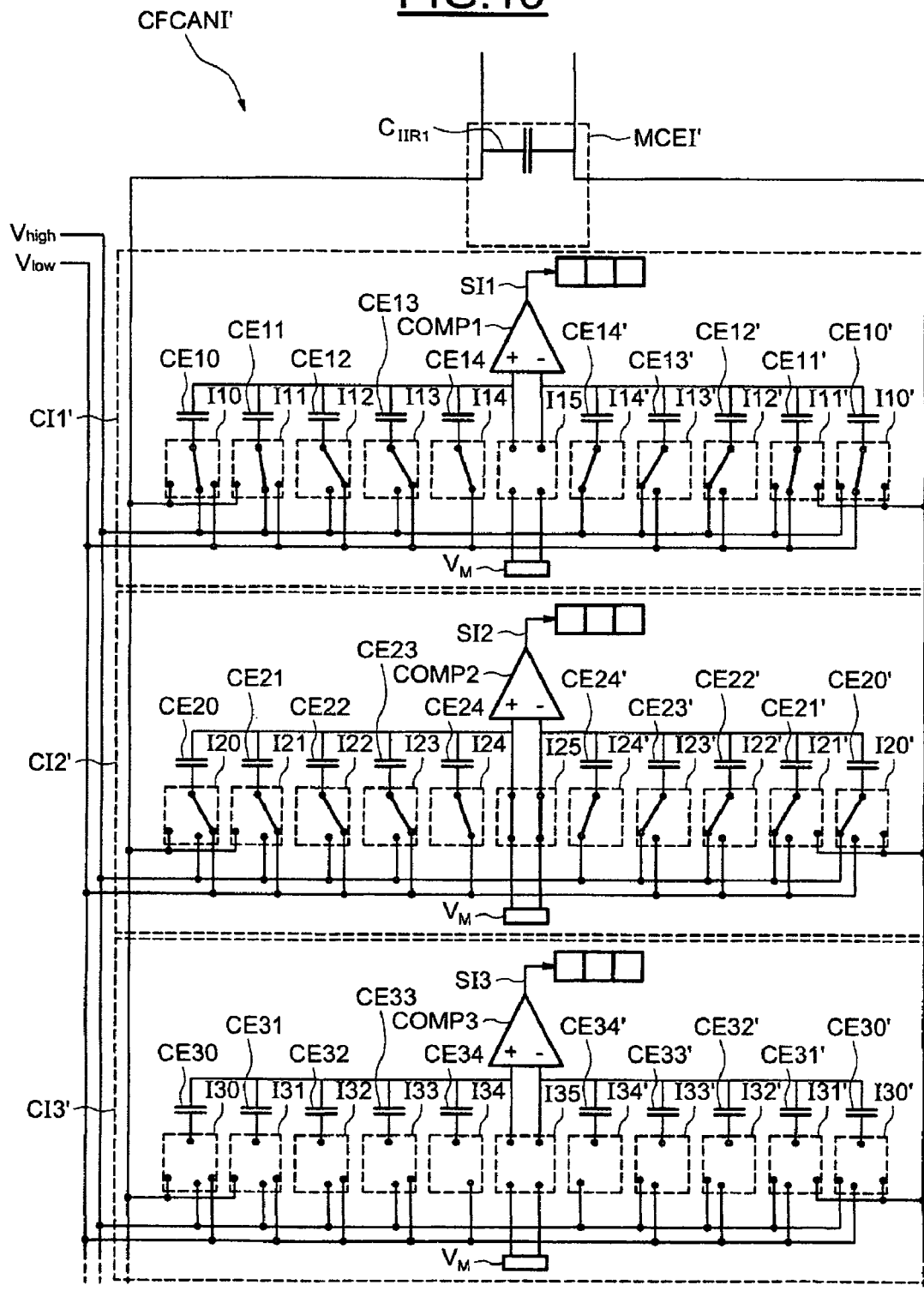

FIG. 13 shows the second step of the method of determining the transfer function $G_1$ of the low-pass filtering at a given frequency. In this second step, the first elementary circuit CI1' is placed in a calibration state similar to that of the conventional operation, except that the precharging voltage is equal to $V_{high}$. The second elementary circuit CI2' itself is placed in another reference state. This is because all the switches of the second elementary circuit CI2' are in the reference state, with the exception of the switches I21 and I21' which are connected respectively to $V_{low}$ and $V_{high}$, instead of $V_{high}$ and $V_{low}$. This difference makes it possible to introduce, into the second elementary circuit CI2', a precharging voltage which is then equal to $V_{low}$ instead of $(V_{high}+V_{low})/2$.

Figure 14:
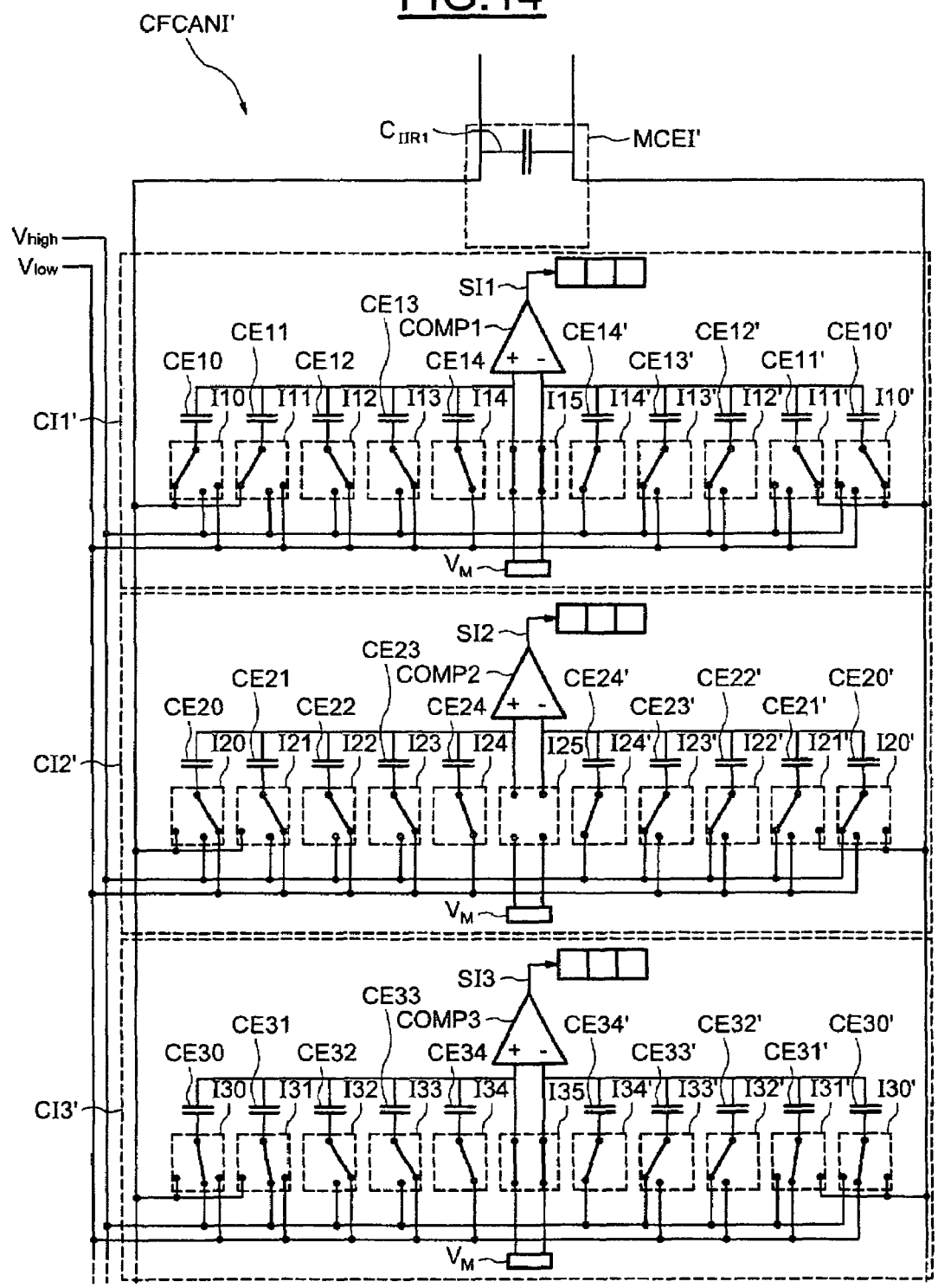

FIG. 14 shows the third step of the method: the first elementary circuit CI1' is placed in the filtering state of the conventional operation; the second elementary circuit CI2' is placed in the calibration state of the conventional operation; and the third elementary circuit CI3' is placed in the same reference state as the first elementary circuit CI1', that is to say the switches I30 and I30' are connected to $V_{high}$ and $V_{low}$ respectively.

The following configuration states are identical to those of the conventional operating mode, except that the odd elementary circuits are placed in a reference state and in a calibration state in which they have a precharging voltage equal to $V_{high}$ instead of $(V_{high}+V_{low})/2$ and except that the even elementary circuits are placed in a reference state and in a calibration state in which they have a precharging voltage equal to $V_{low}$ instead of $(V_{high}+V_{low})/2$. Thus, thanks to this method, it is possible to introduce into the circuit CAFCANI' a rectangular analog signal of frequency $F_s/2$ and amplitude $(V_{high}-V_{low})$.

Since there is no intermediate input signal for the circuit and since the filtering capacitor $C_{IIR1}$ is connected in succession to elementary circuits having different precharging voltages (namely $V_{high}$ for the odd elementary circuits and $V_{low}$ for the even elementary circuits), the filtering capacitor $C_{IIR1}$ will oscillate, in the steady state, between the two precharging voltages and will reduce the amplitude of the signal. The capacitor $C_{IIR1}$ will therefore filter the value $V_{high}$ (and $V_{low}$ respectively) introduced during the reference steps of the odd (and even respectively) elementary circuits.

The following analog/digital conversion steps make it possible to obtain, as output of the odd elementary circuits, three-bit samples corresponding to the filtered value of the voltage $V_{high}$, whereas at the output of the even elementary circuits, 3-bit samples corresponding to the filtered value of the voltage $V_{low}$ are obtained. In addition, since the number of elementary circuits is even, there is again the difference in precharging voltage between the last elementary circuit CI6' and the first elementary circuit CI1'.

The output signal of the circuit CAFCANI' therefore has a frequency equal to $F_S/2$ and an amplitude equal to:

$$G_1(F_S/2)(V_{high}-V_{low}) = \frac{C}{(C+2C_{IIR1})}(V_{high}-V_{low}).$$

Knowing $V_{high}$ and $V_{low}$, it is therefore possible to deduce therefrom the ratio of C to $(C+2C_{IIR1})$. In particular, to obtain the desired transfer function for the filtering capacitor $C_{IIR1}$, i.e. the desired ratio of C to $(C+2C_{IIR1})$, it is possible to produce the filtering capacitor $C_{IIR1}$ by combining in parallel, via switched switches, several capacitors $C_{IIR1i}$. Thus, by changing the switching state of a suitable number of the switched switches, it is possible to obtain a value $\Sigma C_{IIR1i}$ allowing the desired $C/(C+2C_{IIR1})$ ratio to be obtained.

Similarly, it is also possible to introduce a signal of frequency $F_S/4$ to determine the transfer function $G_1$ of the low-pass filtering at $F_S/4$. In the case of a circuit converting the signal into 5-bit samples (i.e. comprising 8 elementary circuits), the elementary circuits CI1, CI2', CI'5 and CI'6 may have a precharging voltage equal to $V_{high}$, whereas the other elementary circuits will have a precharging voltage equal to $V_{low}$.

According to a variant, it is also possible to use $(V_{high}+V_{low})/2$ as precharging voltage, instead of $V_{low}$. In this case, half of the elementary circuits are placed in the same reference state as that of the conventional operation, but the amplitude of the output signal is reduced. This reduces the precision in the value of the low-pass filtering transfer function $G_1$ thus determined.

Reference is now more particularly made to FIGS. 15 to 28 in order to illustrate another embodiment which allows, in combination with that illustrated in FIGS. 1 to 9 or that illustrated in FIGS. 10 to 14, the performance of the receiver chain to be further improved, in particular as regards the frequency-transposition means MTRI, MTRQ.

Figure 15:
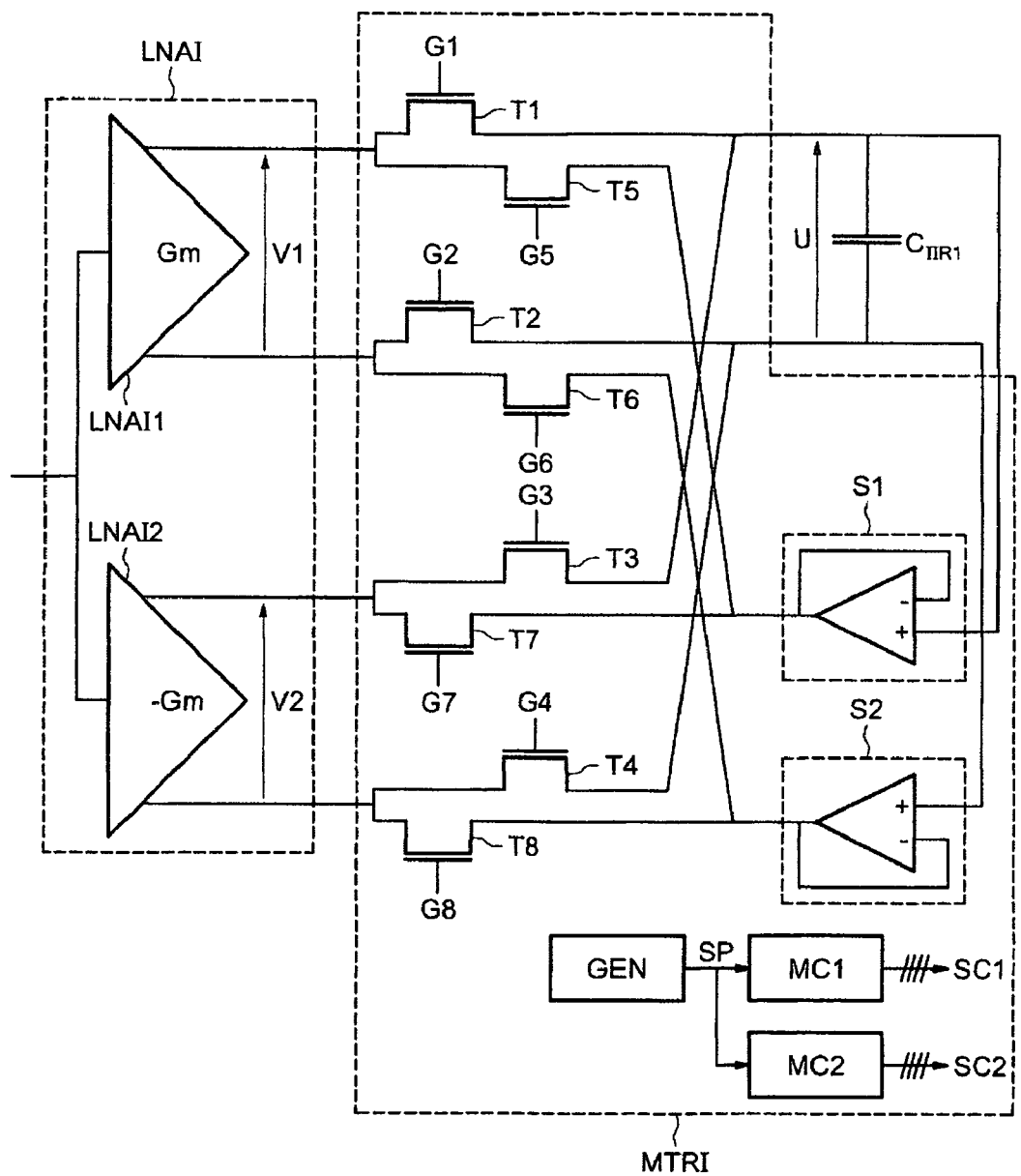
FIG. 15 is a schematic diagram illustrating a first embodiment of the frequency-transposition stage of the device of FIG. 1.

FIG. 15 thus shows a first embodiment of the frequency-transposition stage MTRI using a differential architecture. It goes without saying that this first embodiment is not limited to a differential architecture, and those skilled in the art will readily be able to adapt the description that follows to a non-differential architecture.

In this first embodiment, the amplifier stage LNAI comprises two output transconductor stages LNAI1 and LNAI2 with differential architecture. The transconductor stage LNAI1 exhibits for example a transconductance equal to Gm, and the stage LNAI2 exhibits for example a transconductance equal to −Gm. Two current signals of opposing sign are thus respectively obtained at the two differential current outputs. The current signals of opposing sign are then firstly transmitted to the frequency-transposition stage MTRI, then to the filtering capacitor $C_{IIR1}$.

The transposition stage MTRI comprises a signal generator GEN and control means MC1. The generator GEN delivers a periodic signal SP (FIG. 18) to the control means MC1 which deliver, starting from the periodic signal SP, a control signal SC1.

The control signal SC1 allows a configurable set of switches to be controlled. The set of switches connects, on the one hand, the differential output of the amplifier LNAI1 to the two terminals of the filtering capacitor $C_{IIR1}$ via two transistors T1, T2 and, on the other, the differential output of the amplifier LNAI2 to the two terminals of the filtering capacitor $C_{IIR1}$ via two transistors T3, T4. The transistors T1, T2, T3, T4, for example MOS transistors, are used as switches and are respectively controlled by their gate voltages G1, G2, G3, G4.

The control signal SC1 is generated from the periodic signal SP in such a manner as to alternately connect, at the rhythm of the half-periods of the signal SP, the output of the amplifier LNAI1 and the output of the amplifier LNAI2 to the filtering capacitor $C_{IIR1}$. The signal SC1 here denotes globally, for the sake of simplicity, the control signal of the transistors T1 to T4, it of course being made clear that this signal SC1 is in fact composed of four elementary signals respectively controlling the gates of the transistors. The means MC1 are for example formed from logic gates.

The generator GEN also delivers the periodic signal SP to additional control means MC2 which deliver, starting from this periodic signal SP, an additional control signal SC2. The means MC2 are also formed from logic gates.

The additional control signal SC2 allows an additional set of switches to be controlled. The additional set of switches connects the two terminals of the capacitor $C_{IIR1}$ to the differential output of the amplifier LNAI1 via two transistors T5, T6 and a follower amplifier unit with differential architecture comprising two amplifiers in follower configuration S1, S2. The additional set of switches also connects the two terminals of the filtering capacitor $C_{IIR1}$ to the differential output of the amplifier LNAI2 via two transistors T7, T8 and the two amplifiers S1, S2. The transistors T5, T6, T7, T8 are used as switches and are respectively controlled by their gate voltages G5, G6, G7, C8 using four logic signals globally forming the control signal SC2.

The amplifier unit S1, S2 is configured in follower mode and is therefore capable of imposing its input potential onto its output. The control signal SC2, which controls the gates G5, G6, G7, G8, therefore allows the voltage U of the capacitor $C_{IIR1}$ to be imposed onto the output of the amplifier LNAI1 or of the amplifier LNAI2, in other words the value of the voltage U to be imposed as value of the voltage V1 or V2.

Figure 16:
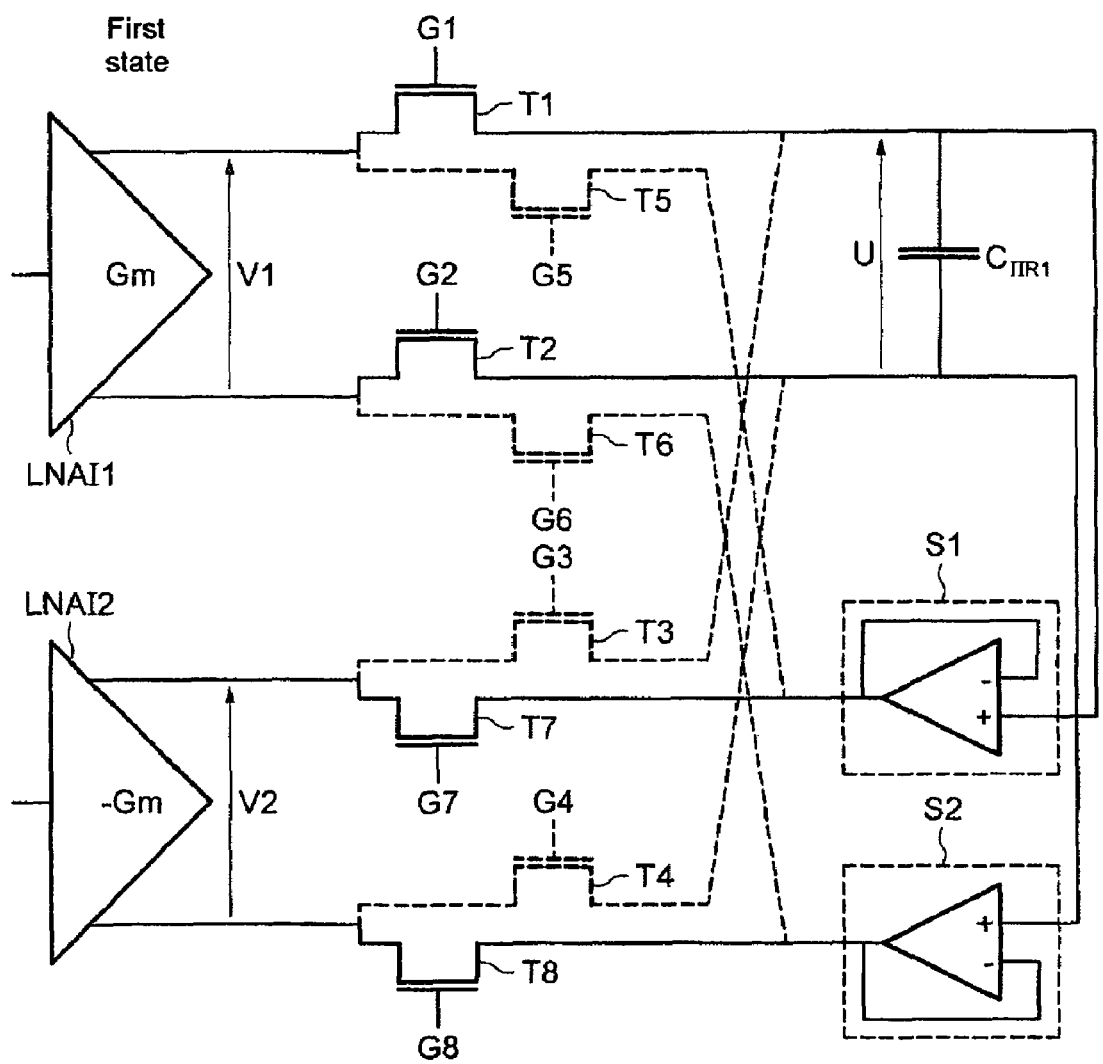
FIG. 16 is a schematic diagram illustrating the first configuration state of the transposition stage of FIG. 15.

FIG. 16 shows the first configuration state of the transposition stage MTRI. In this first state, the control means MC1 turn off the transistors T3 and T4 via the gate voltages G3, G4, whereas the transistors T1 and T2 are made to conduct. Thus, in the first state, the capacitor $C_{IIR1}$ is connected to the differential output of the amplifier LNAI1 which delivers a current proportional to the incident signal, and the voltage U of the capacitor $C_{IIR1}$ is equal to the voltage V1.

In addition, still for the first state, the additional control means MC2 turn off the transistors T5 and T6, whereas the transistors T7 and T8 are made to conduct. Thus, the amplifiers in follower configuration S1, S2 can impose the value of the voltage U as value of the voltage V2 of the differential output of the amplifier LNAI2.

Figure 17:
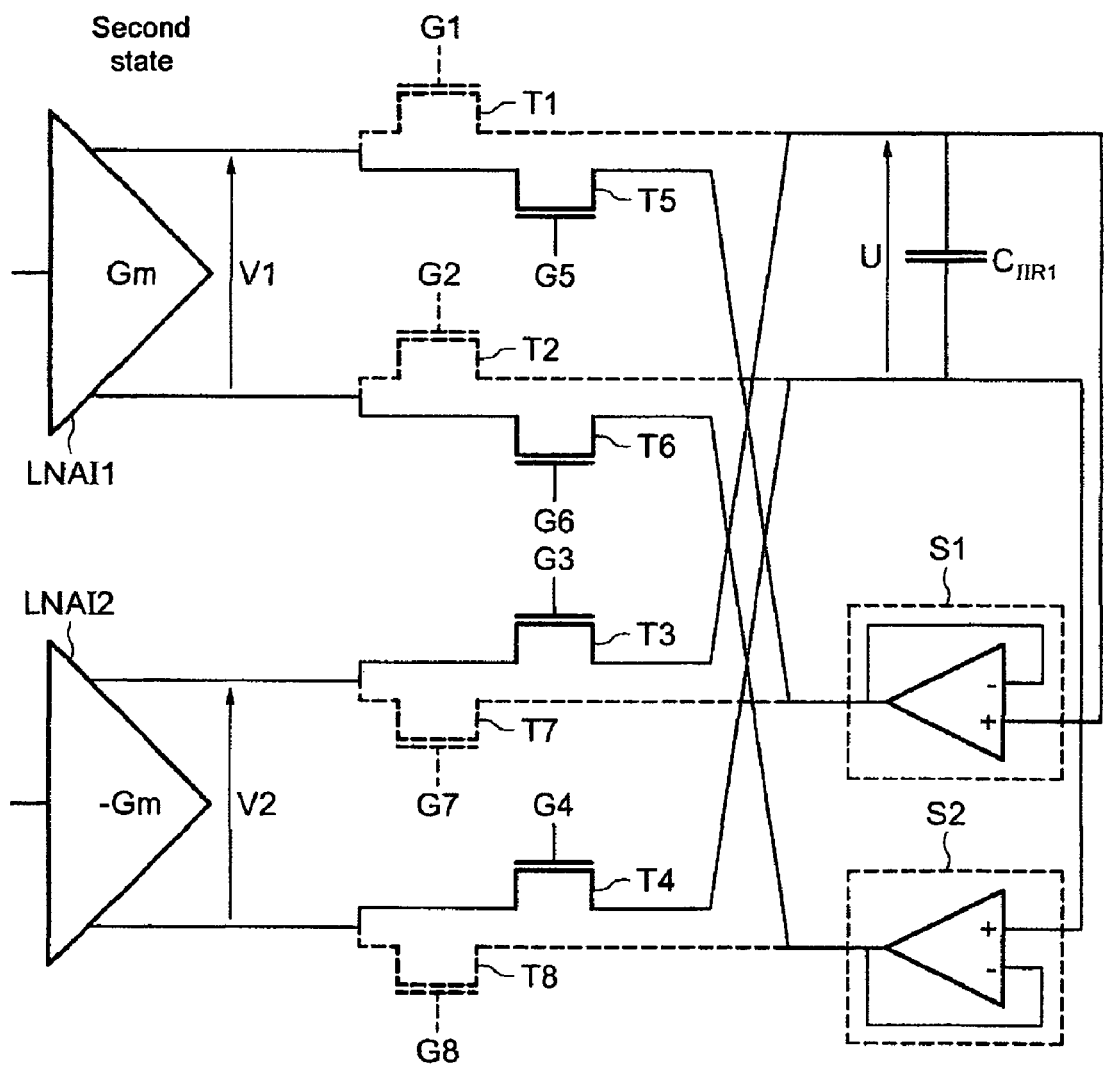
FIG. 17 is a schematic diagram illustrating the second configuration state of the transposition stage of FIG. 15.

FIG. 17 shows the second configuration state of the transposition stage MTRI. In this second state, the control means MC1 turn off the transistors T1 and T2 via the gate voltages G1, G2, whereas the transistors T3 and T4 are made to conduct. Thus, in the second state, the capacitor $C_{IIR1}$ is connected to the differential output of the amplifier LNAI2 which delivers a current proportional to the incident signal and of opposing sign, and the voltage U of the capacitor $C_{IIR1}$ is equal to the voltage V2.

In addition, still for the second state, the additional control means MC2 turn off the transistors T7 and T8, whereas the transistors T5 and T6 are made to conduct. Thus, the amplifiers in follower configuration S1, S2 can impose the value of the voltage U as value of the voltage V1 of the differential output of the amplifier LNAI1.

Figure 18:
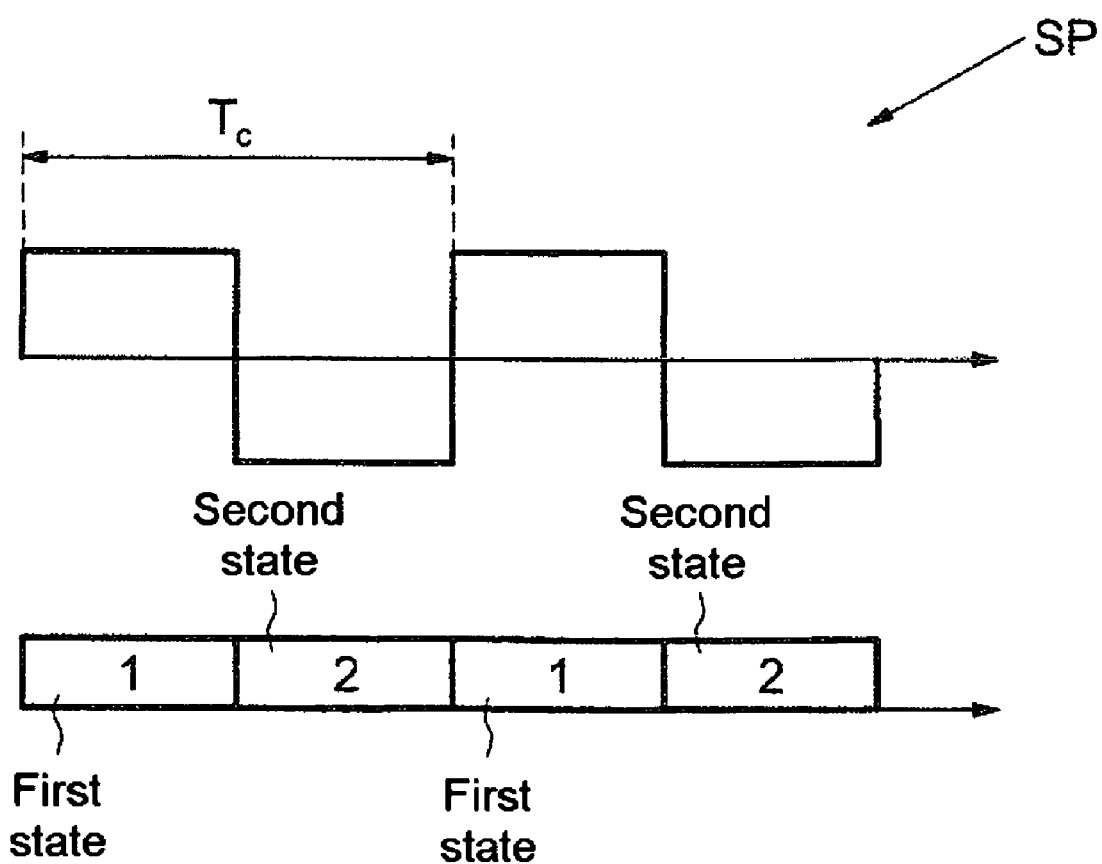
FIG. 18 is a timing diagram illustrating an example of periodic signal delivered by the generator of the transposition stage of FIG. 15.

FIG. 18 shows an example of periodic signal SP delivered by the generator GEN to the control means MC1 and to the additional control means MC2. The periodic signal SP has a period $T_C$ which corresponds to the transposition frequency, in this case the central frequency of the channel to be processed. During the first half-period of the periodic signal SP, the control means MC1 and the additional control means MC2 will configure the transposition stage MTRI in the first state, whereas during the second half-period of the periodic signal SP, the control means MC1 and the additional control means MC2 will configure the transposition stage MTRI in the second state.

Thus, the capacitor $C_{IIR1}$ receives a current signal whose sign is reversed every half-period of the periodic signal. The signal across the terminals of the capacitor $C_{IIR1}$, which is the intermediate signal, is therefore a signal transposed in frequency. In addition, in order to avoid stray currents at each change of state of the frequency transposition stage MTRI, the value of the voltage U of the capacitor $C_{IIR1}$ is imposed as value of the voltage of the differential output of the amplifier LNAI1 or LNAI2 which is not connected to the capacitor $C_{IIR1}$.

Figure 19:
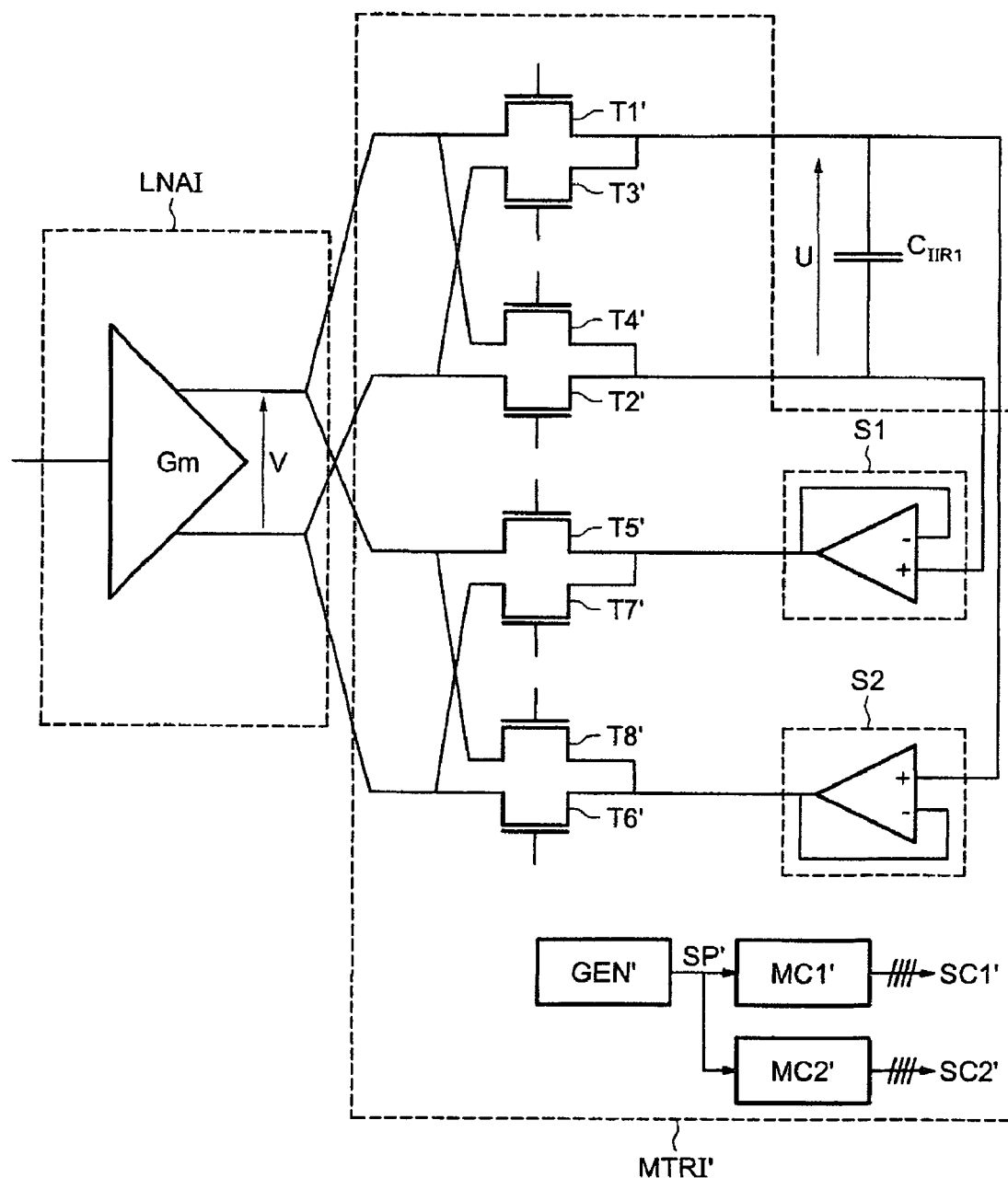
FIG. 19 is a schematic diagram illustrating a second embodiment of the frequency transposition stage of the device of FIG. 1.

FIG. 19 shows a second embodiment of the frequency transposition stage MTRI', using differential architecture. It goes without saying that this second embodiment is not limited to a differential architecture, and those skilled in the art will readily be able to adapt the description that follows to a non-differential architecture. In this second embodiment, the amplifier stage LNAI comprises a single transconductor stage having for example a transconductance equal to Gm and, consequently, a single differential current output. The current signal is firstly transmitted to the frequency-transposition stage MTRI', then to the filtering capacitor $C_{IIR1}$.

The transposition stage MTRI' comprises a signal generator GEN' and control means MC1'. The generator GEN' delivers a periodic signal SP' (FIG. 24) to the control means MC1' which deliver, starting from said periodic signal SP', a control signal SC1'. The control signal SC1' allows a configurable set of switches to be controlled. The set of switches connects the differential output of the amplifier LNAI to the two terminals of the output capacitor $C_{IIR1}$, either directly via two transistors T1', T2', or in a reversed manner via two transistors T3' and T4'. The transistors T1', T2', T3', T4' are used as switches and are controlled by their gate voltages, using four logic signals globally forming the signal SC1'.

The generator GEN' also delivers the periodic signal SP' to additional control means MC2' which deliver, starting from the periodic signal SP', an additional control signal SC2'. The additional control signal SC2' allows an additional set of switches to be controlled. The additional to the differential output of the amplifier LNAI via transistors T5', T6', T7', T8', and two amplifiers in follower configuration S1, S2. The transistors T5', T6', T7', T8' are used as switches and are controlled by their gate voltage using four logic signals globally forming the control signal SC2'.

In the present case, the differential follower amplifier unit S1, S2 allows the voltage U of the capacitor $C_{IIR1}$, or its inverse, to be imposed on the output of the amplifier LNAI, in other words the value of the voltage U, or its inverse (–U), to be imposed as value of the voltage V.

Figure 20:
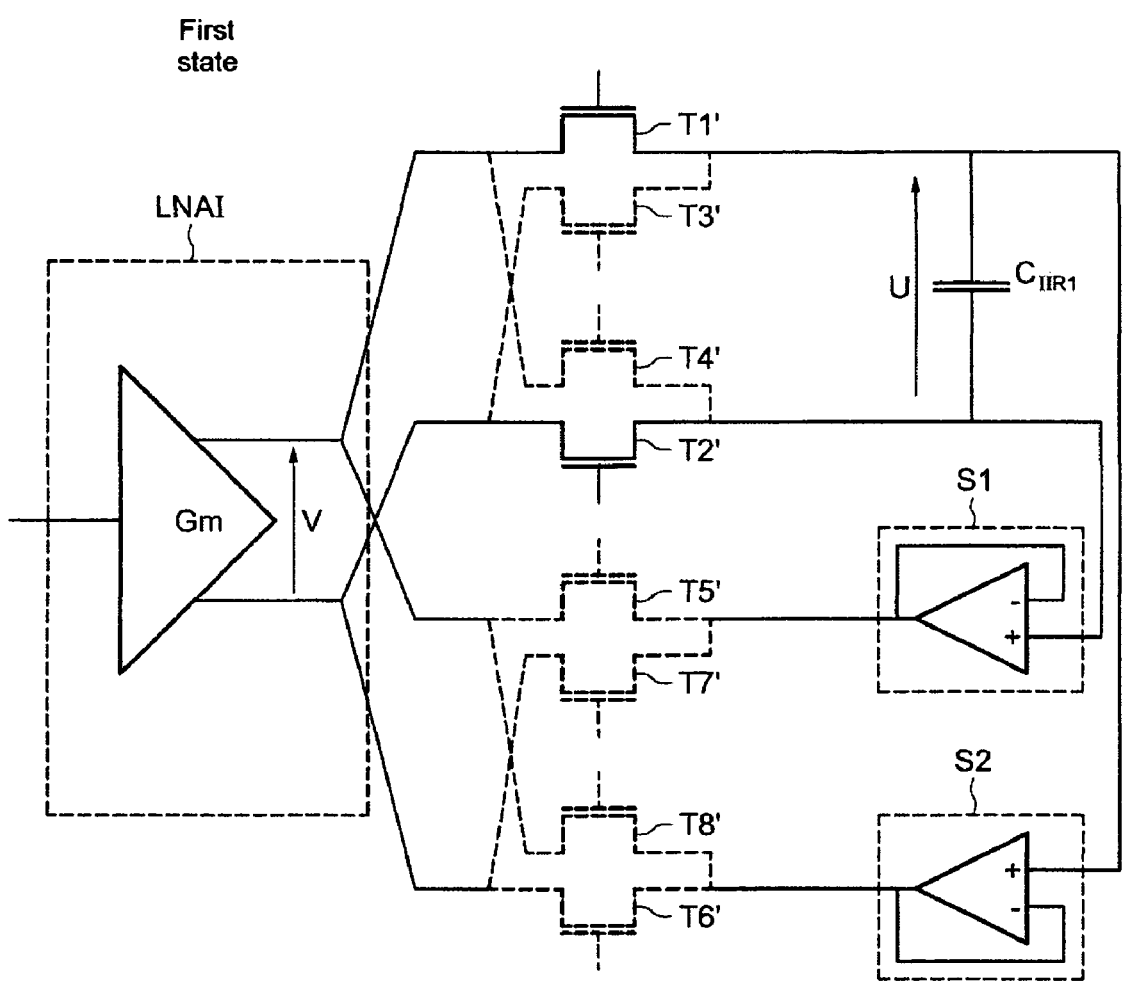
FIG. 20 is a schematic diagram illustrating a first configuration state of the transposition stage of FIG. 19.

FIG. 20 shows the first configuration state of the transposition stage MTRI'. In this first state, the control means MC1' turn off the transistors T3' and T4', whereas the transistors T1' and T2' are made to conduct. Thus, in the first state, the capacitor $C_{IIR1}$ is connected directly to the differential output of the amplifier LNAI and receives a current proportional to the incident signal. The value of the voltage V of the differential output of the amplifier LNAI is the same as the value of the voltage U of the capacitor $C_{IIR1}$.

Furthermore, still for the first state, the additional control means MC2' turn off the transistors T5', T6', T7', T8'.

Figure 21:
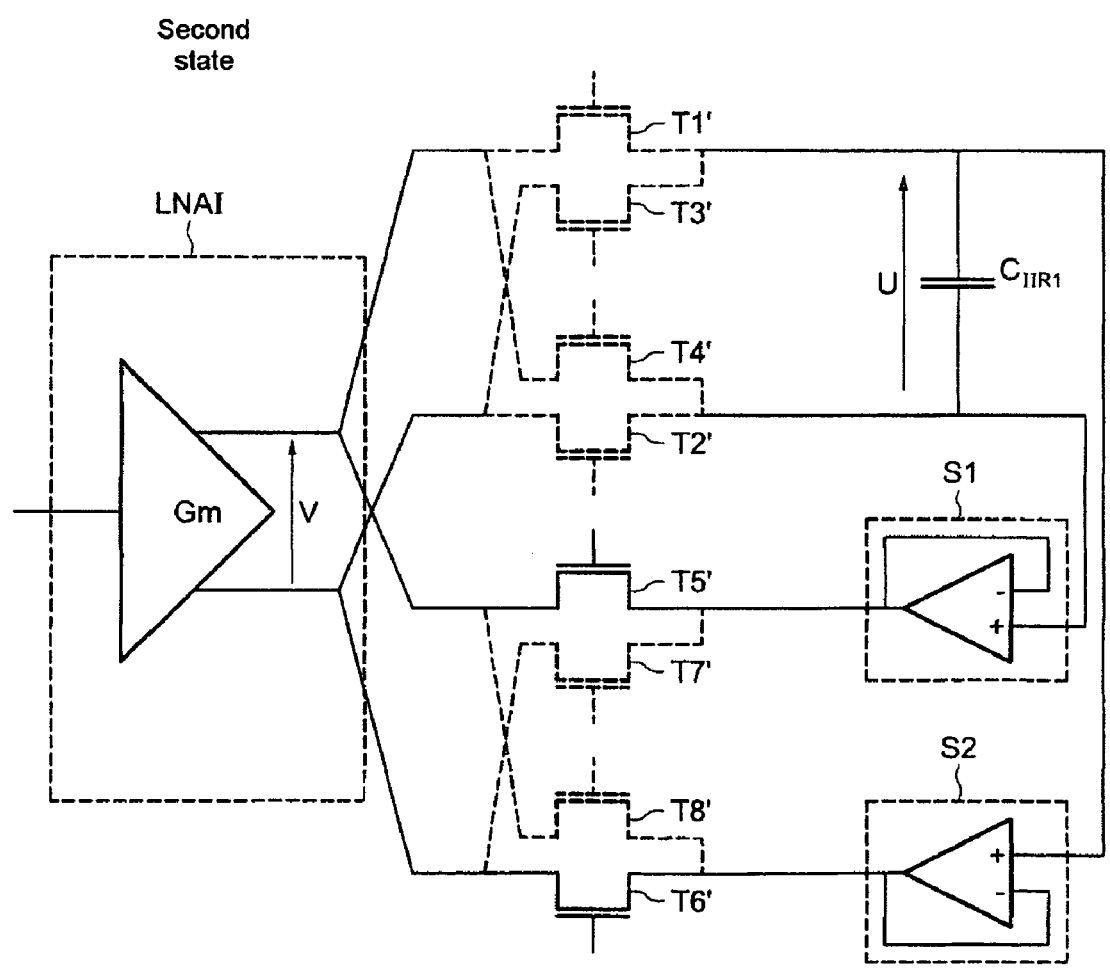
FIG. 21 is a schematic diagram illustrating a second configuration state of the transposition stage of FIG. 19.

FIG. 21 shows the second configuration state of the transposition stage MTRI'. In this second state, the control means MC1' turn off the transistors T1', T2', T3', T4' so that the capacitor $C_{IIR1}$ is not electrically connected to the differential output of the amplifier LNAI. On the other hand, the additional control means MC2' make the transistors T5' and T6' conduct, whereas the transistors T7' and T8' are turned off. Thus, the amplifiers in follower configuration S1, S2 can impose the inverse of the value of the voltage U, as value of the voltage V of the differential output of the amplifier LNAI, before the inversion of the connections between the amplifier LNAI and the capacitor $C_{IIR1}$.

Figure 22:
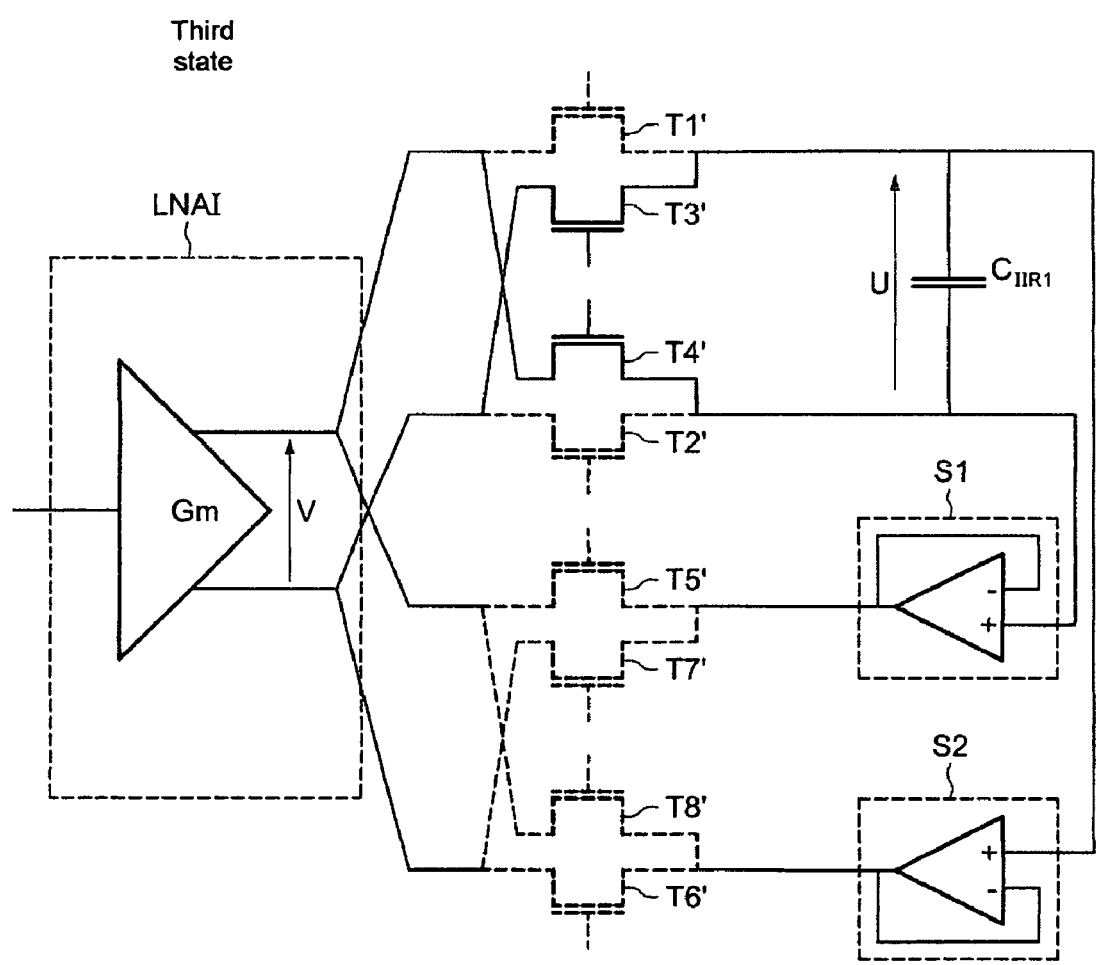
FIG. 22 is a schematic diagram illustrating a third configuration state of the transposition stage of FIG. 19.

FIG. 22 shows the third configuration state of the transposition stage MTRI'. In this third state, the control means MC1' turn off the transistors T1' and T2', whereas the transistors T3' and T4' are made to conduct. Thus, in the third state, the capacitor $C_{IIR1}$ is connected in a reverse manner to the differential output of the amplifier LNAI and receives a current proportional to the incident signal but of opposing sign. The value of the output voltage V of the amplifier LNAI is equal, but of opposing sign, to the voltage U of the capacitor $C_{IIR1}$. In addition, for the third state as for the first state, the additional control means MC2' turn off the transistors T5', T6', T7', T8'.

Figure 23:
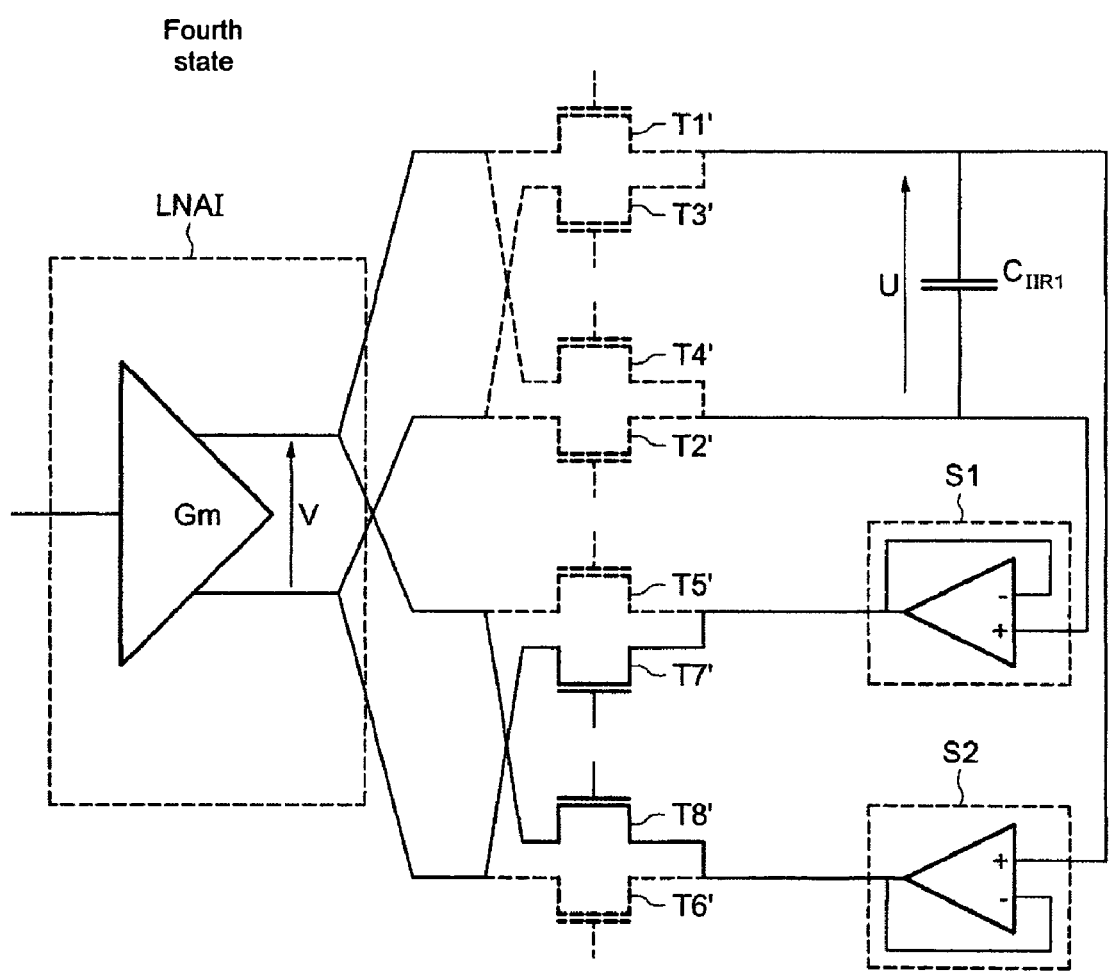
FIG. 23 is a schematic diagram illustrating a fourth configuration state of the transposition stage of FIG. 19.

FIG. 23 shows the fourth configuration state of the transposition stage MTRI'. In this fourth state, the control means MC1' turn off the transistors T1', T2', T3', T4' so that the capacitor $C_{IIR1}$ is not connected to the differential output of the amplifier LNAI. On the other hand, the additional control means MC2' make the transistors T7' and T8' conduct, whereas the transistors T5' and T6' are turned off. Thus, the amplifiers in follower configuration S1, S2 can impose the value of the voltage U, as value of the voltage V of the differential output of the amplifier LNAI, before the inversion of the connections between the amplifier LNAI and the capacitor $C_{IIR1}$.

Figure 24:
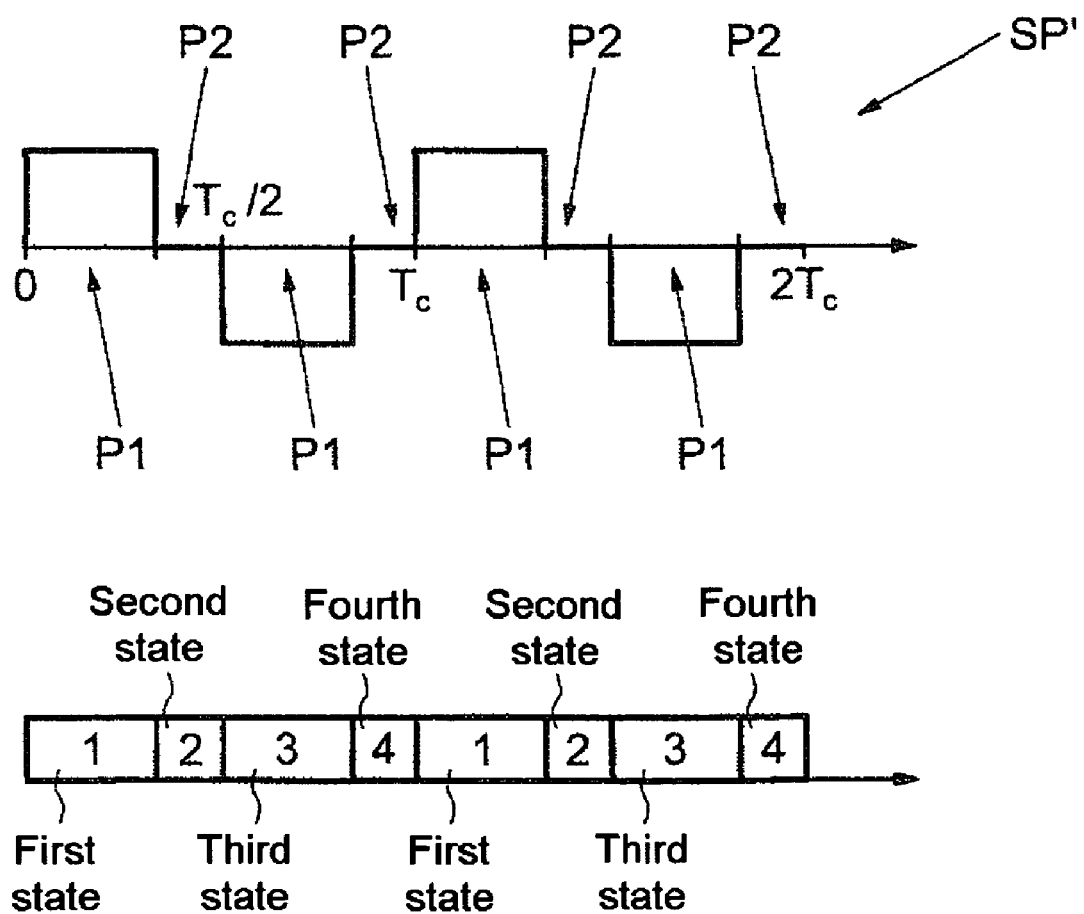
FIG. 24 is a timing diagram illustrating an example of periodic signal delivered by the generator of the transposition stage of FIG. 19.

FIG. 24 shows an example of periodic signal SP' delivered by the generator GEN' to the control means MC1' and to the additional control means MC2'. The periodic signal SP' has a period $T_c$ which corresponds to the transposition frequency, in this case the central frequency of the channel to be processed.

During the first half-period of the periodic signal SP', the control means MC1' and the additional control means MC2' will configure the transposition stage MTRI' in the first state and the second state, whereas during the second half-period of the periodic signal SP', the control means MC1' and the additional control means MC2' will configure the transposition stage MTRI' in the third state and the fourth state.

During a first part P1 of the first half-period, using the control means MC1' and the additional control means MC2', the signal SP' configures the transposition stage in the first state. During this first state, the amplifier stage LNAI delivers to the capacitor $C_{IIR1}$ a current signal proportional, and non-inverted, to the incident signal. The output voltage V of the amplifier LNAI has the same value as the voltage U of the capacitor $C_{IIR}$.

Then, during the second part P2 of the first half-period, the periodic signal SP' configures the transposition stage in the second state until the end of the first half-period. In the second state, the differential output of the amplifier stage LNAI is no longer connected to the capacitor $C_{IIR1}$, but the inverse value of the voltage U of said capacitor $C_{IIR1}$ is imposed as value of the voltage V of the differential output of the amplifier LNAI. The value of the voltage V is therefore equal to (−U).

During a first part P1 of the second half-period of the periodic signal SP', the transposition stage is configured in the third state in which the differential outputs of the amplifier stage LNAI are connected to the capacitor $C_{IIR1}$ in a reversed manner. At the start of the second half-period, the voltage U of the capacitor is therefore equal to the inverse (−V) of the differential output voltage of the amplifier LNAI seen from said capacitor. During this third state, the amplifier stage LNAI delivers to the capacitor $C_{IIR1}$ a current signal proportional and inverse to the incident signal. The output voltage V of the amplifier LNAI has the same value as the inverse (−U) of the voltage of the capacitor $C_{IIR1}$.

Then, during the second part P2 of the second half-period, the periodic signal SP' configures the transposition stage in the fourth state until the end of the second half-period. In the fourth state, the differential output of the amplifier stage LNAI is no longer connected to the capacitor $C_{IIR1}$, but the value of the voltage U of said capacitor $C_{IIR1}$ is imposed as value of the voltage V of the differential output of the amplifier LNAI. The value of the voltage V is therefore equal to the voltage U of the capacitor $C_{IIR1}$.

Thus, the capacitor $C_{IIR1}$ receives, during a part P1 of each half-period, a current signal whose sign is reversed every half-period of the periodic signal. The signal across the terminals of the capacitor $C_{IIR1}$ is therefore a signal transposed in frequency which forms the intermediate signal. In addition, in order to avoid stray currents at each half-period of the periodic signal SP', the value of the voltage U, or its inverse (−U), is imposed as value of the voltage V of the differential output of the amplifier LNAI during a part P2 of the second part of each half-period.

Finally, the first part P1 of the first half-period and the first part P1 of the second half-period could be chosen so as to have an equal or a different duration. The same is true for the second part P2 of each of the half-periods. In addition, the relative duration of the first part P1 and the second part P2 of the same half-period will be adapted according to the case, in such a manner as to allow an optimum operation of this first embodiment.

Figure 25:
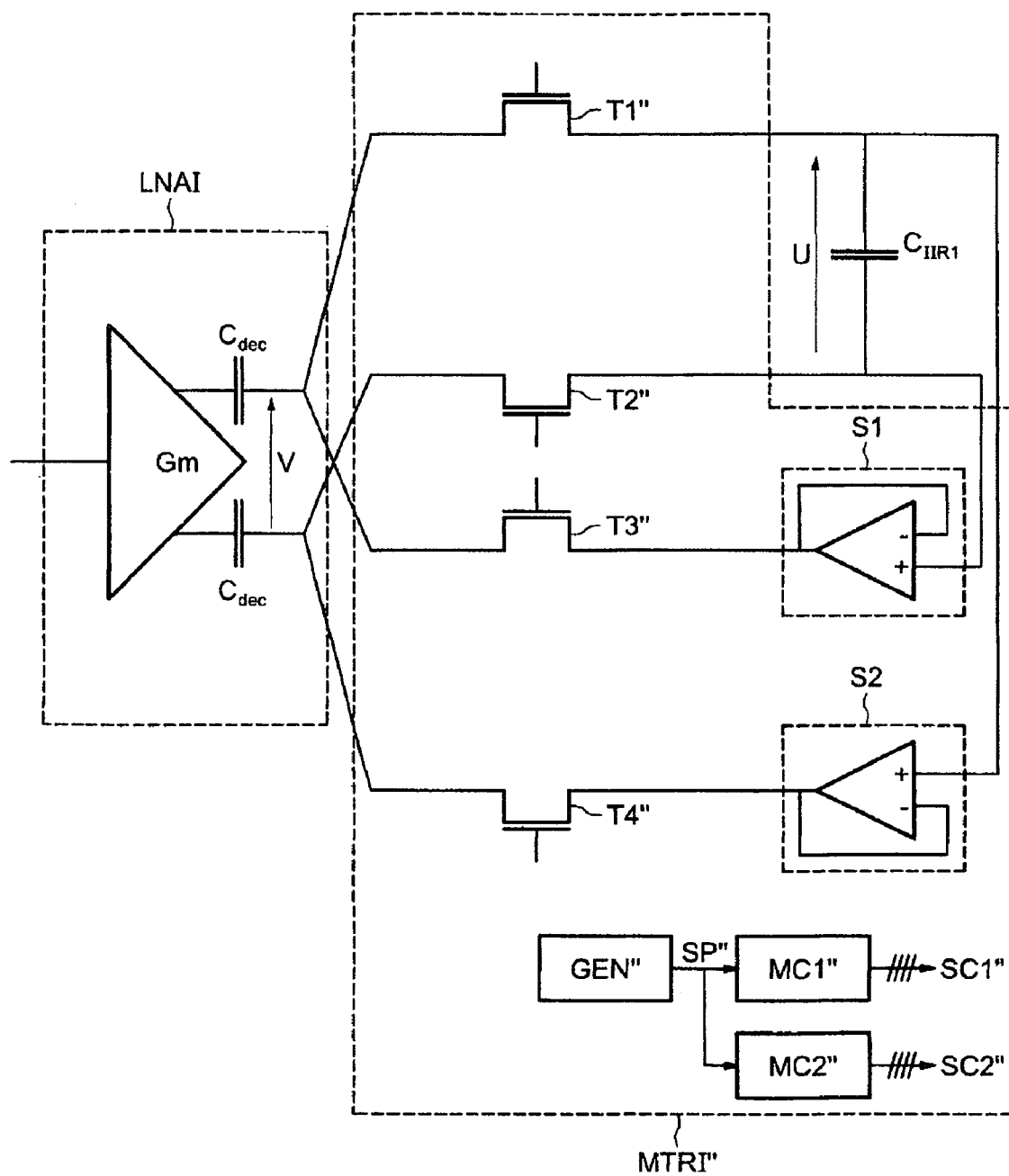
FIG. 25 is a schematic diagram illustrating a third embodiment of the frequency transposition stage of the device of FIG. 1.

FIG. 25 shows a third embodiment of the frequency transposition stage MTRI'' in differential architecture. It goes without saying that this third embodiment is not limited to a differential architecture and a person skilled in the art will readily know how to adapt the description that follows to a non-differential architecture. In this third embodiment, the filtering capacitor $C_{IIR1}$ is chosen to be identical to that in the second embodiment.

The amplifier stage LNAI comprises a single transconductor stage having for example a transconductance equal to Gm and consequently a single current differential output. However, in this embodiment, the transposition stage MTRI'' is unable to entirely transpose the DC component of the current coming from the amplifier stage LNAI. Thus, to avoid the transposed signal being superposed with part of the DC component of the signal coming from the amplifier stage LNAI, the latter comprises decoupling capacitors $C_{dec}$ connected in series on its differential output and capable of filtering the low frequencies of the signal coming from the LNAI. In particular, the value of the decoupling capacitors $C_{dec}$ will be chosen according to the output resistance of the amplifier stage LNAI so as to obtain a high-pass filter capable of filtering the DC and low-frequency component of the signal coming from the amplifier stage LNAI and capable of slightly modifying the working signal to be transposed by the transposition stage MTRI''.

The current signal is therefore filtered by the decoupling capacitors $C_{dec}$ and is transmitted to the frequency transposition stage MTRI'' and then to the filtering capacitor $C_{IIR1}$. The transposition stage MTRI'' comprises a signal generator GEN'' and control means MC1''. The generator GEN' delivers a periodic signal SP'' (FIG. 28) to the control means MC1'', which deliver a control signal SC1'' on the basis of said periodic signal SP''.

The control signal SC1'' makes it possible to control a set of configurable switches. The set of switches connects the differential output of the amplifier LNAI to the two terminals of the output capacitor $C_{IIR1}$, directly via two transistors T1'', T2''. The transistors T1'', T2'' are used as switches and are controlled by their gate voltage on the basis of two logic signals together forming the signal SC1''.

The generator GEN'' also delivers the periodic signal SP''' to additional control means MC2'' which deliver an additional control signal SC2'' on the basis of said periodic signal SP'''. The additional control signal SC2'' is used to control an additional set of configurable switches. The additional set of switches connects the terminals of the capacitor $C_{IIR1}$ to the differential output of the amplifier LNAI via transistors T3'', T4'', and of two amplifiers connected in follower configuration S1, S2. The transistors T3'', T4'' are used as switches and are controlled by their gate voltage on the basis of two logic signals together forming the signal SC2''.

In the present case, the follower differential amplifier block S1, S2 makes it possible to impose the voltage U of the capacitor $C_{IIR1}$ on the output of the amplifier LNAI, i.e. to impose the value of the voltage U as value of the voltage V.

Figure 26:
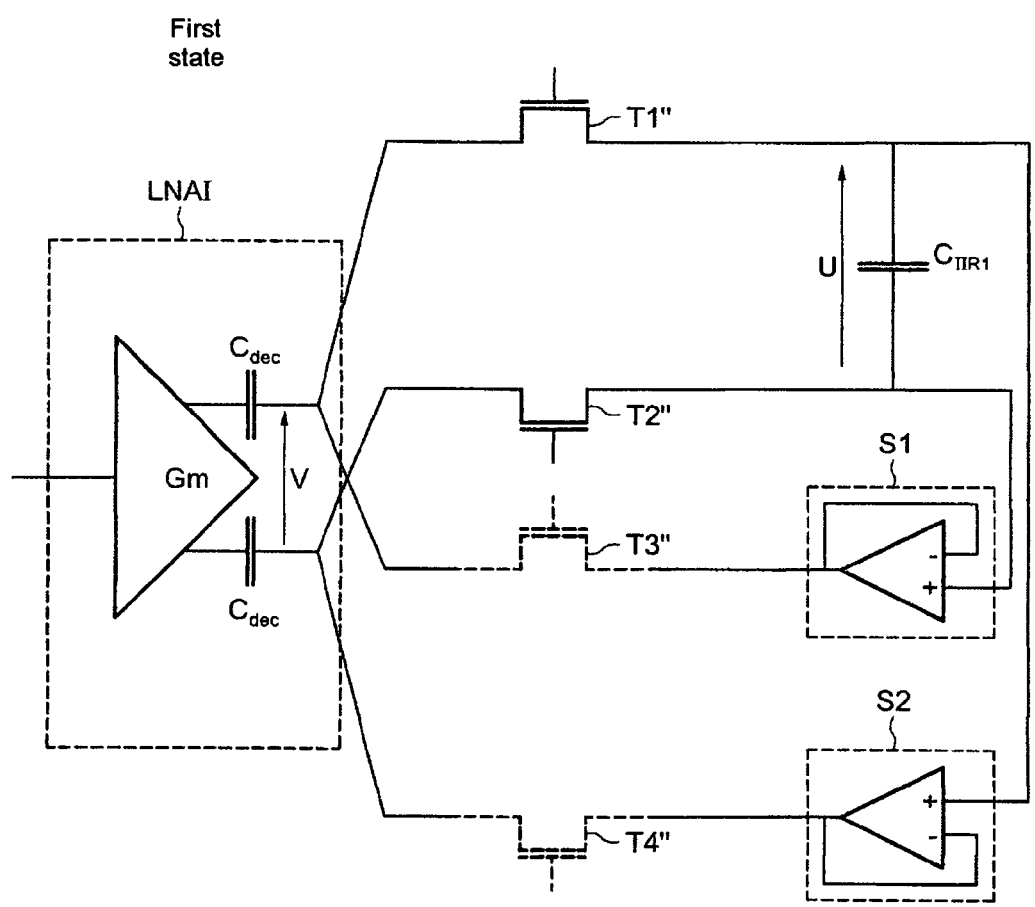
FIG. 26 is a schematic diagram illustrating a first configuration state of the transposition stage of FIG. 25.

FIG. 26 shows the first configuration state of the transposition stage MTRI''. In this first state, the additional control means MC2'' turn off the transistors T3'' and T4'', whereas the control means MC1'' turn on the transistors T1'' and T2''. Thus, in the first state, the capacitor $C_{IIR1}$ is connected directly to the differential output of the amplifier LNAI and receives a current proportional to the incident signal and filtered by the decoupling capacitors $C_{dec}$. The value of the voltage V of the differential output of the amplifier LNAI is the same as the value of the voltage U of the capacitor $C_{IIR1}$.

Figure 27:
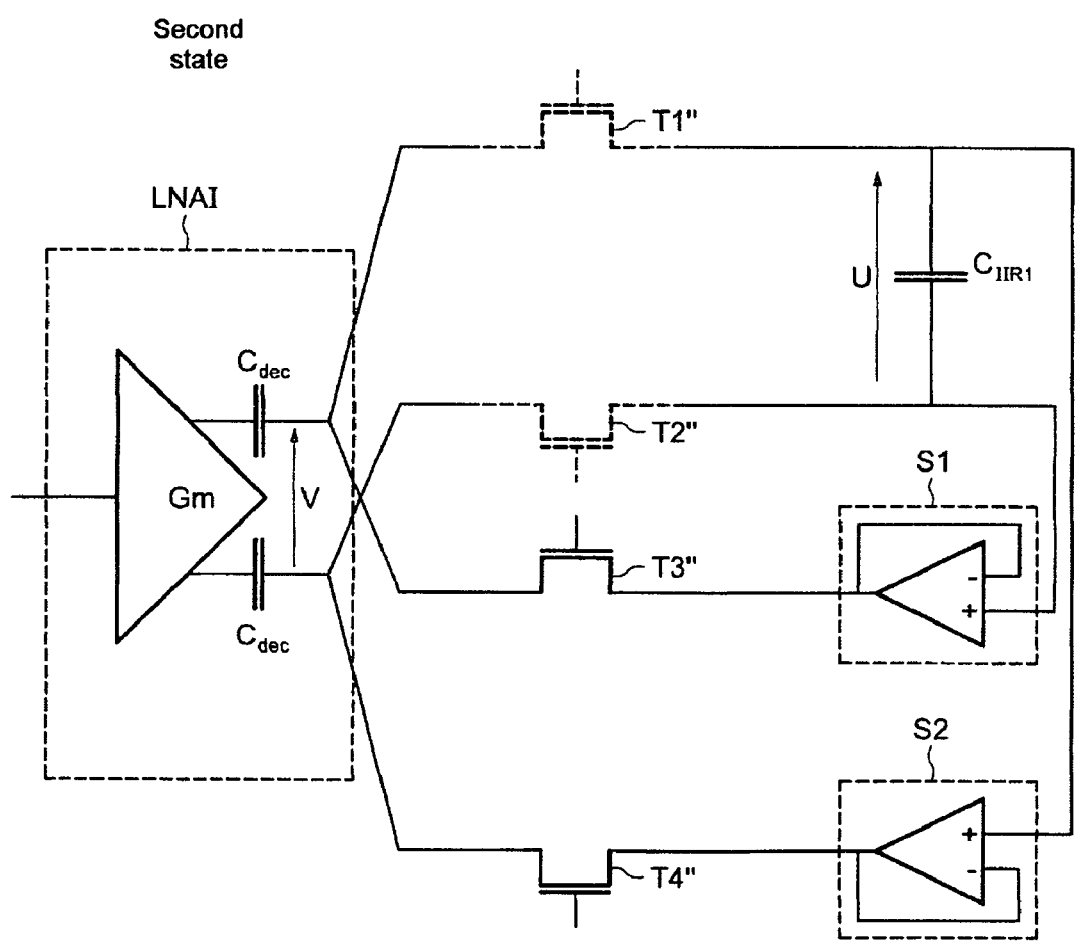
FIG. 27 is a schematic diagram illustrating a second configuration state of the transposition stage of FIG. 25.

FIG. 27 shows the second configuration state of the transposition stage MTRI''. In this second state, the control means MC1'' turn off the transistors T1'' T2'' so that the capacitor $C_{IIR1}$ is not electrically connected to the differential output of the amplifier LNAI. However, the additional control means MC2" turn on the transistors T3" and T4". Thus, the amplifiers connected in follower configuration S1, S2 can impose the value of the voltage U as value of the voltage V of the differential output of the amplifier LNAI before the amplifier LNAI is connected to the capacitor $C_{IIR1}$.

FIG. 28 shows an example of a periodic signal SP" delivered by the generator GEN" to the control means MC1' and to the additional control means MC2". The periodic signal SP" has a period $T_c$ that corresponds to the transposition frequency, in this case the central frequency of the channel to be processed.

During the first half-period of the periodic signal SP", the control means MC1" and the additional control means MC2" will configure the transposition stage MTRI" in the first state, whereas during the second half-period of the periodic signal SP" the control means MC1" and the additional control means MC2" will configure the transposition stage MTRI" in the second state.

Thus, the capacitor $C_{IIR1}$ receives a current signal only during the first half-period of the periodic signal. The signal at the terminals of the capacitor is therefore a frequency-transposed signal. In addition, to avoid parasitic currents at each start of a first half-period, the value of the voltage U of the capacitor $C_{IIR1}$ is imposed as value of the voltage of the differential output of the amplifier LNAI before the start of each first half-period.

Figure 29:
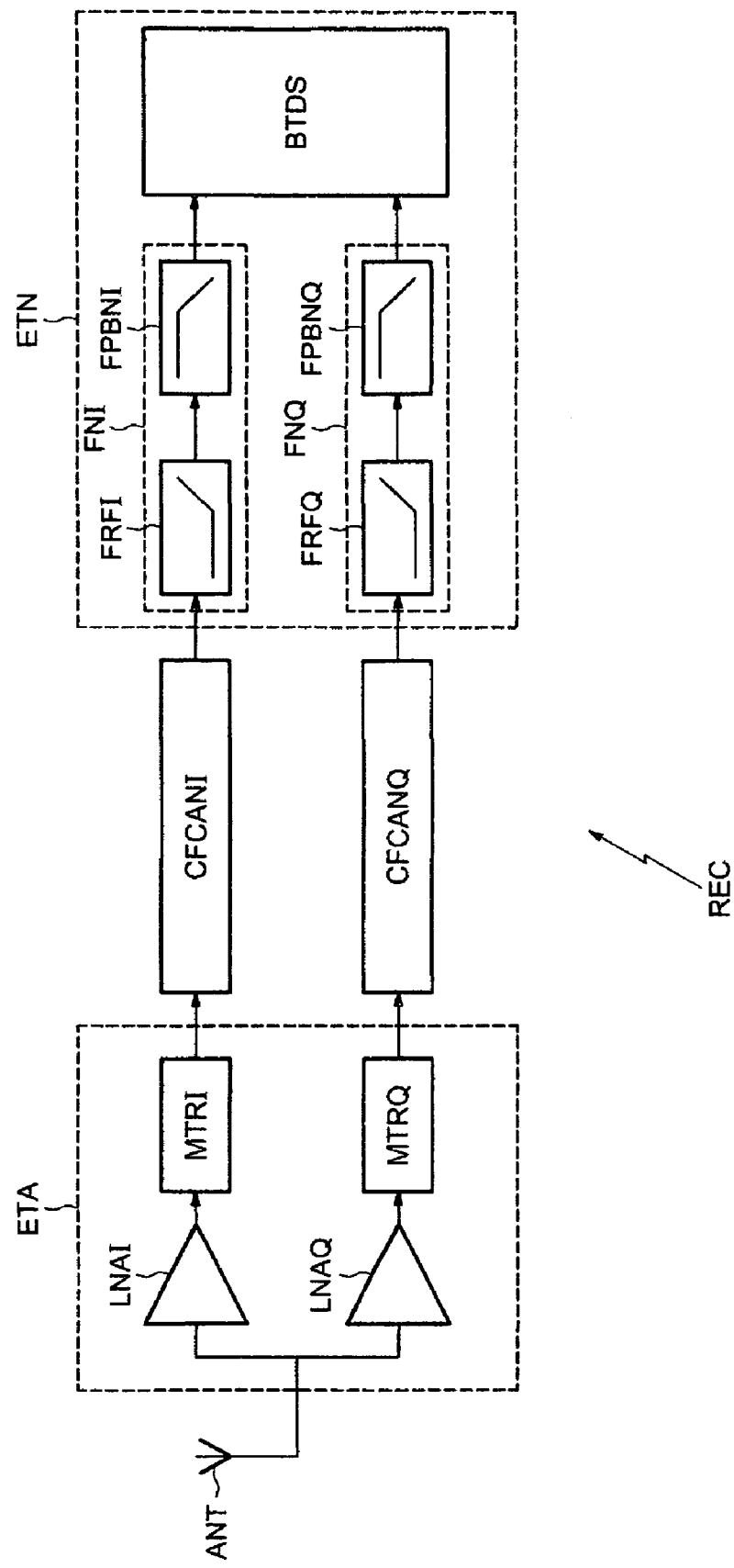
FIG. 29 is a schematic diagram illustrating the internal structure of another embodiment of a device according to the present invention.

Reference is now more particularly made to FIG. 29 and the following figures in order to illustrate another embodiment which allows, in combination with that illustrated in FIGS. 1 to 9 or with that illustrated in FIGS. 10 to 14, or else with that illustrated in FIGS. 15 to 24, the performance of the receiver chain to be further improved. In this example, the filtering effected by the circuit CFCANI is a low-order analog filtering. In the particular case of a first-order low-pass filtering with cutoff frequency $f_0$, this means that a signal at a frequency equal to $10.f_0$ will be attenuated by 20 dB. If a higher attenuation is desired at the frequency $10.f_0$, either a higher-order filtering is chosen (second-order filtering will give an attenuation of 40 dB at $10.f_0$), or a cutoff frequency $f'_0$ lower than $f_0$ is chosen (since the attenuation increases between $10.f'_0$ and $10.f_0$).

Since the order of filtering is fixed by the number of filtering capacitors of the input capacitance means MCEI, an efficient filtering out of the adjacent channels is achieved by choosing a cutoff frequency situated within the desired frequency range, in other words within the desired channel. The consequence of this is however to also filter out the useful signal. Thus, for the frequencies of the desired frequency range that are higher than the cutoff frequency, the attenuation is at least 3 dB (which corresponds to the attenuation at the cutoff frequency). The filtering of the circuit CFCANI therefore distorts a part of the signal.

On the other hand, the adjacent channels are filtered out despite the low order of the filtering. Thus, the analog/digital conversion of the filtered intermediate signal will require a narrower dynamic range, in other words a smaller number of bits.

Ideally, the sampling allows the entirety of the information to be conserved when the sampling frequency $F_S$ is equal to at least twice the highest frequency in the signal to be sampled. Thanks to the cutoff frequency of the filtering effected by the circuit CFCANI intentionally chosen to be low, the sampling frequency $F_S$ will also be able to be chosen low. Moreover, since the analog filtering was significant, the amount of information in the filtered intermediate signal, including outside of the useful signal, is reduced. The filtered intermediate signal can then be digitized with a smaller number of bits.

The internal structure of the digital processing stage ETN used in this embodiment will now be described in more detail. The stage ETN comprises a reformatting filter FRFI. The filter FRFI is a digital filter, for example a finite-impulse-response filter whose transfer function is chosen equal to or substantially equal to the inverse of the transfer function of the filtering effected by the circuit CFCANI over at least the desired frequency range, in other words within the channel of the desired signal.

This filter FRFI allows the incident signal to be reconstructed both within and outside of the desired frequency range. At the output of the filter FRFI, a signal close to the intermediate signal output from the mixer MTRI is therefore found. A digital filtering, for example a low-pass or bandpass filtering, is then once again carried out in order to once again filter out the adjacent channels reformatted by the filter FRFI.

The digital processing stage ETN thus comprises a digital filter FPBNI allowing the adjacent channels to be filtered out. However, the digital filter FPBNI can now be of a high order since it is easier, less bulky and less costly to fabricate a digital filter of high order than an analog filter of high order. It is therefore possible to fabricate a filter FPBNI capable of filtering out the adjacent channels with little or no distortion of the useful signal. Thus, thanks to the device such as that described, it is possible to achieve the filtering of the useful signal with a digital filter without however requiring for this an analog-digital converter with a wide dynamic range.

The filter FRFI and the filter FPBNI can be formed within one and the same digital filter FNI. For this purpose, it suffices to multiply the respective transfer functions of the two filters FRFI and FPBNI and to digitally form the resulting filter FNI. The fabrication of one and the same filter performing both the reformatting and the high-order low-pass filtering allows the fabrication of the device to be simplified and the useful signal obtained to be improved. The final signal obtained on the channel I is then sent to the unit BTDS.

Figure 30:
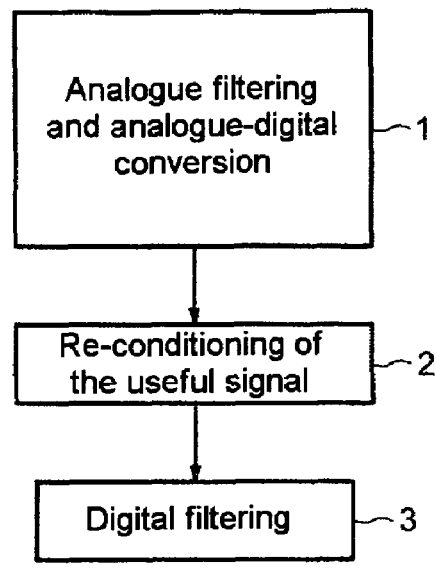
FIGS. 30 and 31 are flowcharts illustrating various method steps in accordance with an embodiment of the present invention.

FIG. 30 shows a diagram on which the various steps of one implementation of the method, corresponding to the architecture in FIG. 29, are indicated. Thus, a first step 1 is provided during which an analog filtering and an analog/digital conversion of the intermediate signal is performed. The analog filtering here is intentionally low, in other words at least a part of the useful signal is also filtered, in order to limit the bandwidth of the filtered intermediate signal. The digital output signal thus requires a smaller number of bits In a second step 2, the digital output signal is reformatted in order to compensate for the distortion of the filtered intermediate useful signal. This reformatting can be carried out notably by using a filter whose transfer function is equal to the inverse of that of the analog filtering of the circuit CFCANI.

Once the digital output signal has been reformatted, the adjacent channels are once more filtered out since they have also been reformatted during the second step 2. Thus, the third step 3 comprises a digital filtering of the reformatted digital output signal in order to only conserve the useful signal. In particular, the final digital filtering can be carried out with a much higher order than the analog filtering, which allows the adjacent channels to be filtered out without distortion of the useful signal.

The second step 2 will now be described in more detail. In a first embodiment, it is considered that the reformatting filter FRFI is timed at a working frequency equal to the sampling frequency $F_S$ of the analog/digital converter. The filter FRFI then has a transfer function equal to the inverse of the transfer function of the analog filtering effected by the circuit CFCANI. For example, going back to the expression G for the transfer function of the analog filtering carried out by the circuit CFCANI and writing it in the digital equivalent form F, then:

$$F = \frac{C^2}{(C+C_{IIR1} - C_{IIR1} \cdot e^{-2i\pi f/F_S})\cdot(C+C_{IIR2} - C_{IIR2}\cdot e^{-2i\pi f/F_S})}$$

The filter FRFI is then chosen so as to have a transfer function H equal to:

$$F = \frac{C^2}{(C+C_{IIR1} - C_{IIR1} \cdot e^{-2i\pi f/F_S})\cdot(C+C_{IIR2} - C_{IIR2}\cdot e^{-2i\pi f/F_S})}$$

Those skilled in the art will readily be able to generate this transfer function H digitally.

In a second embodiment, the case is considered where the filter FRFI is timed at a working frequency $F_S/N_{div}$ different from the sampling frequency $F_S$ of the analog/digital converter. The function H can no longer be determined as previously and the transfer function of the reformatting filter FRFI is thus an approximation $H_{approx}$ of the inverse H of the transfer function of the analog filtering carried out by the circuit CFCANI. This approximation $H_{approx}$ is the closest to the function H within the band of the signal that it is desired to reformat.

Figure 31:
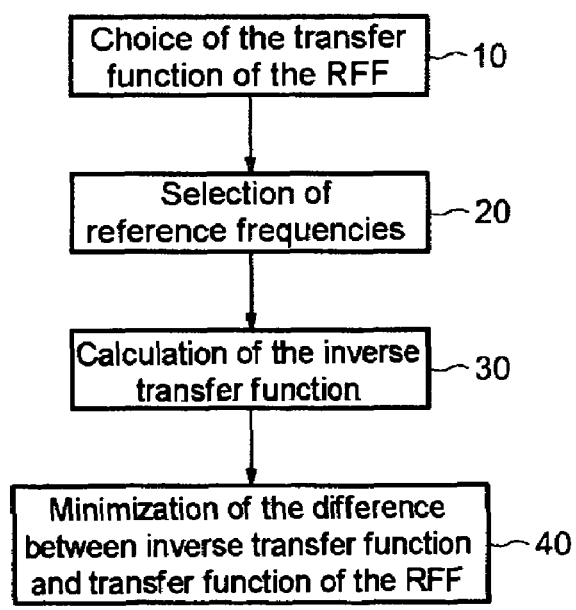

FIG. 31 shows a diagram for determining a transfer function approximating the function H. The case is considered in which the filter FRFI is a finite-impulse-response filter of order $N_{fir}$. The transfer function $H_{approx}$ of the filter FRFI can then be written in the form:

$$H_{approx} = \alpha_0 + \alpha_1 e^{2i\pi \frac{f}{N_{div}F_s}} + \alpha_2 e^{2i\pi \frac{f}{N_{div}F_s}} + \ldots + \alpha_{Nfir-1} e^{2i\pi \frac{[Nfir-1]f}{N_{div}F_s}}$$

The determination of the approximate transfer function $H_{approx}$ comprises the determination of the coefficients $[\alpha_0; \alpha_1; \ldots; \alpha_{Nfir-1}]$ minimizing the difference between the transfer function H and the function $H_{approx}$ over the bandwidth of the useful signal.

In a first step 10, the form of the transfer function $H_{approx}$, and more particularly the order of the transfer function $H_{approx}$ which provides the number of coefficients $[\alpha_0; \alpha_1; \ldots; \alpha_{Nfir-1}]$ to be determined, is chosen.

In a second step 20, a finite number of reference frequencies $f_1, f_2, \ldots, f_{Nfrq}$ is chosen for which the difference between the two transfer functions H and $H_{approx}$ will be minimized. The choice of these frequencies and their number will directly determine the precision of the approximation, together with the complexity of the calculation of $H_{approx}$. Thus, reference frequencies are preferably chosen that are uniformly distributed within the desired frequency range.

A vector $F_{ref}$ is then constructed whose coordinates are the previously-determined reference frequencies; subsequently, in a third step 30, the vector $H_{ref}$ is calculated whose coordinates are the values of the transfer function H for each of the reference frequencies.

Therefore:

$$F_{ref} = \begin{bmatrix} f_1 \\ f_2 \\ \ldots \\ f_{Nfrq} \end{bmatrix}$$

and:

$$H_{ref} = H(F_{ref}) = H\left(\begin{bmatrix} f_1 \\ f_2 \\ \ldots \\ f_{Nfrq} \end{bmatrix}\right) = \begin{bmatrix} H(f_1) \\ H(f_2) \\ \ldots \\ H(f_{Nfrq}) \end{bmatrix}$$

Finally, in a fourth and last step 40, the coefficients $[\alpha_0; \alpha_1; \ldots; \alpha_{Nfir-1}]$ are calculated by matrix processing, in such a manner as to minimize the difference between the desired transfer function H and the approximate function $H_{approx}$. The calculation uses a first matrix E defined by:

$$E = \exp\left(-2i\pi \begin{bmatrix} f_1 & f_1^2 & \ldots & f_1^{Nfir-1} \\ f_2 & f_2^2 & \ldots & f_2^{Nfir-1} \\ \ldots & \ldots & \ldots & \ldots \\ f_{Nfrq} & f_{Nfrq}^2 & \ldots & f_{Nfrq}^{Nfir-1} \end{bmatrix}\right)$$

starting from which the coefficients of $H_{approx}$ are calculated with the following formula:

$$\begin{bmatrix} \alpha_0 \\ \alpha_1 \\ \alpha_2 \\ \ldots \\ \alpha_{Nfir-1} \end{bmatrix} = [E^T E]^{-1} [E^T H_{ref}]$$

Figure 32:
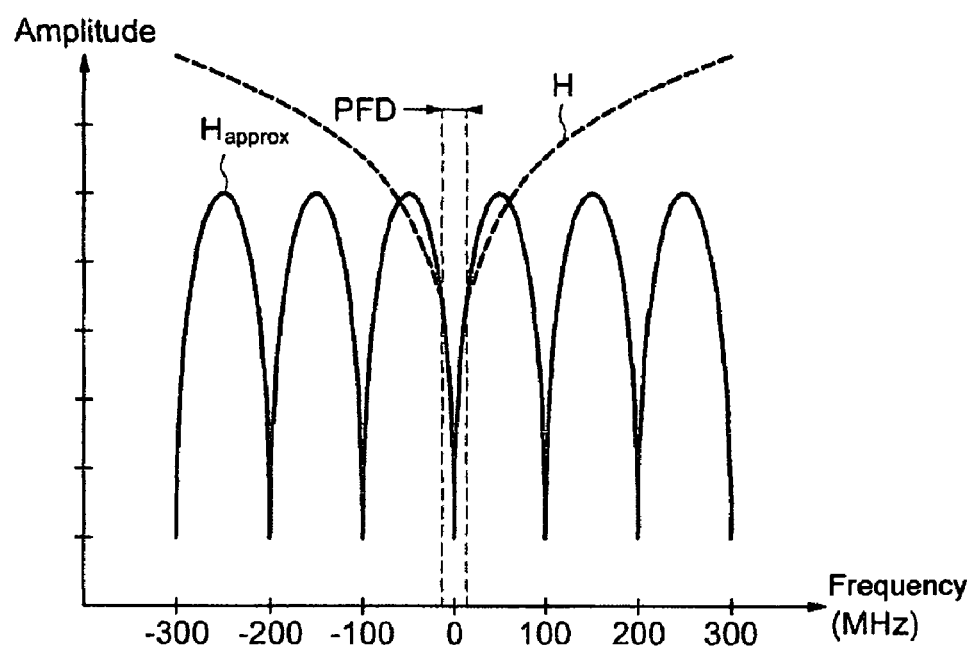
FIGS. 32 and 33 are graphs illustrating an example of an approximation of a transfer function in accordance with an embodiment of the present invention.
Figure 33:
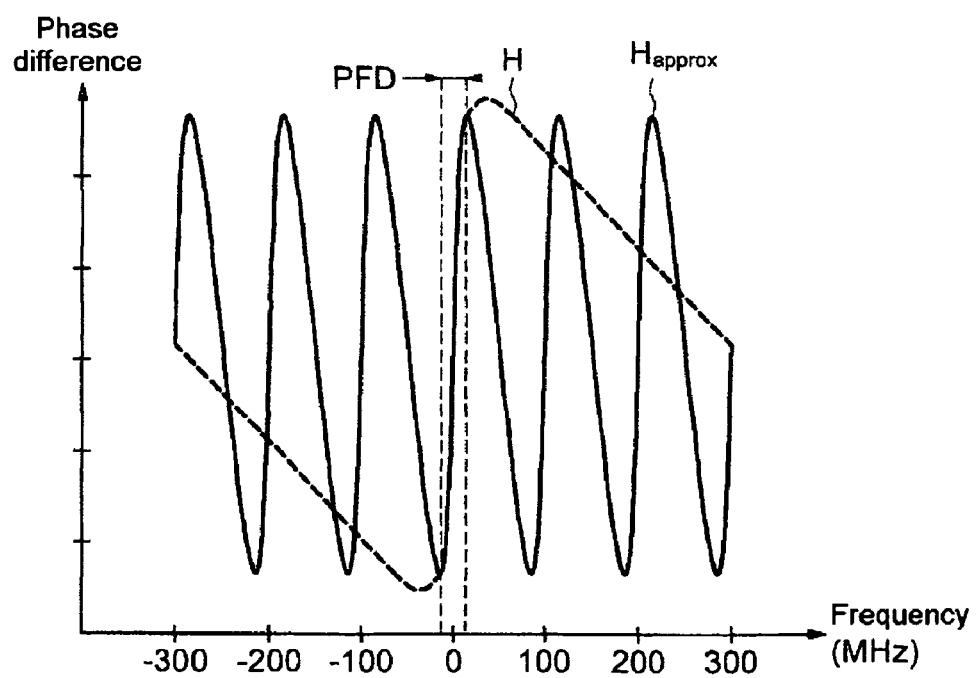

FIGS. 32 and 33 illustrate graphically an example of approximation of a transfer function H by a filter FIR of order 3 ($N_{fir}=3$), timed at a frequency 6 times lower ($N_{div}=6$), and of transfer function $H_{approx}$. FIG. 32 shows the modulus of the two transfer functions and FIG. 33 shows the phase difference. It is observed that, over the frequency range PFD [−10 MHz; 10 MHz] representing one frequency channel, the curves have similar values.

In a third embodiment, the case is considered in which the filter FRFI is also run at a working frequency $F_S/N_{div}$ different from the sampling frequency $F_S$ of the analog/digital converter CANI, and the filter FPBAI is a low-pass filter of order 1 and of cutoff frequency $f_0$. As previously, the transfer function of the reformatting filter FRFI is an approximation $H_{approx}$ of the inverse H of the transfer function of the filter FPBAI. It will also be considered that the filter FRFI is of the finite-impulse-response type of order $N_{fir}=2N-1$. The transfer function $H_{approx}$ of the filter FRFI can be written in the form:

$$H_{approx} = 1 + \sum_{n=1}^{n=N-1} \alpha_n (z^n - z^{-n}) \text{ with } z^{-n} = e^{2i\pi n \frac{f}{N_{div}F_s}}$$

which corresponds, with a shift of $z^{-N+3}$, to $$\sum_{m=0}^{m=N_{fir}-1} \alpha_m^1 z^{-m}.$$

The determination of the approximate transfer function $H_{approx}$ comprises the determination of the coefficients $[\alpha_1; \ldots; \alpha_{N-1}]$. When the filter FPBAI is of order 1, the coefficients $[\alpha_1; \ldots; \alpha_{N-1}]$ may be calculated directly from the matrix equation:

$$\begin{bmatrix} 1 & 2 & \ldots & N \\ 1 & 8 & \ldots & N^3 \\ \ldots & \ldots & \ldots & \ldots \\ 1 & 2^{2N-3} & \ldots & N^{2N-3} \end{bmatrix} \begin{bmatrix} \alpha_1 \\ \alpha_2 \\ \ldots \\ \alpha_{N-1} \end{bmatrix} = \begin{bmatrix} \frac{F_S}{2\pi N_{div} f_0} \\ 0 \\ \ldots \\ 0 \end{bmatrix}$$

Gives:

for $N_{fir} = 3$:

$$H_{approx} = 1 + \frac{1}{4\pi} \frac{F_S}{N_{div} f_0} [z - z^{-1}]$$

which corresponds, with a time shift of $z^{-1}$, to:

$$\frac{1}{4\pi} \frac{F_S}{N_{div} f_0} + z^{-1} - \frac{1}{4\pi} \frac{F_S}{N_{div} f_0} z^{-2}.$$

for $N_{fir} = 5$:

$$H_{approx} = 1 + \frac{1}{4\pi} \frac{F_S}{N_{div} f_0} \frac{1}{6} [-z^2 + 8z - 8z^{-1} + z^{-2}]$$

which corresponds, with a time shift of $z^{-2}$, to:

$$z^{-2} + \frac{1}{4\pi} \frac{F_S}{N_{div} f_0} \frac{1}{6} [-1 + 8z^{-1} - 8z^{-3} + z^{-4}].$$

for $N_{fir} = 7$:

$$H_{approx} = 1 + \frac{1}{4\pi} \frac{F_S}{N_{div}} \frac{1}{30} [z^3 - 9z^2 + 45z - 45z^{-1} + 9z^{-2} - z^{-3}]$$

which corresponds, with a time shift of $z^{-3}$, to:

$$z^{-3} + \frac{1}{4\pi} \frac{F_S}{N_{div} f_0} \frac{1}{30} [1 - 9z^{-1} + 45z^{-2} - 45z^{-4} + 9z^{-5} - z^{-6}].$$

The order $N_{fir}$ of the filter FRFI makes it possible to adjust, over the desired frequency range, the approximation of the inverse of the transverse function of the filter FPBAI.

The difficulty in design of filters and of the analog-digital converter is therefore transferred to the digital part, whatever the working frequency of the digital filters and the sampling frequency $F_S$ of the converter.

The invention claimed is:

1. A method for processing an incident signal to generate a digital output signal, the method comprising:
    generating an intermediate signal extracted from the incident signal;
    delivering the intermediate signal to a filtering and analog/digital conversion circuit comprising at least one input for receiving the intermediate signal, a plurality of outputs, an input capacitance component coupled to the input, and a plurality of configurable elementary circuits for conversion by successive approximations each coupled between the at least one input and one of the plurality of outputs and each comprising a group of switched elementary capacitors;
    successively and cyclically configuring each configurable elementary circuit
        in a filtering state in which at least a group of the plurality of switched elementary capacitors are coupled to the input capacitance component, then
        in several different states of analog/digital conversion, then
        in a reference state in which the group of switched elementary capacitors has a reference capacitive charge; and
    delivering successively, at each of the plurality of outputs, a sample of several bits of the digital output signal corresponding to the intermediate signal.

2. The method according to claim 1, wherein the filtering and analog/digital conversion circuit comprises at least N+2 outputs each delivering, at a delivery frequency $f_d$, a sample of N bits of the digital output signal, and N+2 configurable elementary circuits each coupled between the at least one input and one of the N+2 outputs and each comprising at least one group of at least N+1 switched elementary capacitors configured in parallel, together with a comparator coupled to the corresponding output; and
    wherein each configurable elementary circuit is successively and cyclically configured, at a control frequency $F_s$ equal to at least the product of the number of configurable elementary circuits and the delivery frequency $f_d$, and with a time delay of $1/F_s$ between two consecutive configurable elementary circuits, and in which the N+1 switched elementary capacitors are selectively coupled between the comparator and a first or a second reference voltage to obtain, successively at the frequency $F_s$, the N bits of the sample of the digital output signal at the corresponding output in N separate states of analog-digital conversion.

3. The method according to claim 2, wherein each configurable elementary circuit comprises at least one group of N+1 switched elementary capacitors, the group of switched elementary capacitors having a total capacitance of value C; and wherein in the filtering state, the N+1 switched elementary capacitors are coupled to the input capacitive component, and in the reference state the group of N+1 switched elementary capacitors has a reference capacitive charge.

4. The method according to claim 2, wherein each configurable elementary circuit comprises at least one group of N+2 switched elementary capacitors, the group of switched elementary capacitors having a total capacitance of value 3C/2 and comprising two switched elementary capacitors of value C/2, and wherein:
    in the filtering state, the two switched elementary capacitors of value C/2 are coupled to the input capacitive component; and
    in the reference state, the group of N+2 switched elementary capacitors has a reference capacitive charge.

5. The method according to claim 4, wherein the ratio of the value of the capacitance of the input capacitance component over the value C is greater than a threshold chosen as a function of the bandwidth of the incident signal.

6. The method according to claim 5, wherein the input capacitance component comprises a filtering capacitor, and, in the filtering state of each configurable elementary circuit at least some of the switched elementary capacitors of said configurable elementary circuit are coupled to the filtering capacitor.

7. The method according to claim 6, wherein:
the input capacitance component also comprises at least one additional filtering capacitor;
the filtering and analog/digital conversion circuit comprises a plurality of additional outputs and additional configurable elementary circuits corresponding to each additional filtering capacitor; and
the filtering state of each configurable elementary circuit includes various filtering sub-states in which at least some of the switched elementary capacitors are respectively coupled to the various filtering capacitors; and
each configurable elementary circuit is placed successively into each of the filtering substates.

8. The method according to claim 7, wherein, after the reference state, the configurable elementary circuit is configured in a calibration state in which the comparator of the configurable elementary circuit is coupled to two equal voltages in such a manner as to determine and correct its offset.

9. The method according to claim 8, wherein the configurable elementary circuits are configured in two different reference states so as to create, as input of the filtering and analog/digital conversion circuit, a periodic analog signal of predefined frequency and amplitude and to determine, from the corresponding digital output signal, the filtering created by the input capacitive component.

10. The method according to claim 9, wherein the current input for receiving the intermediate signal is a differential input and wherein each configurable elementary circuit comprises a second group of at least N+1 switched elementary capacitors configured in parallel.

11. The method according to claim 10, wherein the incident signal is delivered to a transconductor stage, a current output of the transconductor stage being coupled to the filtering capacitor in such a manner as to deliver to the filtering capacitor a current signal lasting for at least part of the first half-period of each period of a periodic signal and to thus obtain, at the filtering capacitor, a frequency-transposed signal as the intermediate signal, and in which, upon the occurrence of each part of the first half-period, the voltage of the current output, seen from the filtering capacitor, is reset to a value equal to that of the voltage of the filtering capacitor.

12. The method according to claim 11, wherein the filtering and analog/digital conversion circuit is capable of filtering the frequency components of the intermediate signal situated outside of a desired frequency range, and the method further comprises:
a reformatting of the digital output signal into a form substantially identical, at least within the desired frequency range, to the form of the intermediate signal; and
a subsequent digital filtering of the reformatted digital output signal so as to filter out the frequency components situated outside of the desired frequency range.

13. A device for processing an incident signal via filtering and analog/digital conversion of an intermediate signal extracted from the incident signal, the device comprising:
at least one current input for receiving the intermediate signal;
a plurality of outputs;
an input capacitance component coupled to the at least one input; and
a plurality of configurable elementary circuits for conversion by successive approximations and each coupled between the at least one input and one of the outputs and each comprising a group of switched elementary capacitors, each configurable elementary circuit having a filtering state in which at least some of the switched elementary capacitors are coupled to the input capacitance component, several different states of analog/digital conversion, and a reference state in which the group of switched elementary capacitors has a reference capacitive charge;
said outputs each capable of delivering successively a sample of several bits of a digital output signal corresponding to the intermediate signal.

14. The device according to claim 13, also comprising a controller to place each configurable elementary circuit successively and cyclically into the filtering state, then into the successive analog/digital conversion states, then into the reference state.

15. The device according to claim 14, wherein the outputs are each capable of delivering, at a delivery frequency, a sample of several bits of the digital output signal, and wherein the controller is designed to successively place, at a control frequency $F_s$ equal to at least a product of the number of configurable elementary circuits and the delivery frequency, and with a time delay of $1/F_s$ between two consecutive configurable elementary circuits, each configurable elementary circuit into the filtering state, then into the analog/digital conversion states to obtain, successively at the control frequency $F_s$, the bits of a sample of the digital output signal at a corresponding output, then into the reference state.

16. The device according to claim 15, wherein the filtering and analog/digital conversion circuit comprises:
at least N+2 outputs each capable of delivering, at the delivery frequency, a sample of N bits of the digital output signal; and
at least N+2 elementary circuits each coupled between the input and one of the N+2 outputs and each comprising at least one group of at least N+1 switched elementary capacitors configured in parallel and of at least N+1 configurable switches, together with a comparator coupled to the corresponding output;
the group of N+1 switched elementary capacitors of each elementary circuit being selectively coupled between the comparator and a first or a second reference voltage in N separate analog/digital conversion states of said respective elementary circuit.

17. The device according to claim 16, wherein each elementary circuit comprises at least one group of N+1 elementary capacitors, the group of elementary capacitors having a total capacitance of value C, and wherein:
in the filtering state, the N+1 elementary capacitors are coupled to the input capacitive component; and
in the reference state, the group of N+1 elementary capacitors has a reference capacitive charge.

18. The device according to claim 17, wherein the values of the N+1 elementary capacitors of each elementary circuit are $C/2, C/4, \ldots, C/2^N, C/2^N$.

19. The device according to claim 18, wherein the input capacitance component comprises a filtering capacitor and wherein, for each elementary circuit, the configurable switches of the N elementary capacitors have three switching states and the configurable switch of the $(N+1)^{th}$ capacitor of value $C/2^N$ has two switching states; and wherein the controller is designed to configure the switches of an elementary circuit in a same switching state during the filtering state, in the other switching states during the N separate analog/digital conversion states and in the reference state.

20. The device according to claim 19, wherein, in the reference state of an elementary circuit, the configurable switch of the switched elementary capacitor of value C/2 of said elementary circuit is configured so as to connect said switched elementary capacitor of value C/2 to one of the two reference voltages, and the configurable switches of the other N switched elementary capacitors are configured so as to connect said N switched elementary capacitors to the other of the two reference voltages.

21. The device according to claim 16, wherein each elementary circuit comprises at least one group of N+2 elementary capacitors, the group having a total capacitance of value 3C/2 and comprising two elementary capacitors of value C/2, and wherein:
in the filtering state, the two elementary capacitors of value C/2 are coupled to the input capacitive component; and
in the reference state, the group of N+2 elementary capacitors has a reference capacitive charge.

22. The device according to claim 21, wherein the values of the N+2 elementary capacitors of each elementary circuit are $C/2, C/2, C/4, \ldots, C/2^N, C/2^N$.

23. The device according to claim 22, wherein the input capacitive component comprises a filtering capacitor and wherein, for each elementary circuit, the configurable switches of the two capacitors of value C/2 include three switching states, the configurable switches of the N−1 elementary capacitors of values $C/4, \ldots, C/2^{N-1}, C/2^N$ include two switching states, and the configurable switch of the (N+2)th capacitor of value $C/2^N$ includes one switching state, the controller being designed to configure the configurable switches of an elementary circuit in the filtering state, in the other switching states during N separate analog/digital conversion states and in the reference state.

24. The device according to claim 23, wherein the ratio of the value of the capacitance of the input capacitive component to the value C is greater than a threshold based upon a bandwidth of the analog signal.

25. The device according to claim 23, wherein the input capacitive component further comprises at least one additional filtering capacitor; and further comprising a plurality of additional outputs and additional elementary circuits equal to the number of additional filtering capacitors;
for each elementary circuit, the configurable switches of the elementary capacitors coupled to the input capacitive component during the filtering state further include an additional number of switching states equal to the number of additional filtering capacitors, the filtering state of each elementary circuit comprising various filtering sub-states in which at least some of the elementary capacitors are respectively coupled to the various filtering capacitors; and
the controller being capable of configuring the configurable switches of an elementary circuit so as to place it in succession in each of the filtering sub-states.

26. The device according to claim 25, wherein the filtering and analog/digital conversion circuit comprises an additional output and an additional elementary circuit and wherein each elementary circuit also has a calibration state in which the comparator is coupled to two equal voltages in such a manner as to determine and correct its offset; the controller also being capable of configuring the configurable switches of each elementary circuit so as to place it into its calibration state after its reference state.

27. The device according to claim 26 having a differential architecture in which each elementary circuit comprises a second group of at least N+1 switched elementary capacitors configured in parallel and at least N+1 configurable switches.

28. The device according to claim 27 further comprising:
a transconductor stage comprising an input for receiving the incident signal;
frequency-transposition component coupled between the transconductor stage and the filtering capacitor, and comprising
a generator to deliver a periodic signal,
a set of switches configurable in response to a control signal,
a control unit to deliver the control signal starting from the periodic signal for configuring the set of switches in such a manner as to connect a current output of the transconductor stage to the filtering capacitor and to deliver to the filtering capacitor a current signal lasting for at least part of a first half-period of each period of the periodic signal and to thus obtain, at the filtering capacitor, a frequency-transposed signal as the intermediate signal; and
a reset circuit to reset, upon the occurrence of each part of the first half-period, the voltage of the current output, seen from said filtering capacitor, to a value equal to that of the voltage of said filtering capacitor.

29. The device according to claim 28, wherein the filtering and analog/digital conversion circuit is capable of filtering the intermediate signal in such a manner as to filter out frequency components situated outside of a desired frequency range; and further comprising:
a reformatting block to reformat the digital output signal into a form substantially identical to an initial form of the intermediate signal, at least within the desired frequency range; and
an additional filtering block to perform a final digital filtering of the reformatted digital output signal in such a manner as to filter out frequency components situated outside of said desired frequency range.

30. The device according to claim 13, wherein the device defines an integrated circuit.

31. A radio-frequency (RE) signal receiver comprising a device for processing an RE signal via filtering and analog/digital conversion of an intermediate signal extracted from the RE signal, the device comprising:
at least one current input for receiving the intermediate signal;
a plurality of outputs; an input capacitance component coupled to the at least one input; and
a plurality of configurable elementary circuits for conversion by successive approximations and each coupled between the at least one input and one of the outputs and each comprising a group of switched elementary capacitors, each configurable elementary circuit having a filtering state in which at least some of the switched elementary capacitors are coupled to the input capacitance component, several different states of analog/digital conversion, and a reference state in which the group of switched elementary capacitors has a reference capacitive charge;
said outputs each capable of delivering successively a sample of several bits of a digital output signal corresponding to the intermediate signal.

* * * * *

UNITED STATES PATENT AND TRADEMARK OFFICE
CERTIFICATE OF CORRECTION

| | |
|---|---|
| PATENT NO. | : 7,652,613 B2 |
| APPLICATION NO. | : 12/015039 |
| DATED | : January 26, 2010 |
| INVENTOR(S) | : Joet et al. |

It is certified that error appears in the above-identified patent and that said Letters Patent is hereby corrected as shown below:

Column 2, Line 32   Delete: "S12"
Insert: --SI2--

Column 7, Line 1   Delete: "intheto"
Insert: --into--

Column 9, Line 55   Delete: "S13"
Insert: --SI3--

Column 17, Line 11   Delete: "125"
Insert: --I25--

Column 18, Line 24   Delete: "$C_{IIR}$"
Insert: --$C_{IIR1}$--

Column 21, Line 6   Delete: "CI1"
Insert: --CI2--

Column 21, Line 13   Delete: "CI"
Insert: --CI1--

Column 23, Line 48   Delete: "CI1"
Insert: --CI1'--

Column 28, Line 29   Delete: "GEN' "
Insert: --GEN"--

Column 29, Line 9   Delete: "MC1' "
Insert: --MC1"--

Signed and Sealed this
Fourth Day of September, 2012

David J. Kappos
*Director of the United States Patent and Trademark Office*

CERTIFICATE OF CORRECTION (continued)
U.S. Pat. No. 7,652,613 B2

Column 33, Line 1     Delete: "$z^{-N+3}$"

Insert: --$z^{-N+1}$--